United States Patent
Kunisawa et al.

(10) Patent No.: US 6,632,335 B2
(45) Date of Patent: Oct. 14, 2003

(54) PLATING APPARATUS

(75) Inventors: Junji Kunisawa, Kanagawa-ken (JP); Mitsuko Odagaki, Kanagawa-ken (JP); Natsuki Makino, Kanagawa-ken (JP); Koji Mishima, Kanagawa-ken (JP); Kenji Nakamura, Kanagawa-ken (JP); Hiroaki Inoue, Tokyo (JP); Norio Kimura, Kanagawa-ken (JP); Tetsuo Matsuda, Gunma-ken (JP); Hisashi Kaneko, Kanagawa-ken (JP); Nobuo Hayasaka, Kanagawa-ken (JP); Katsuya Okumura, Kanagawa-ken (JP); Manabu Tsujimura, Kanagawa-ken (JP); Toshiyuki Morita, Kanagawa-ken (JP)

(73) Assignees: Ebara Corporation, Tokyo (JP); Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/742,110

(22) Filed: Dec. 22, 2000

(65) Prior Publication Data

US 2002/0020627 A1 Feb. 21, 2002

(30) Foreign Application Priority Data

| Dec. 24, 1999 | (JP) | 11-367754 |
| Mar. 9, 2000 | (JP) | 2000-065459 |
| Apr. 20, 2000 | (JP) | 2000-119861 |
| Apr. 21, 2000 | (JP) | 2000-121841 |
| Apr. 28, 2000 | (JP) | 2000-131879 |
| May 1, 2000 | (JP) | 2000-132015 |
| May 24, 2000 | (JP) | 2000-153754 |
| Dec. 4, 2000 | (JP) | 2000-369201 |
| Dec. 4, 2000 | (JP) | 2000-369320 |

(51) Int. Cl.[7] ............. C25D 21/12; C25D 17/00
(52) U.S. Cl. ............... 204/230.2; 204/224 R
(58) Field of Search ............ 204/230.2, 224 R

(56) References Cited

U.S. PATENT DOCUMENTS

| 5,853,559 | A | 12/1998 | Tamaki et al. | 205/157 |
| 6,126,798 | A | 10/2000 | Reid et al. | 204/282 |
| 6,132,587 | A | 10/2000 | Jorné et al. | 205/123 |
| 6,176,992 | B1 | 1/2001 | Talieh | 205/87 |
| 6,179,982 | B1 | 1/2001 | Ting et al. | 205/80 |
| 6,179,983 | B1 | 1/2001 | Reid et al. | 205/96 |
| 6,375,823 | B1 | 4/2002 | Matsuda et al. | 205/117 |
| 6,402,925 | B2 | 6/2002 | Talieh | 205/222 |
| 6,416,647 | B1 | 7/2002 | Dordi et al. | 205/137 |
| 2002/0029961 | A1 | 3/2002 | Dordi et al. | 204/198 |

FOREIGN PATENT DOCUMENTS

| JP | 55-85692 | 6/1980 |
| JP | 62-37840 | 8/1987 |

(List continued on next page.)

*Primary Examiner*—Patrick Ryan
*Assistant Examiner*—Thomas H. Parsons
(74) *Attorney, Agent, or Firm*—Wenderoth, Lind & Ponack, L.L.P.

(57) ABSTRACT

A plating method and apparatus for a substrate fills a metal, e.g., copper, into a fine interconnection pattern formed in a semiconductor substrate. The apparatus has a substrate holding portion 36 horizontally holding and rotating a substrate with its surface to be plated facing upward. A seal material 90 contacts a peripheral edge portion of the surface, sealing the portion in a watertight manner. A cathode electrode 88 passes an electric current upon contact with the substrate. A cathode portion 38 rotates integrally with the substrate holding portion 36. An electrode arm portion 30 is above the cathode portion 38 and movable horizontally and vertically and has an anode 98 face-down. Plating liquid is poured into a space between the surface to be plated and the anode 98 brought close to the surface to be plated. Thus, plating treatment and treatments incidental thereto can be performed by a single unit.

77 Claims, 62 Drawing Sheets

FOREIGN PATENT DOCUMENTS

| | | | |
|---|---|---|---|
| JP | 64-79377 | | 3/1989 |
| JP | 7-81197 | * | 8/1995 |
| JP | 7-107199 | * | 11/1995 |
| JP | 8-283993 | * | 10/1996 |
| JP | 11-279797 | | 10/1999 |
| JP | 2000-64087 | | 2/2000 |
| JP | 2000-87296 | | 3/2000 |
| JP | 2000-232078 | | 8/2000 |
| JP | 2000-328297 | * | 11/2000 |
| WO | 99/45170 | | 10/1999 |

* cited by examiner results of measurement of film thickness

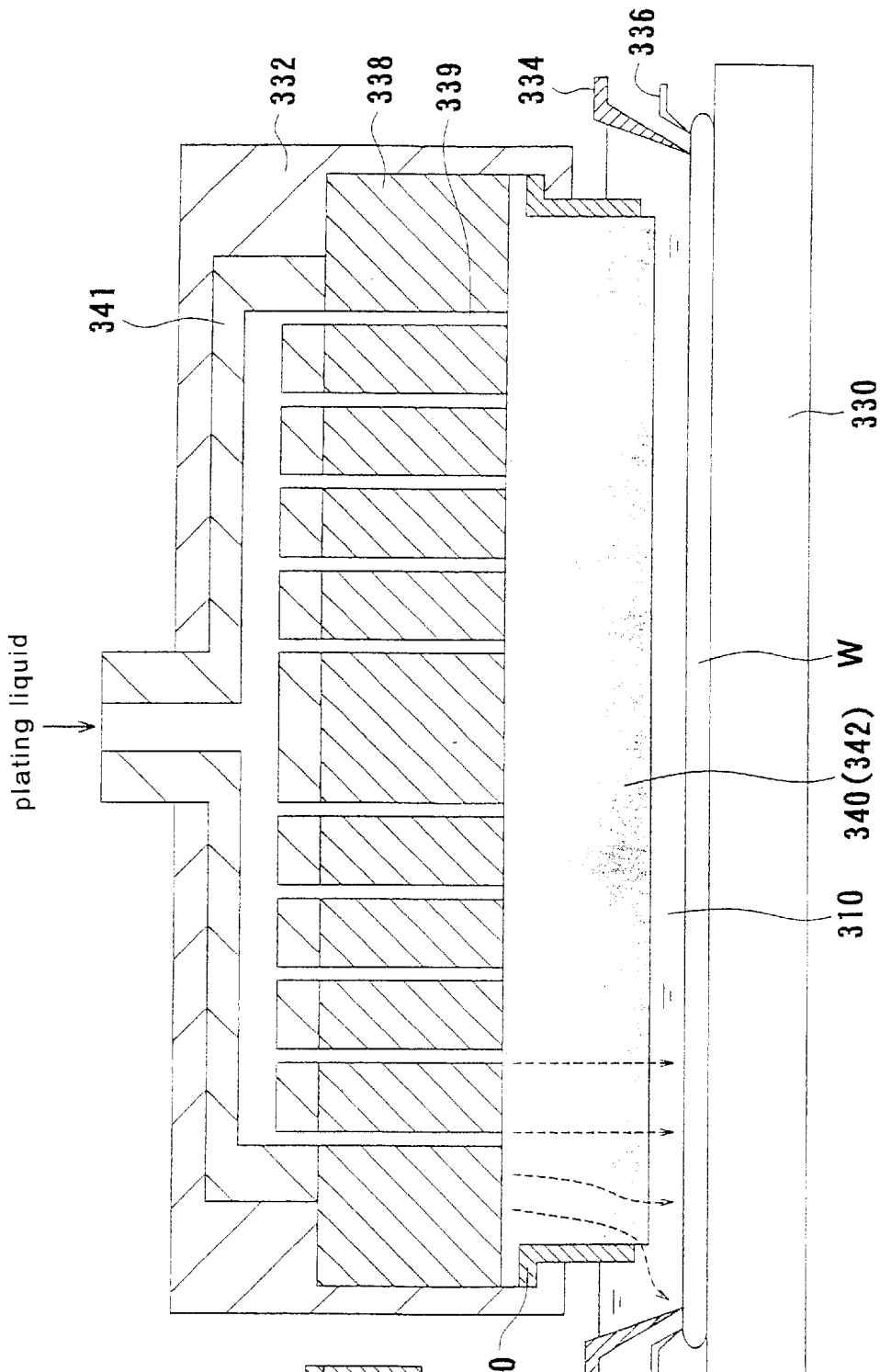
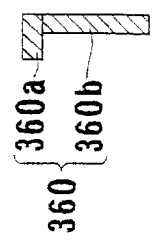
FIG. 50A
FIG. 50B results of measurement of film thickness 342a 342a

PLATING APPARATUS

BACKGROUND OF THE INVENTION

1. Field of the Invention

The present invention relates to a plating apparatus and a plating method for a substrate, and more particularly to a plating apparatus and a plating method for a substrate for filling a metal such as copper (Cu) or the like in fine interconnection patterns (recesses) formed on a semiconductor substrate.

The present invention also relates to an electrolytic treatment method for applying electrolytic treatment, such as plating or etching, to the surface of a substrate to be treated, and an apparatus therefor.

The present invention further relates to an electrolytic treatment apparatus for applying, for example, plating or etching to the surface of a member to be treated, especially an electrolytic treatment apparatus and a method for controlling the state of its electric field.

2. Description of the Related Art

Aluminum or aluminum alloy has generally been used as a material for forming interconnection circuits on semiconductor substrates. As the integrated density increases, there is a demand for the usage of a material having a higher conductivity as an interconnection material. A method has been proposed to plate a substrate to fill an interconnection pattern formed thereon with copper or its alloy.

There are various processes known including CVD (chemical vapor deposition), sputtering, etc. to fill the interconnection pattern with copper or its alloy. However, if the material of the metal layers is copper or its alloy, i.e., for forming copper interconnects, the CVD process is costly, and the sputtering process fails to embed copper or its alloy in interconnection patterns having a high aspect ratio, i.e., a high ratio of depth to width. The plating process is most effective to deposit a metal layer of copper or its alloy.

Various processes are available for plating semiconductor substrates with copper. They include a process of immersing a substrate in a plating liquid held at all times in a plating tank, referred to as a cup-type or dipping-type process, a process of holding a plating liquid in a plating tank only when a substrate to be plated is supplied to the plating tank, an electrolytic plating process of plating a substrate with a potential difference, and an electroless plating process for plating a substrate with no potential difference.

Conventionally, a plating apparatus for performing this type of copper plating was equipped with a horizontal arrangement of a plurality of units, such as a unit for performing a pretreatment step incidental to plating, a unit for performing a cleaning/drying step after plating, and a unit for performing a plating step, and a transfer robot for transferring the substrate between these units. The substrate was subjected to a predetermined treatment in each unit while being transferred between the units, and was sequentially transported to a subsequent step after plating treatment.

In the conventional plating apparatus, however, separate units were provided for respective steps, such as plating treatment and pretreatment, and the substrate was transferred to the respective units and treated thereby. Thus, there were problems that the apparatus was considerably complicated and difficult to control, occupied a great area, and involved a considerably high manufacturing cost.

With electroplating, moreover, if air bubbles are present in a plating liquid filled between a surface to be plated of a substrate (cathode) and an anode, the air bubbles, as insulators, function as if they were anode masks. As a result, the film thickness of a plating formed at positions corresponding to these portions may decrease, or a complete lack of plating may occur. To obtain a uniform, high quality plated film, therefore, it is necessary to leave no air bubbles in the plating liquid between the surface to be plated of the substrate and the anode.

Furthermore, electrolytic treatment, especially electroplating, is widely used as a method for forming a metal film. In recent years, copper electroplating for multilayer interconnects of copper, and gold electroplating for bump formation, for example, have attracted attention because of their effectiveness (inexpensiveness, hole filling characteristics, etc.), and have found increased use, for instance, in the semiconductor industry.

FIG. 71 shows a conventional general constitution of a plating apparatus for applying electroplating onto the surface of a substrate to be treated (hereinafter referred to as a substrate), such as a semiconductor wafer, by the use of a so-called face-down method. This plating apparatus includes a cylindrical plating tank 602 opening upward and holding a plating liquid 600 therein and a substrate holder 604 for detachably holding a substrate W face-down and at such a position that the substrate W covers the top opening of the plating tank 602. Inside the plating tank 602, a flat sheet type anode plate 606, immersed in the plating liquid 600 to constitute an anodic electrode, is placed horizontally. On the other hand, a conductive layer S is formed on the lower surface (plating surface) of the substrate W, and this conductive layer S has, at its peripheral edge portion, contact with cathodic electrodes.

A plating liquid jet pipe 608 for forming an upwardly directed jet of the plating liquid is connected to the center of the bottom of the plating tank 602, and a plating liquid receiver 610 is placed on an upper external portion of the plating tank 602.

With the above structure, the substrate W held by the substrate holder 604 is placed face-down above the plating tank 602. The plating liquid 600 is gushed upward from the bottom of the plating tank 602 to strike a jet of the plating liquid 600 on the lower surface (plating surface) of the substrate W. Simultaneously, a predetermined voltage is applied between the anode plate 606 (anodic electrode) and the conductive layer S (cathodic electrode) of the substrate W from a plating power source 612 to form a plated film on the lower surface of the substrate W. At this time, the plating liquid 600 which has overflowed the plating tank 602 is collected from the plating liquid receiver 610.

Wafers and liquid crystal substrates for LSI's tend to increase in area year by year. In line with this tendency, variations in the film thickness of a plated film formed on the surface of the substrate are posing problems. In detail, to supply a cathode potential to the substrate, contacts with the electrode are provided in a peripheral edge portion of the conductive layer formed beforehand on the substrate. As the area of the substrate increases, the electric resistance of the conductive layer ranging from the contact on the periphery of the substrate to the center of the substrate also increases. As a result, a potential difference is produced in the surface of the substrate, causing a difference in the plating speed, thereby leading to variations in the film thickness of the resulting plated film.

That is, to apply electroplating onto the surface of the substrate to be treated, a common practice is to form a conductive layer on the surface of the substrate to be treated (hereinafter referred to simply as "substrate"), bring contacts for supplying a cathode potential into contact with a site on the conductive layer in proximity to the outer periphery of the substrate W, install an anode at a position facing the substrate W, fill a plating liquid between the anode and the substrate W, and apply an electric current between the anode and the contacts with a direct current power source to perform plating on the conductive layer of the substrate W. In the case of a large-area substrate, however, the electric resistance of the conductive layer ranging from the contact close to the outer periphery of the substrate to the center of the substrate W becomes so high that a potential difference arises in the surface of the substrate W, causing differences in the plating speed among respective portions.

FIG. 72 is a view showing the film thickness distribution of copper plated films over the surface of the substrate when copper electroplating was performed, using a conventional general plating apparatus as shown in FIG. 71, on a silicon substrate of 200 mm in diameter having a conductive layer (a copper thin film) with a film thickness of 30 nm, 80 nm and 150 nm formed thereon. FIG. 73 is a view showing the film thickness distribution of copper plated films over the surface of the substrate when copper electroplating was similarly performed on each of silicon substrates of 100 mm, 200 mm and 300 mm in diameter having a conductive layer (a copper thin film) with a film thickness of 100 nm formed thereon. As shown in FIGS. 72 and 73, when the conductive layer is thin, or the diameter of the substrate is large, there are great variations in the distribution of the film thickness of the copper plated film formed by electroplating. In extreme cases, no copper film may be formed in the vicinity of the center of the substrate.

This phenomenon will be explained electrochemically as follows:

FIG. 74 shows an electrical equivalent circuit diagram of the conventional general electroplating apparatus shown in FIG. 71. When a predetermined voltage is applied by a plating power source 612 between the anode plate 606 (anodic electrode) submerged in the plating liquid 600 and the conductive layer S (cathodic electrode) of the substrate W to form a plated film on the surface of the conductive layer S, the following resistance components exist in this circuit:

R1: Power source wire resistance between power source and anode, and various contact resistances
R2: Polarization resistance at anode
R3: Plating liquid resistance
R4: Polarization resistance at cathode (plated surface)
R5: Resistance of conductive layer
R6: Power source wire resistance between cathode potential lead-in contact and power source, and various contact resistances.

As shown in FIG. 74, when the resistance R5 of the conductive layer S becomes higher than the other electric resistances R1 to R4 and R6, the potential difference produced between both ends of this resistance R5 of the conductive layer S increases, and accordingly, a difference occurs in the plating current. Thus, the plated film growth rate lowers at a position distant from the cathode lead-in contact. If the film thickness of the conductive layer S is small, the resistance R5 further increases, and this phenomenon appears conspicuously. Furthermore, this fact means that the current density differs over the surface of the substrate, and the characteristics of plating themselves (resistivity, purity, filling characteristics, etc. of the plated film) are not uniform over the surface of the substrate.

Even in electrolytic etching, in which the substrate is an anode, the same problems occur, merely with the direction of electric current being reversed. In a manufacturing process for a large-diameter wafer, for example, the etching rate at the center of the wafer slows compared with the peripheral edge portion.

As a method for avoiding these problems, it is conceivable to increase the thickness of the conductive layer or decrease the electric conductivity. However, the substrate is subject to various restrictions, even in manufacturing steps other than plating. Furthermore, for example, when a thick conductive layer is formed on a fine pattern by sputtering, voids easily form inside the pattern. Thus, it is impossible to easily increase the thickness of the conductive layer or change the film type of the conductive layer.

Placement of the cathode potential lead-in contacts on the entire surface of the substrate makes it possible to make the potential difference over the surface of the substrate small. However, this placement is unrealistic because the site used as the electrical contacts cannot be used as LSI. Furthermore, increasing the resistance value of the plating liquid (resistance R3, R2 or R4 in FIG. 74) is also effective. However, changing the electrolyte of the plating liquid means changing all of the plating characteristics. Lowering the concentration of metal ions to be plated, for example, brings about the restriction that the plating speed cannot be made sufficiently high.

As described above, in the step of performing electroplating by providing contacts in a peripheral portion of the substrate and using the conductive layer on the surface of the substrate, the problem arises that as the size of the substrate increases, the plated film thickness greatly varies over the surface of the substrate. This problem, in particular, is a major restriction in the semiconductor industry, which places emphasis on the uniformity of the film thickness over the surface of the substrate to be treated, and the uniformity of the process.

SUMMARY OF THE INVENTION

The present invention has been accomplished in view of the above-described facts. An object of the present invention is to provide a plating apparatus and a plating method capable of performing plating treatment and treatments incidental thereto with a single unit, and further a plating apparatus and a plating method for a substrate which leave no air bubbles in a plating liquid filled between a surface to be plated of the substrate and an anode.

Another object of the present invention is to provide an electrolytic treatment apparatus and method capable of performing uniform electrolytic treatment over a surface of a substrate, without changing the thickness and film type of a conductive layer, or an electrolyte of a plating liquid or the like.

Still another object of the present invention is to provide an electrolytic treatment apparatus capable of actively controlling an electric field state to achieve the desired distribution of the film thickness over the surface of the substrate, and an electric field state control method for the apparatus.

According to a first aspect of the invention, there is provided a plating apparatus for a substrate comprising a substrate holding portion for holding the substrate such that a surface to be plated faces upward. A cathode electrode causes current to flow by being in contact with the substrate. An anode is positioned above the surface to be plated and a plating liquid pouring means pours a plating liquid into a space between the surface to be plated of the substrate held by the substrate holding portion and the anode brought close to the surface to be plated.

According to this feature, plating treatment is performed with the substrate being held face-up by the substrate holding portion and the plating liquid being filled between the surface to be plated and the anode of an electrode arm portion. After plating treatment, the plating liquid is withdrawn from between the plated surface and the anode of the electrode arm portion, and the electrode arm portion is raised to uncover the plated surface. Thus, pretreatment associated with plating, and other treatments, such as cleaning/drying treatment, can be performed before and after plating treatment, with the substrate being held by the substrate holding portion.

According to a second aspect of the invention, the plating apparatus according to the first aspect has a plating liquid impregnated material composed of a water retaining material is contacted with and held on a lower surface of the anode. In copper plating, it is common practice to use copper, which contains phosphorus with a content of 0.03 to 0.05% (phosphorus-containing copper), as an anode in order to suppress the formation of slime. When phosphorus-containing copper is used as the anode, what is called a black film is formed on the surface of the anode as plating proceeds. In such a case, the plating liquid impregnated material is holding the plating liquid therein to wet the surface of the anode, thereby preventing fall of the black film onto the plated surface of the substrate, and simultaneously facilitating extraction of air to the outside when the plating liquid is poured between the surface to be plated and the anode.

According to a third aspect of the invention, the plating apparatus according to the first aspect comprises a cathode portion and a plating liquid tray disposed laterally of the cathode portion. The anode is movable between the cathode portion and the plating liquid tray. According to this feature, the anode is immersed in the plating liquid in the plating liquid tray and wetted thereby when plating treatment is not performed. Thus, drying and oxidation of the black film formed on the anode surface can be prevented.

According to a fourth aspect of the invention, the plating apparatus according to the first aspect comprises a cathode portion and a plurality of nozzles disposed laterally of the cathode portion. The nozzles jet a pretreatment liquid, a cleaning liquid, a gas or the like toward the surface to be plated held by the substrate holding portion. According to this feature, the pretreatment liquid or the cleaning liquid is jetted from the nozzles toward the surface to be plated in a state in which the substrate, before and after plating treatment, is held by the substrate holding portion and its surface to be plated is uncovered facing upwards. Hence pretreatment and cleaning treatment can be performed.

According to a fifth aspect of the invention, the plating apparatus according to the first aspect comprises a cathode portion wherein the substrate holding portion is capable of ascending and descending between a lower substrate transfer position, an upper plating position where a peripheral edge portion of the surface to be plated contacts the cathode portion, and a pretreatment/cleaning position intermediate these positions. As described above, the substrate holding portion is raised and lowered so as to correspond to respective operating positions. Thus, greater compactness and improved operating properties are achieved.

According to a sixth aspect of the invention, a plating method for a substrate comprises sealing a peripheral edge portion of a surface to be plated in a watertight manner. The surface to be plated faces upward and is electrically connected to a cathode electrode. An anode is positioned closely above the surface to be plated and pouring a plating liquid is poured into a sealed space between the surface to be plated and the anode.

According to a seventh aspect of the invention, remaining plating liquid is removed by a plating liquid recovering nozzle after plating according to the sixth aspect.

According to an eighth aspect of the invention, the plating method according to the sixth aspect comprises moving a pre-coating/recovering arm to a position facing the substrate before plating and supplying a pre-coating liquid from a pre-coating nozzle to perform pre-coating treatment.

According to a ninth aspect of the invention, the plating method according to the sixth aspect comprises positioning a plating liquid impregnated material composed of a water retaining material in a space between the surface to be plated and the anode and holding the plating liquid inside the plating liquid impregnated material.

According to a tenth aspect of the invention, there is provided a plating apparatus for a substrate comprising an anode positioned above a surface of the substrate to be plated held by a substrate holding portion and a cathode electrode for causing current to flow by being in contact with the substrate. A plating liquid impregnated material composed of a water retaining material is positioned in a space between the surface to be plated and the anode to perform plating.

According to an eleventh aspect of the invention, the plating apparatus according to the tenth aspect has the plating liquid impregnated material be a high resistance structure.

According to a twelfth aspect of the invention, the plating apparatus according to the tenth aspect has the plating liquid impregnated material comprising a ceramic.

According to a thirteenth aspect of the invention, a plating apparatus for a substrate, plates a surface to be plated such that the plating liquid impregnated material is out of contact with the surface to be plated. A plating liquid is filled into a gap between the plating liquid impregnated material and the surface of the substrate to be plated.

According to a fourteenth aspect of the invention, a plating apparatus performs plating treatment and cleaning/drying treatment in a single unit by raising and lowering the substrate so as to correspond to respective operating positions, with the substrate being held by a substrate holding portion.

According to a fifteenth aspect of the invention, a plating apparatus according to the fourteenth aspect comprises an anode positioned above the surface of the substrate to be plated and a cathode electrode for causing current to flow by being in contact with the substrate. A plating liquid impregnated material composed of a water retaining material is positioned in a space between the surface to be plated and the anode.

According to a sixteenth aspect of the invention, a plating method for a substrate comprises transferring the substrate into a plating unit with a transfer robot after withdrawing the substrate from a loading/unloading unit housing the substrate, holding the substrate with a substrate holding portion in the plating unit, and performing treatments in a single unit by raising and lowering the substrate so as to correspond to respective operating positions for performing plating treatment and cleaning/drying treatment with the substrate being held by the substrate holding portion.

According to a seventeenth aspect of the invention, a plating apparatus for a substrate comprises a loading/unloading unit housing the substrate, a plating unit for performing plating treatment and treatment incidental thereto in a single unit, and a transfer robot for transferring the substrate between the loading/unloading unit and the plating unit.

According to an eighteenth aspect of the invention, a plating apparatus for a substrate comprises an anode positioned above a surface of the substrate held by a substrate holding portion, a cathode electrode for causing current to flow by being in contact with the substrate, and a pure water supply nozzle. The substrate and the cathode electrode are simultaneously cleaned by supplying pure water from the nozzle after completion of plating.

According to a nineteenth aspect of the invention, a plating apparatus for a substrate comprises a substrate holding portion for holding the substrate, a cathode electrode for causing current to flow by being in contact with the substrate held by the substrate holding portion, an anode positioned closely to the substrate, and plating liquid pouring means for pouring a plating liquid into a space between the surface to be plated and the anode. The plating liquid pouring means is constituted such that the plating liquid is poured between the anode and the surface to be plated from a plating liquid pouring path provided in part of the anode or provided around an outer peripheral portion of the anode and is spread on the surface of the substrate to be plated.

According to a twentieth aspect of the invention, the plating apparatus according to the nineteenth aspect comprises the substrate holding portion for holding the substrate such that the surface to be placed faces upward, a seal material for holding the plating liquid on the surface to be plated, the cathode portion having a cathode electrode for causing current to flow by being in contact with the substrate, an electrode arm portion having the anode movable horizontally and vertically in proximity to the cathode electrode, and plating liquid pouring means for pouring a plating liquid into a space between the surface to be plated and the anode. The plating liquid pouring means is constituted such that the plating liquid is poured between the anode and the surface to be plated from a plating liquid pouring hole provided through part of the anode or a nozzle provided around the outer peripheral portion of the anode and is spread on the surface to be plated.

According to this features, plating treatment is performed with the substrate being held face-up by the substrate holding portion and the plating liquid being filled between the surface to be plated and the anode of the electrode arm portion. After plating treatment, the plating liquid is withdrawn from between the plated surface and the anode of the electrode arm portion, and the electrode arm portion is raised to uncover the plated surface. Thus, pretreatment associated with plating, and other treatments, such as cleaning/drying treatment, can be performed before and after plating treatment, with the substrate being held by the substrate holding portion. Furthermore, when the plating liquid is poured between the surface to be plated and the anode, flow of the plating liquid spreading all over the surface to be plated occurs. Along with this flow of the plating liquid, air between the surface to be plated and the anode is pushed outward so that enclosure of air by the plating liquid is prevented. Consequently, air bubbles are prevented from remaining in the plating liquid filled between the surface to be plated and the anode.

According to a twenty-first aspect of the invention, the plating apparatus according to the twentieth aspect has the plating liquid pouring means having a plating liquid introduction path provided along a diametrical direction of the anode on a surface of the anode opposite to a surface of the anode facing the substrate, and connected to a plating liquid supply pipe. The plating liquid pouring hole is provided at a position facing a plating liquid introduction hole provided so as to open toward a surface of the plating liquid introduction path located at the anode side. According to this feature, a plating flow occurs in a direction perpendicular to the plating liquid introduction pipe, in accordance with the pouring of the plating liquid between the surface to be plated and the anode.

According to a twenty-second aspect of the invention, the plating apparatus according to the nineteenth aspect has the plating liquid pouring means having a plating liquid introduction path which is provided in a cruciform, radial or circumferential form on a surface of the anode opposite to a surface of the anode facing the substrate, and is connected to a plating liquid supply pipe. The plating liquid pouring hole is provided at a position facing a plating liquid introduction hole provided so as to open toward a surface of the plating liquid introduction path located at the anode side. According to this feature, a plating flow which spreads radially in respective quadrants partitioned by the plating liquid introduction pipe occurs in accordance with the pouring of the plating liquid between the surface to be plated and the anode.

According to a twenty-third aspect of the invention, a plating method for a substrate comprises positioning an anode closely to at least part of a surface of the substrate to be plated which is electrically connected to a cathode electrode and pouring a plating liquid between the surface to be plated and the anode. A plating liquid column which bridges the surface to be plated and the anode is formed and the plating liquid is poured with the plating liquid column as a starting point.

According to a twenty-fourth aspect of the invention, the plating method according to the twenty-third aspect has the plating liquid poured between the surface to be plated and the anode from a plating liquid pouring path provided in part of the anode or provided around an outer peripheral portion of the anode.

According to a twenty-fifth aspect of the invention, there is provided a plating method for a substrate comprising positioning an anode closely to at least part of a surface of the substrate to be plated which is electrically connected to a cathode electrode and filling a plating liquid into a space between the surface to be plated and the anode by covering the plating liquid on the surface to be plated and bringing the substrate and the anode close to each other gradually under relative rotation. According to this feature, air bubbles between the substrate and the anode can be gradually moved outward and driven off as the substrate and the anode approach each other.

According to a twenty-sixth aspect of the invention, the plating method according to the twenty-fifth aspect has a plating liquid impregnated material composed of a porous substrate having water retaining properties placed on a surface of the anode facing the substrate and means for spreading the plating liquid between the plating liquid impregnated material and the substrate radially outwardly by relative rotation of the plating liquid impregnated material. The substrate is provided on a surface of the plating liquid impregnated material facing the substrate. According to this feature, air bubbles between the substrate and the anode can be driven off nearly completely.

According to a twenty-seventh aspect of the invention, there is provided an electrolytic treatment method in which a high resistance structure is provided in at least part of an electrolytic solution filled between a substrate to be treated having contact with one electrode of an anode and a cathode and the other electrode facing the substrate to be treated to perform electrolytic treatment of the surface of the substrate to be treated. The high resistance structure has an electrical conductivity lower than that of the electrolytic solution.

According to this feature, the electric resistance between the anode and the cathode submerged in the electrolytic solution is made higher via the high resistance structure than the electric resistance in the presence of the electrolytic solution only, so that the difference in current density over the surface of the substrate to be treated due to electric resistance can be decreased. In this case, electroplating can be performed by bringing the substrate to be treated into contact with the contact of the cathode, or electrolytic etching can be performed by bringing the substrate to be treated into contact with the contact of the anode.

According to a twenty-eighth aspect of the invention, the electrolytic treatment method according the twenty-seventh aspect has the high resistance structure constituted such that a resistance thereof in an equivalent circuit is higher than a resistance in the equivalent circuit between the contact with the electrode on a conductive layer formed on the surface of the substrate to be treated and a portion electrically farthest from the contact. According to this feature, the difference of current density over the surface due to electric resistance of a conductive layer formed on the substrate to be treated can be made even smaller.

According to a twenty-ninth aspect of the invention, the electrolytic treatment method according to the twenty-seventh aspect has the electrolytic treatment performed such that the substrate is held face-up by a substrate holding portion.

According to a thirtieth aspect of the invention, there is provided an electrolytic treatment apparatus for performing electrolytic treatment of a substrate to be treated by filling an electrolytic solution between the substrate, having contact with one electrode of an anode and a cathode, and the other electrode facing the substrate to be treated. A high resistance structure having an electrical conductivity lower than that of the electrolytic solution is provided in at least part of the electrolytic solution.

According to a thirty-first aspect of the invention, the electrolytic treatment apparatus according to the thirtieth aspect has the electrolytic treatment performed such that the substrate is held face-up by a substrate holding portion.

According to a thirty-second aspect of the invention, the electrolytic treatment apparatus according to the thirtieth aspect has the high resistance structure constituted such that a resistance thereof in an equivalent circuit is higher than a resistance in the equivalent circuit between the contact with the electrode on a conductive layer formed on the surface of the substrate to be treated and a portion electrically farthest from the contact.

According to a thirty-third aspect of the invention, the electrolytic treatment apparatus according to the thirtieth aspect has the high resistance structure comprising a porous substance holding an electrolytic solution therein. According to this feature, the electrical resistance of the high resistance structure can be increased via the electrolytic solution, which is complicatedly admitted into the porous substance, and follows a considerably long path, effectively in the thickness direction, even though the structure is a thin structure.

According to a thirty-fourth aspect of the invention, the electrolytic treatment apparatus according to the thirty-third aspect has the porous substance comprising a porous ceramic. As the ceramic, alumina, SiC, mullite, zirconia, titania, cordierite, etc. can be cited as examples. To hold the plating liquid stably, moreover, it is preferably a hydrophilic material. With the alumina-based ceramic, for example, that with a pore diameter of 10 to 300 $\mu$m, a porosity of 20 to 60%, and a thickness of about 0.2 to 200 mm, preferably about 2 to 50 mm, is used.

According to a thirty-fifth aspect of the invention, the electrolytic treatment apparatus according to the thirtieth aspect has the high resistance structure provided so as to divide the electrolytic solution into a plurality of parts. According to this feature, it is possible to use a plurality of electrolytic solutions, or prevent contamination or reaction of one of the electrodes from exerting an influence on the other electrode.

According to a thirty-sixth aspect of the invention, there is provided a method for controlling an electric field state in an electrolytic treatment apparatus comprising providing a high resistance structure in at least part of an electrolytic solution filled between a substrate to be treated having contact with one electrodes of an anode and a cathode, with the other electrode facing the substrate to be treated. The high resistance structure has an electrical conductivity lower than that of the electrolytic solution. An electric field of a surface of the substrate to be treated is controlled by adjusting at least one of an exterior shape of the high resistance structure, an internal structure of the high resistance structure, and an attachment of a member having a different electrical conductivity.

If the state of the electric field on the surface to be treated is thus actively controlled to achieve a desired state, the electrolytic treatment of the substrate can be have a desired distribution over the surface. In case electrolytic treatment is plating treatment, the thickness of a plated film formed on the substrate to be treated can be made uniformize, or an arbitrary distribution can be imparted to the thickness of the plated film formed on the substrate to be treated.

According to a thirty-seventh aspect of the invention, the method according to the thirty-sixth aspect has the adjusting of the exterior shape be at least one of adjustment of a thickness of the high resistance structure and adjustment of a shape on a plane of the high resistance structure.

According to a thirty-eighth aspect of the invention, the method according to the thirty-sixth aspect has the high resistance structure comprise a porous substance. The adjusting of the internal structure of the porous substance is at least one of adjustment of a pore diameter distribution thereof, adjustment of a porosity distribution thereof, adjustment of a flexing rate distribution thereof, and adjustment of a combination of materials.

According to a thirty-ninth aspect of the invention, the method according to the thirty-sixth aspect has the adjusting of attachment of the member having the different electrical conductivity be adjustment of a shielding area of the high resistance structure by means of the member having the different electrical conductivity.

According to a fortieth aspect of the invention, there is provided an electrolytic treatment apparatus for performing electrolytic treatment of a substrate to be treated by filling an electrolytic solution between the substrate, having contact with one electrode of an anode and a cathode, and the other electrode facing the substrate to be treated. A high resistance structure, having an electrical conductivity lower than that of the electrolytic solution, is provided in at least part of the electrolytic solution. An electric field of a surface of the substrate to be treated is controlled by adjusting at least one of an exterior shape of the high resistance structure, an internal structure of the high resistance structure, and attachment of a member having a different electrical conductivity.

According to a forty-first aspect of the invention, the electrolytic treatment apparatus according to the fortieth aspect has the adjusting of the exterior shape be at least one of adjustment of a thickness of the high resistance structure and adjustment of a shape on a plane of the high resistance structure.

According to a forty-second aspect of the invention, the electrolytic treatment apparatus according to the fortieth aspect has the high resistance structure comprise a porous substance. The adjusting of the internal structure of the porous substance is at least one of adjustment of a pore diameter distribution thereof, adjustment of a porosity distribution thereof, adjustment of a flexing rate distribution thereof, and adjustment of a combination of materials.

According to a forty-third aspect of the invention, the electrolytic treatment apparatus according to the fortieth aspect has the adjusting of attachment of the member having the different electrical conductivity be adjustment of a shielding area of the high resistance structure by means of the member having different electrical conductivity.

According to a fourth aspect of the invention, there is provided an electrolytic treatment apparatus for performing electrolytic treatment of a substrate to be treated by filling an electrolytic solution between the substrate having contact with one electrode of an anode and a cathode, and the other electrode facing the substrate to be treated. A high resistance structure, having an electrical conductivity lower than that of the electrolytic solution, is provided in at least part of the electrolytic solution. An outer periphery of the high resistance structure is held by a holding member. A seal member is provided between the high resistance structure and the holding member for preventing the electrolytic solution from leaking therethrough and preventing an electric current from flowing.

The high resistance structure may comprise alumina porous ceramics or silicon carbide ceramics. Moreover, the high resistance structure may be constituted by a material formed by bundling vinyl chloride in a fibrous form, and fusing the fibers together, or a material formed by shaping a foam such as polyvinyl alcohol, or a fiber such as Teflon (trade name) into a form such as a woven fabric or a nonwoven fabric. Furthermore, a composite of any of them may be used combined with a conductor and an insulator, or conductors. The high resistance structure may also be composed of a structure having another type of electrolytic solution sandwiched between two diaphragms.

According to a forty-fifth aspect of the invention, there is provided an electrolytic treatment apparatus for performing electrolytic treatment of a substrate to be treated by filling an electrolytic solution between the substrate which has contact with one electrode of an anode and a cathode, and the other electrode facing the substrate to be treated. An electrolytic solution impregnated material is disposed between the other electrode and the substrate to be treated. An electrolytic solution passing hole is provided in the other electrode for supplying the electrolytic solution into the electrolytic solution impregnated material. A pipe is inserted into the electrolytic solution passing hole, and the electrolytic solution supplied into the electrolytic solution impregnated material through the pipe is supplied from an opposite surface of the electrolytic solution impregnated material and filled between the electrolytic solution impregnated material and the substrate to be treated.

As the pipe, it is desirable to select a material which is not attacked by the electrolytic solution. Thus, even when the electrolytic treatment step is repeated by this electrolytic treatment apparatus, the inner diameter of the front end of the pipe does not increase with the passage of time. Hence, the ideal liquid filling state at the initial stage of production is similarly retained with the passage of time. Consequently, the situation where air is engulfed and air bubbles accumulate between the electrolytic solution impregnated material and the substrate to be treated can be avoided, and desired electrolytic treatment is always obtained.

According to a the forty-sixth aspect of the invention, the electrolytic treatment apparatus according to the forty-fifth has an electrolytic solution passage portion provided in the electrolytic solution impregnated material so as to continue to the electrolytic solution passing hole.

According to a forty-seventh aspect of the invention, there is provided an electrolytic treatment apparatus for performing electrolytic treatment of a substrate to be treated by filling an electrolytic solution between the substrate having contact with one electrode of an anode and a cathode, and the other electrode facing the substrate to be treated. An electrolytic solution impregnated material is disposed between the other electrode and the substrate to be treated. An electrolytic solution passage portion, having a predetermined depth, is formed in the electrolytic solution impregnated material. The electrolytic solution supplied from the other electrode side into the electrolytic solution impregnated material through the electrolytic solution passage portion is supplied from an opposite surface of the electrolytic solution impregnated material and filled between the electrolytic solution impregnated material and the substrate to be treated. Even when the electrolytic treatment step is repeated, the inner diameter of the front end of the electrolytic solution passage portion does not increase with the passage of time. Hence, the ideal liquid filling state at the initial stage of production is similarly retained with the passage of time. Consequently, the situation where air is engulfed and air bubbles accumulate between the electrolytic solution impregnated material and the substrate to be treated can be avoided, and desired electrolytic treatment is always obtained.

According to a forty-eighth aspect of the invention, the electrolytic treatment apparatus according to the forty-seventh aspect has a liquid reservoir for storing the electrolytic solution provided between the other electrode and the electrolytic solution impregnated material. The electrolytic solution stored in the liquid reservoir is supplied into the electrolytic solution impregnated material.

According to a forty-ninth aspect of the invention, there is provided an electrolytic treatment apparatus for performing electrolytic treatment of a substrate to be treated by filling an electrolytic solution between the substrate, having contact with one of electrode of an anode and a cathode, and the other electrode facing the substrate to be treated. An electrolytic solution impregnated material is disposed between the other electrode and the substrate to be treated. The electrolytic solution impregnated material is constituted such that a passage resistance of the electrolytic solution passing through the electrolytic solution impregnated material differs according to a location of the electrolytic solution impregnated material. The electrolytic solution supplied from the other electrode side into the electrolytic solution impregnated material is supplied from an opposite surface of the electrolytic solution impregnated material in a supply amount suited for the location, and filled between the electrolytic solution impregnated material and the substrate to be treated.

BRIEF DESCRIPTION OF THE DRAWINGS

FIGS. 50A and 50B are views showing still another embodiment of the present invention;

DETAILED DESCRIPTION OF THE PREFERRED EMBODIMENTS

An embodiment of the present invention will be described below with reference to the drawings. A substrate plating apparatus according to this embodiment is used to apply copper electroplating onto the surface of a semiconductor substrate, thereby obtaining a semiconductor apparatus having interconnects comprising a copper layer formed thereon. This plating process will be explained with reference to FIGS. 1A to 1C.

Figure 1A:
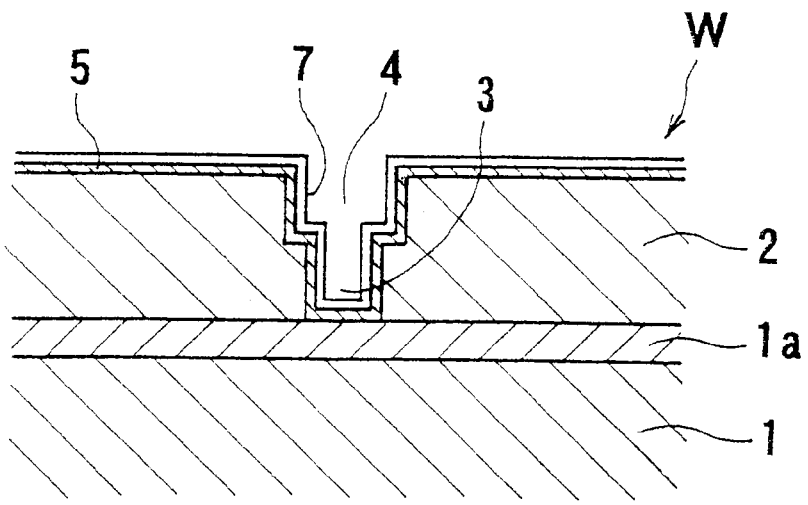
FIGS. 1A to 1C are sectional views showing an example of a process for performing plating by the substrate plating apparatus and method of the present invention.

As shown in FIG. 1A, an oxide film 2 of $SiO_2$ is deposited on the conductive layer 1a on a semiconductor substrate 1 on which semiconductor devices are formed. A contact hole 3 and a trench 4 for an interconnect are formed by lithography and etching technology. A barrier layer 5 of TiN or the like is formed thereon, and then a seed layer 7 as an electric supply layer for electroplating is formed on the barrier layer 5.

Figure 1B:
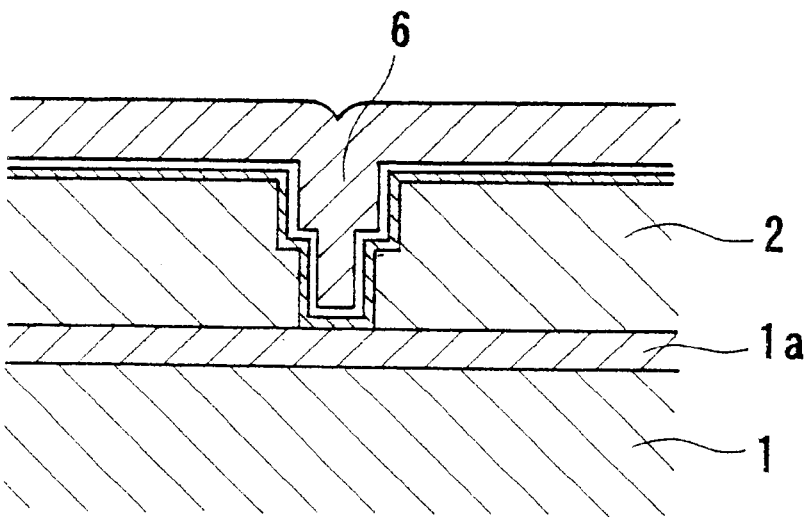
Figure 1C:
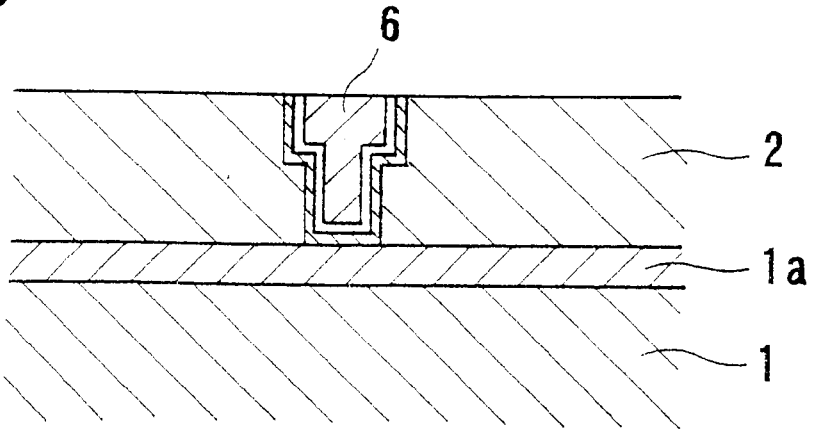

Then, as shown in FIG. 1B, the surface of the semiconductor substrate W is coated with copper by copper electroplating to deposit a plated copper film 6 on the oxide film 2, thus filling the contact hole 3 and the trench 4 of the semiconductor substrate 1 with copper. Thereafter, the plated copper film 6 on the oxide film 2 are removed by chemical mechanical polishing (CMP), thus making the plated copper film 6 in the contact hole 3 and the trench 4 lie flush with the oxide film 2. In this manner, an interconnect composed of the plated copper film 6 is formed as shown in FIG. 1C.

Figure 2:
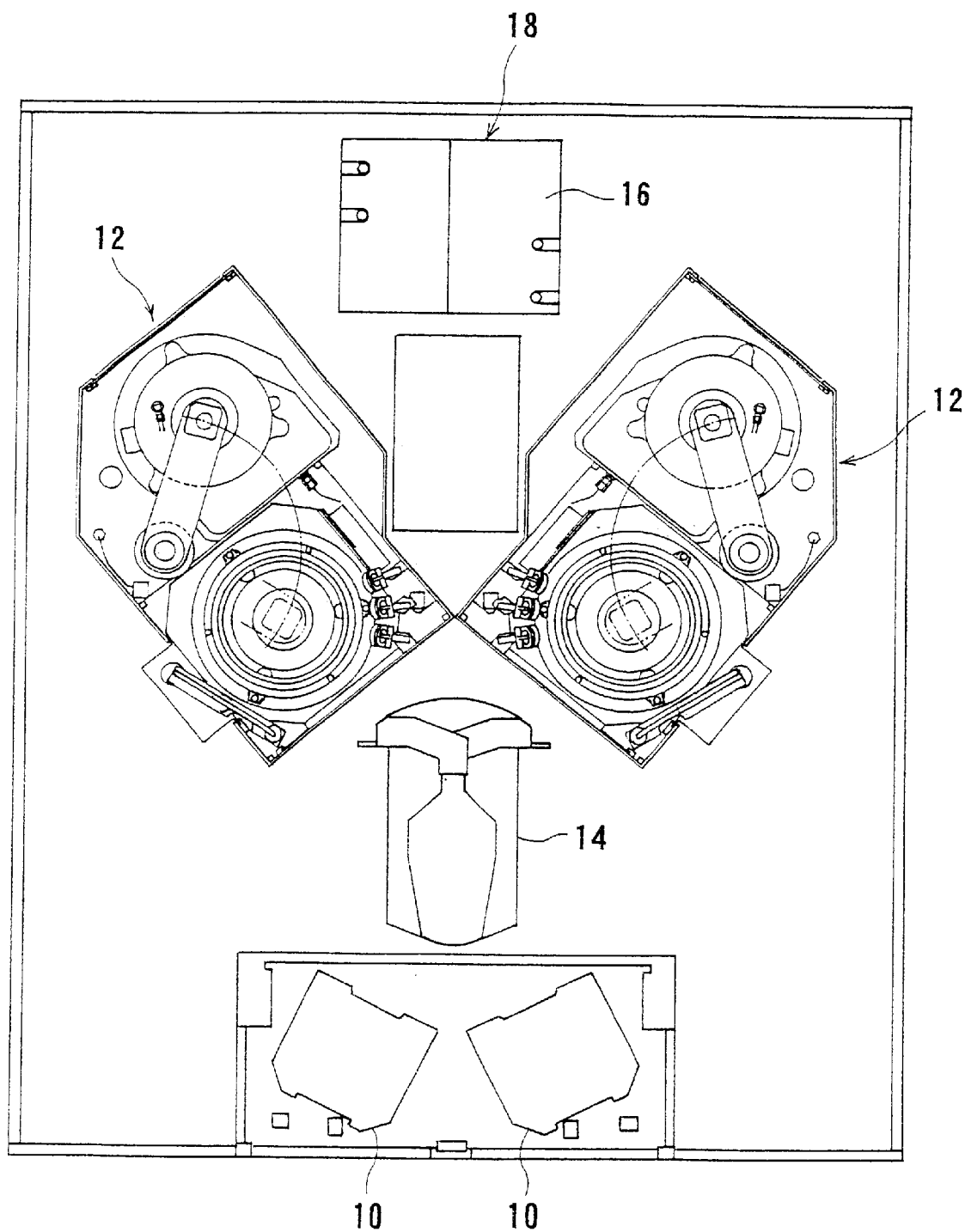
FIG. 2 is a plan view showing the whole of the substrate plating apparatus according to an embodiment of the present invention.

FIG. 2 is a plan view showing the whole of a plating apparatus for a substrate according to an embodiment of the present invention. As shown in FIG. 2, this plating apparatus has a rectangular facility which houses therein two loading/unloading units 10 for housing a plurality of substrates W therein, two plating units 12 for performing plating treatment and treatment incidental thereto, a transfer robot 14 for transferring substrates W between the loading/unloading units 10 and the plating units 12, and plating liquid supply equipment 18 having a plating liquid tank 16.

Figure 3:
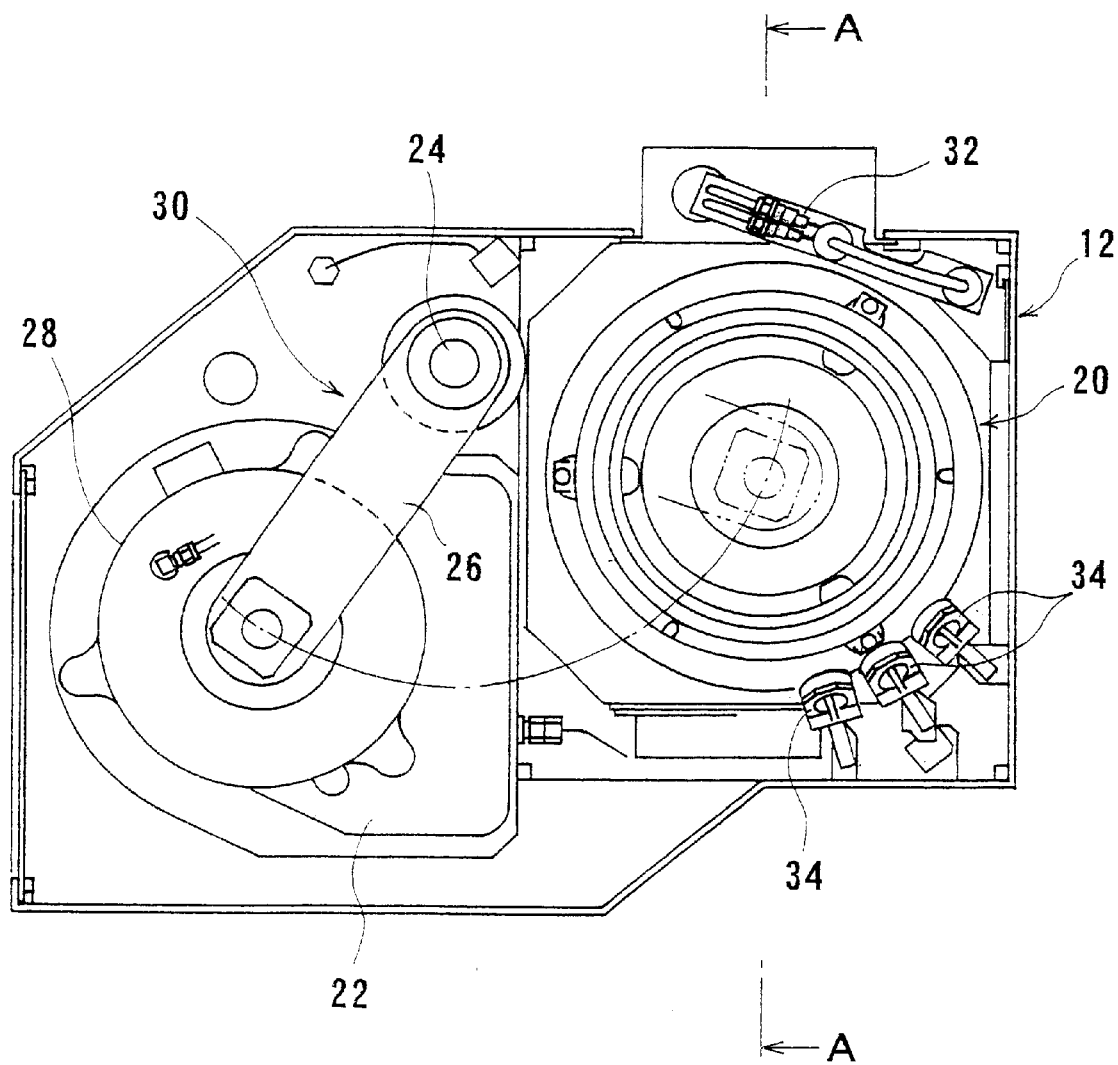
FIG. 3 is a plan view showing a plating unit.

The plating unit 12, as shown in FIG. 3, is provided with a substrate treatment section 20 for performing plating treatment and treatment incidental thereto, and a plating liquid tray 22 for storing a plating liquid is disposed adjacent to the substrate treatment section 20. There is also provided an electrode arm portion 30 having an electrode portion 28 which is held at the front end of an arm 26 swingable about a rotating shaft 24 and which is swung between the substrate treatment section 20 and the plating liquid tray 22. Furthermore, a pre-coating/recovering arm 32, and fixed nozzles 34 for ejecting pure water or a chemical liquid such as ion water, and further a gas or the like toward a substrate are disposed laterally of the substrate treatment section 20. In this embodiment, three of the fixed nozzles 34 are disposed, and one of them is used for supplying pure water.

Figure 4:
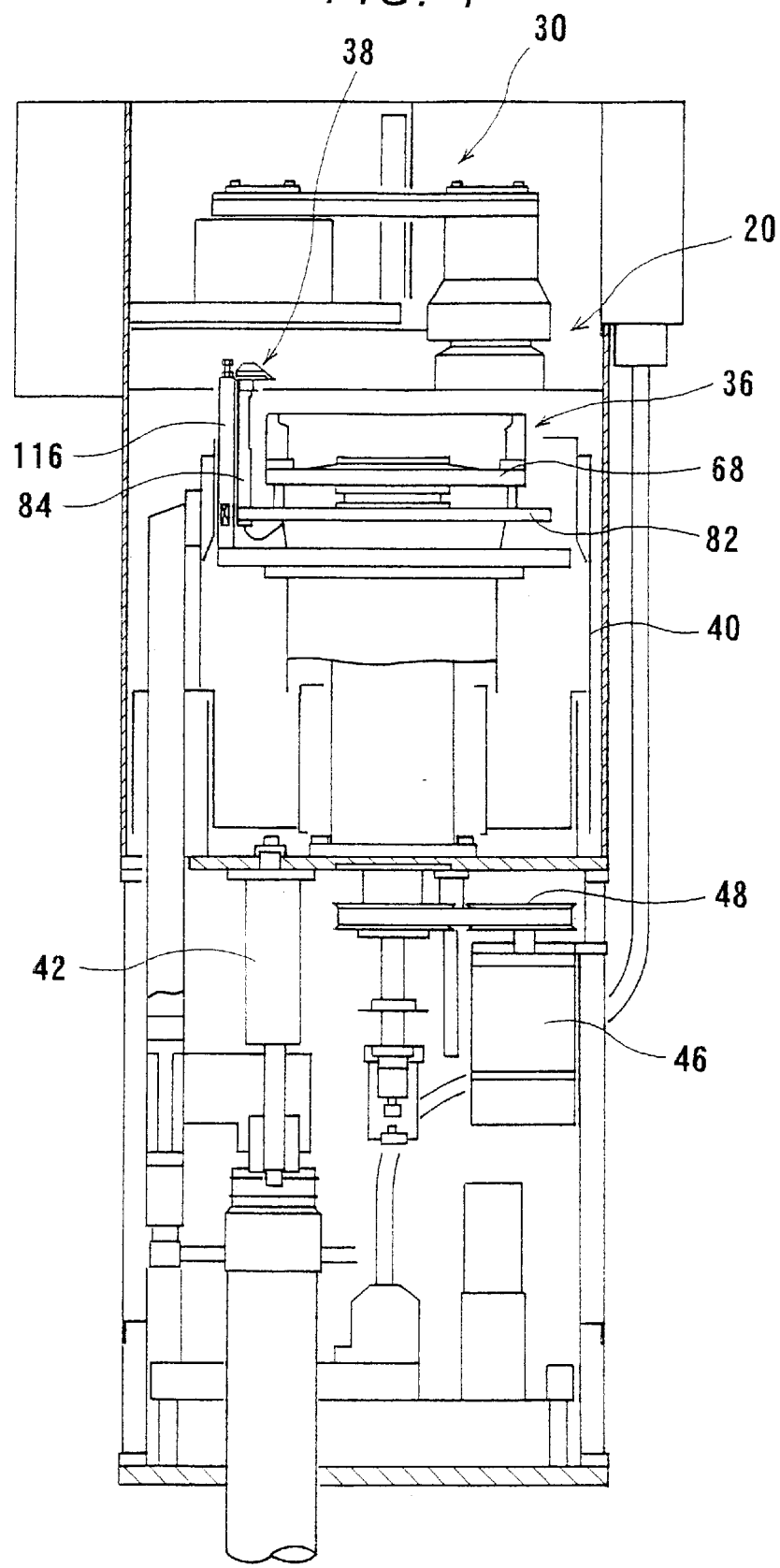
FIG. 4 is a sectional view taken on line A—A of FIG. 3.
Figure 5:
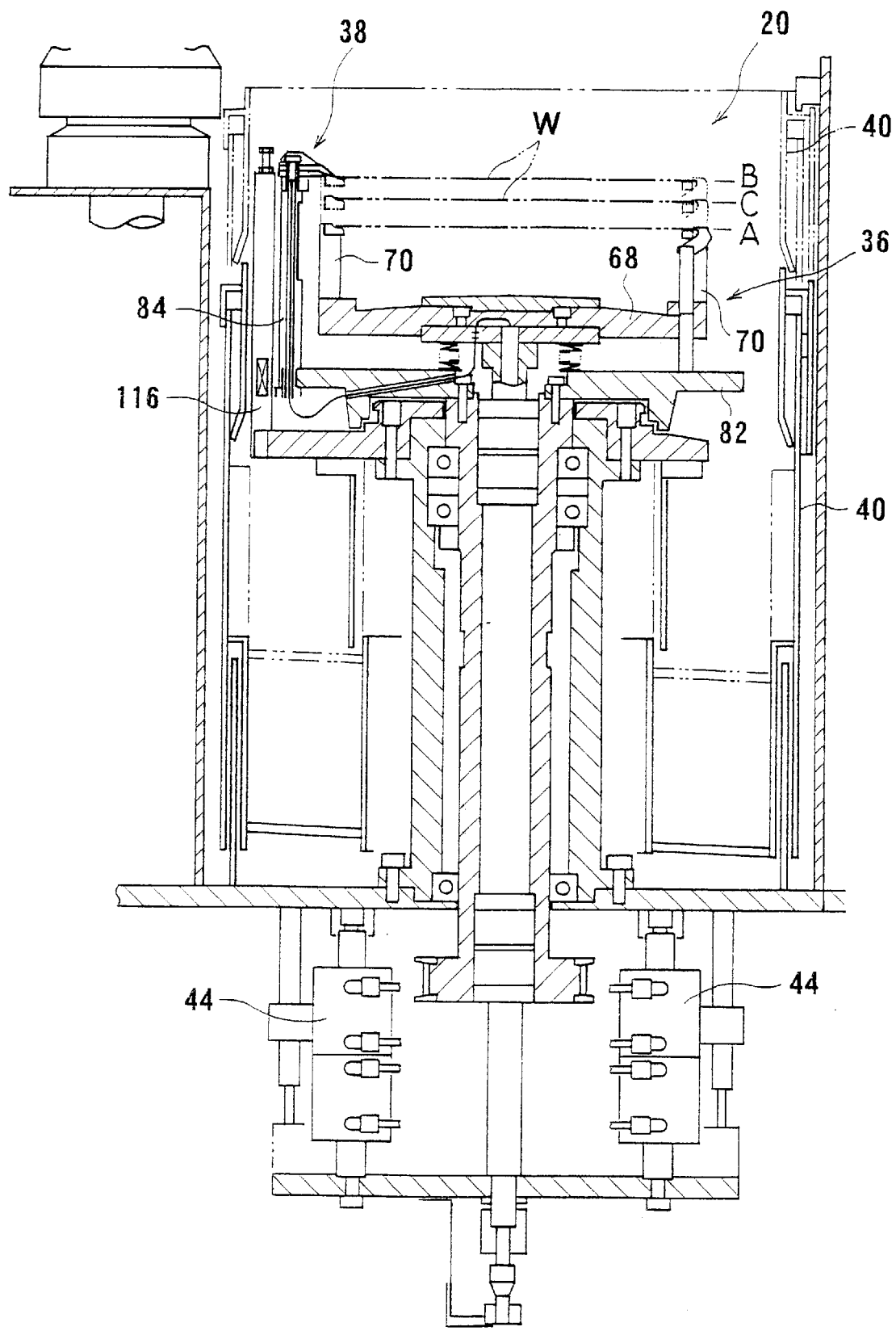
FIG. 5 is an enlarged sectional view of a substrate holding portion and a cathode portion.

The substrate treatment section 20, as shown in FIGS. 4 and 5, has a substrate holding portion 36 for holding a substrate W with its surface to be plated facing upward, and a cathode portion 38 located above the substrate holding portion 36 so as to surround a peripheral portion of the substrate holding portion 36. Further, a substantially cylindrical bottomed cup 40 surrounding the periphery of the substrate holding portion 36 for preventing scatter of various chemical liquids used during treatment is provided so as to be vertically movable by an air cylinder 42.

Figure 7:
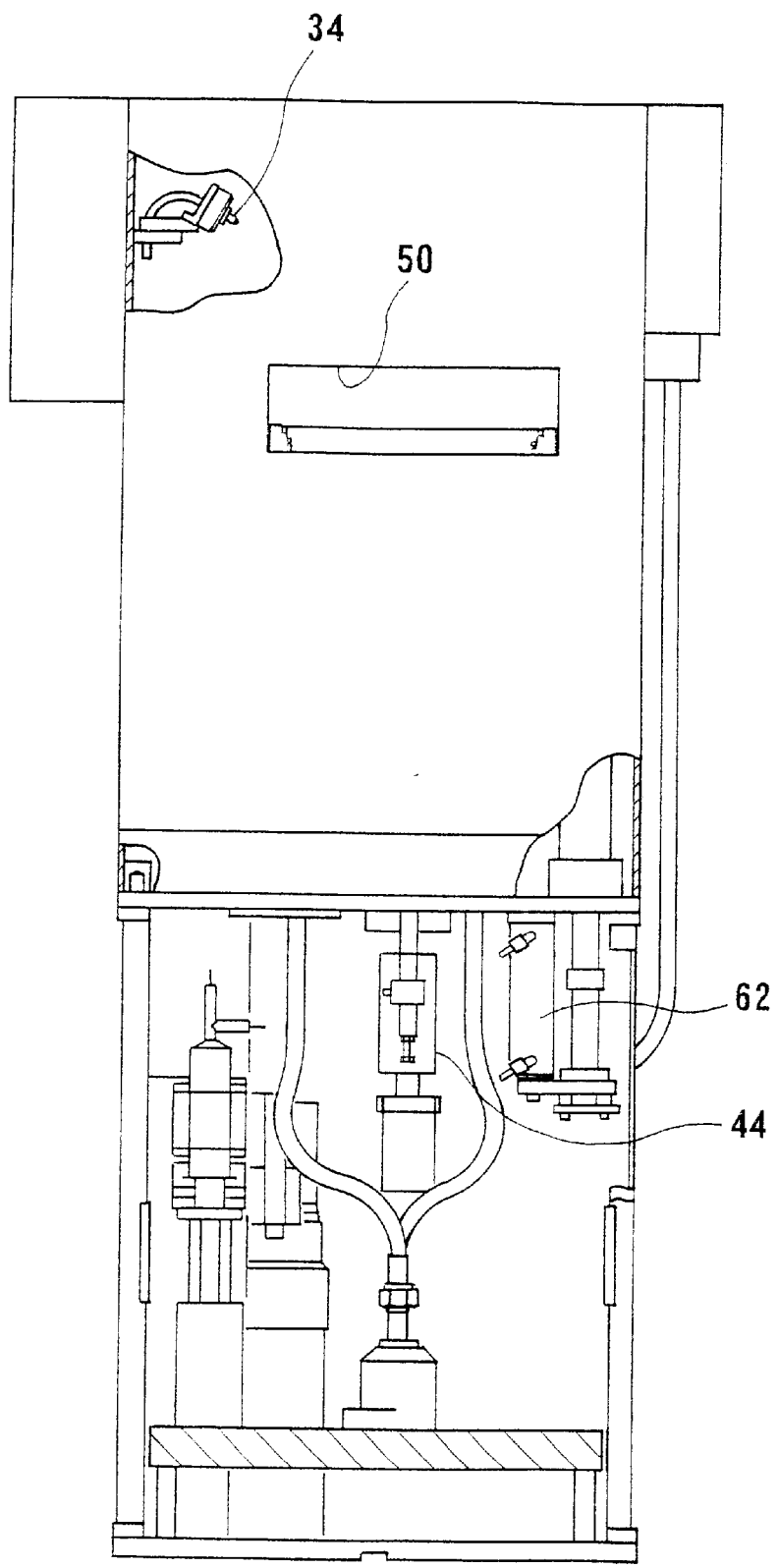
FIG. 7 is a right side view of FIG. 3.

The substrate holding portion 36 is adapted to be raised and lowered by the air cylinder 44 between a lower substrate transfer position A, an upper plating position B, and a pretreatment/cleaning position C intermediate between these positions. The substrate holding portion 36 is also adapted to rotate at an arbitrary acceleration and an arbitrary velocity integrally with the cathode portion 38 by a rotating motor 46 and a belt 48. A substrate carry-in and carry-out opening 50 is provided in confrontation with the substrate transfer position A in a frame side surface of the plating unit 12 facing the transfer robot 14, as shown FIG. 7. When the substrate holding portion 36 is raised to the plating position B, a seal member 90 and cathode electrodes 88 (to be described below) of the cathode portion 38 are brought into contact with the peripheral edge portion of the substrate W held by the substrate holding portion 36. On the other hand, the cup 40 has an upper end located below the substrate carry-in and carry-out opening 50, and when the cup 40 ascends, the upper end of the cup 40 reaches a position above the cathode portion 38 closing the substrate carry-in and carry-out opening 50, as shown by imaginary lines in FIG. 5.

Figure 6:
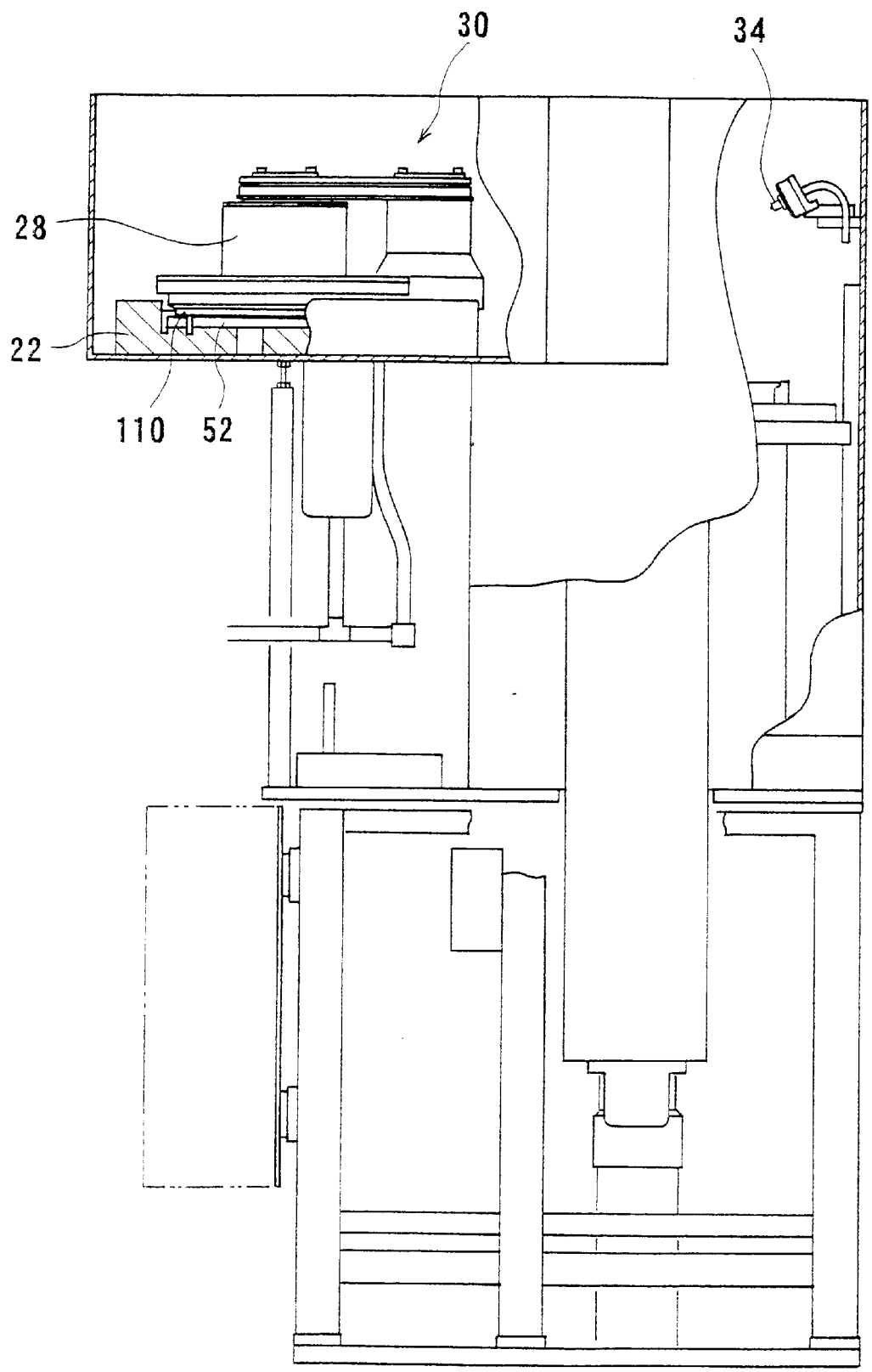
FIG. 6 is a front view of FIG. 3.

The plating liquid tray 22 serves to wet a plating liquid impregnated material 110 and an anode 98 (to be described later on) of the electrode arm portion 30 with a plating liquid, when plating has not been performed. As shown in FIG. 6, the plating liquid tray 22 is set at a size in which the plating liquid impregnated material 110 can be accommodated, and the plating liquid tray 22 has a plating liquid supply port and a plating liquid drainage port (not shown). A photo-sensor is attached to the plating liquid tray 22, and can detect brimming with the plating liquid in the plating liquid tray 22, i.e., overflow, and drainage. A bottom plate 52 of the plating liquid tray 22 is detachable, and a local exhaust port (not shown) is installed around the plating liquid tray.

Figure 8:
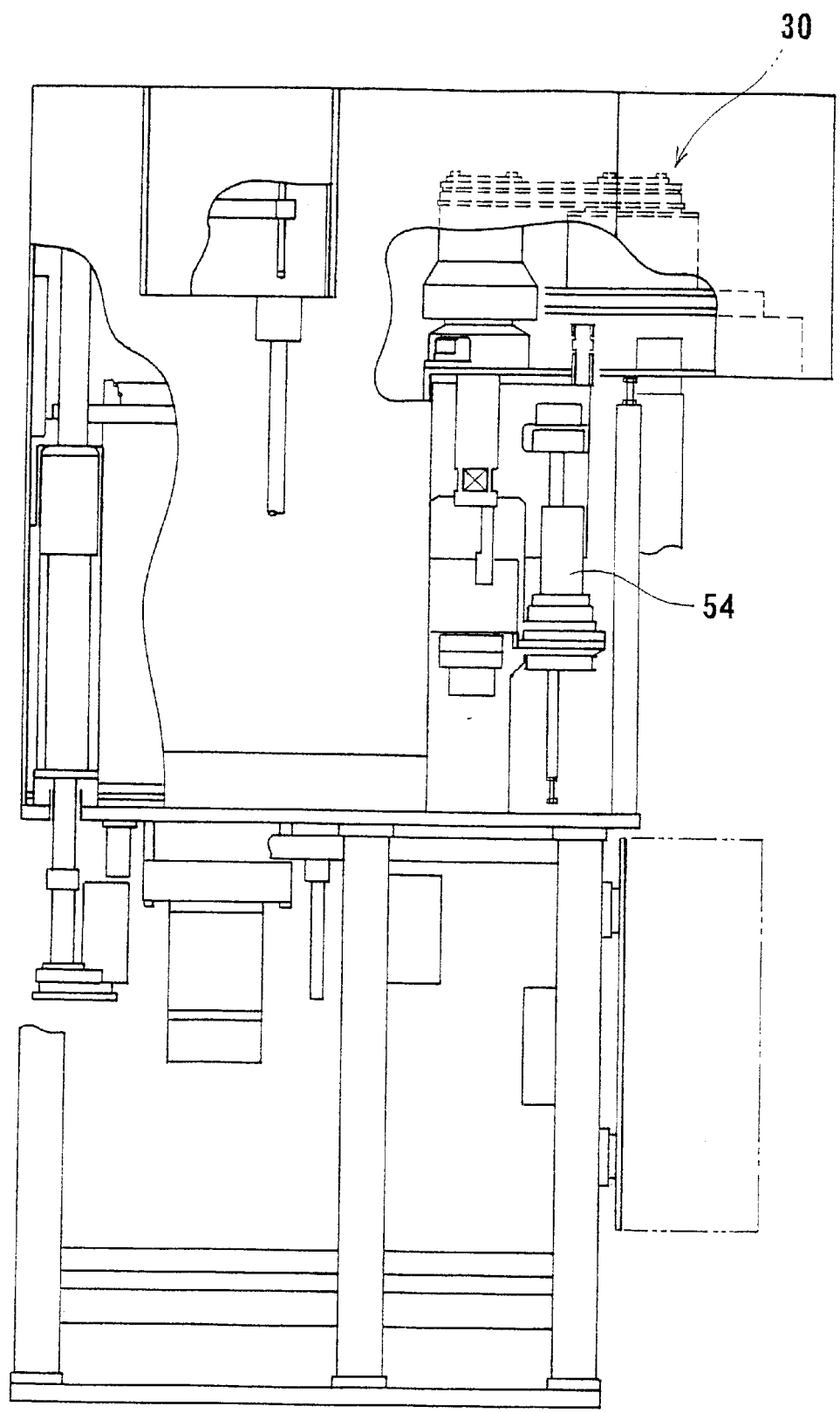
FIG. 8 is a rear view of FIG. 3.
Figure 9:
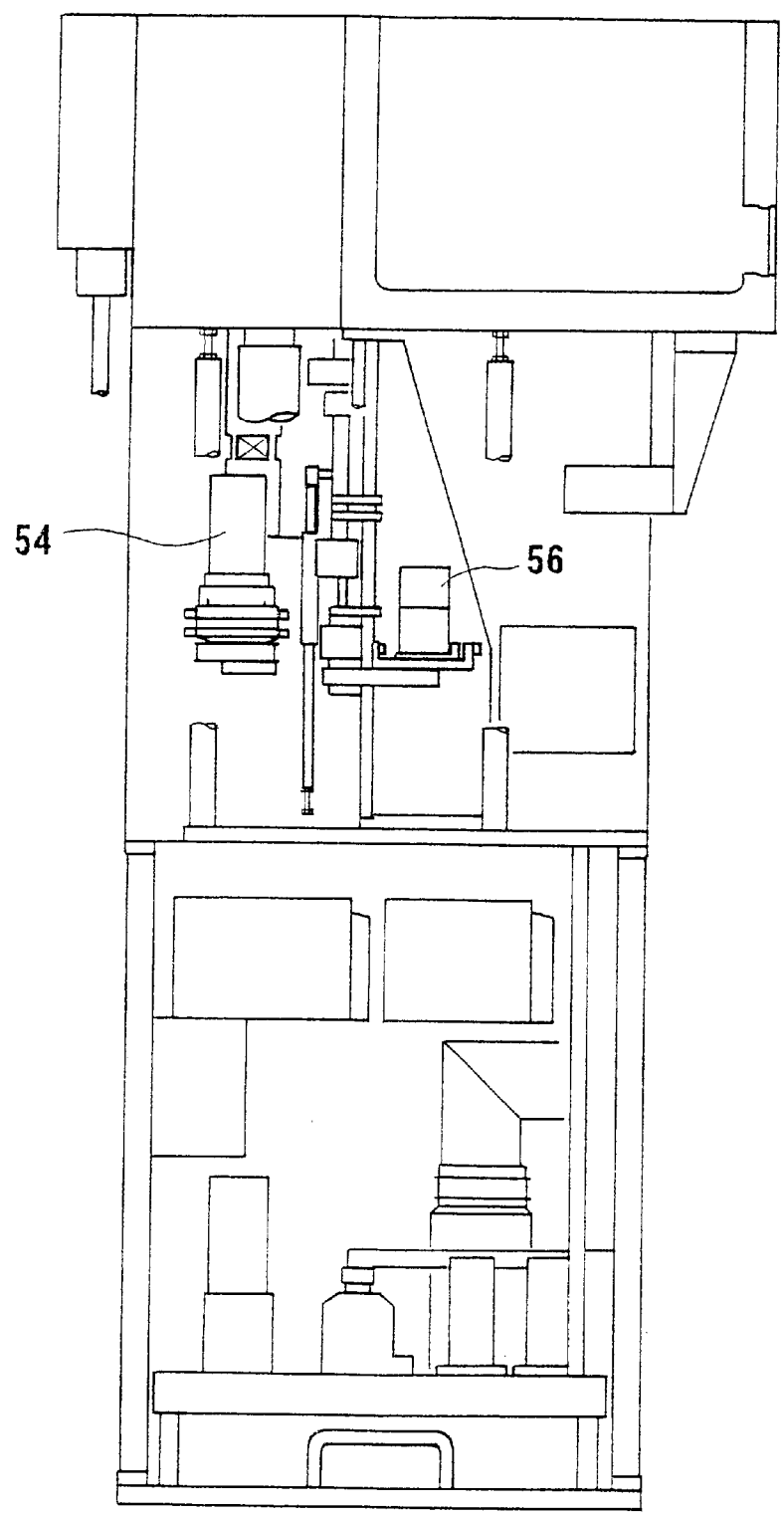
FIG. 9 is a left side view of FIG. 3.

As shown in FIGS. 8 and 9, the electrode arm portion 30 is vertically movable by a motor 54 and a ball screw, not shown, and swingable between the plating liquid tray 22 and the substrate treatment section 20 by a motor 56.

Figure 10:
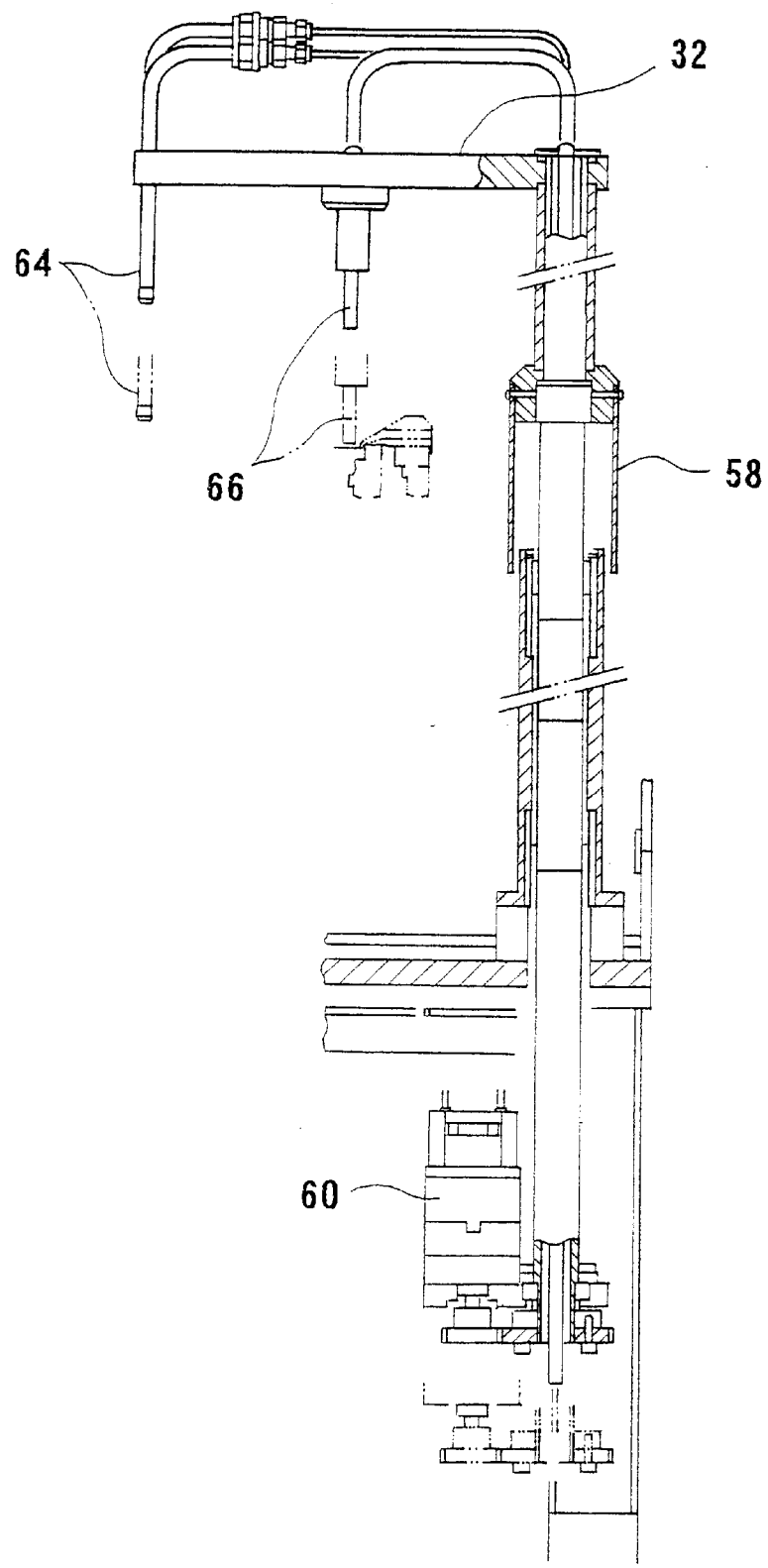
FIG. 10 is a front view showing a precoating/recovering arm.

As shown in FIG. 10, the pre-coating/recovering arm 32 is coupled to an upper end of a vertical support shaft 58. The pre-coating/recovering arm 32 is swingable by a rotary actuator 60 and is also vertically moveable by an air cylinder 62 (see FIG. 7). The pre-coating/recovering arm 32 supports a pre-coating nozzle 64 for discharging a pre-coating liquid, on its free end, and a plating liquid recovering nozzle 66 for recovering the plating liquid, on a portion closer to its proximal end. The pre-coating nozzle 64 is connected to a syringe that is actuatable by an air cylinder, for example, for intermittently discharging a pre-coating liquid from the pre-coating nozzle 64. The plating liquid recovering nozzle 66 is connected to a cylinder pump or an aspirator, for example, to draw the plating liquid on the substrate from the plating liquid recovering nozzle 66.

Figure 11:
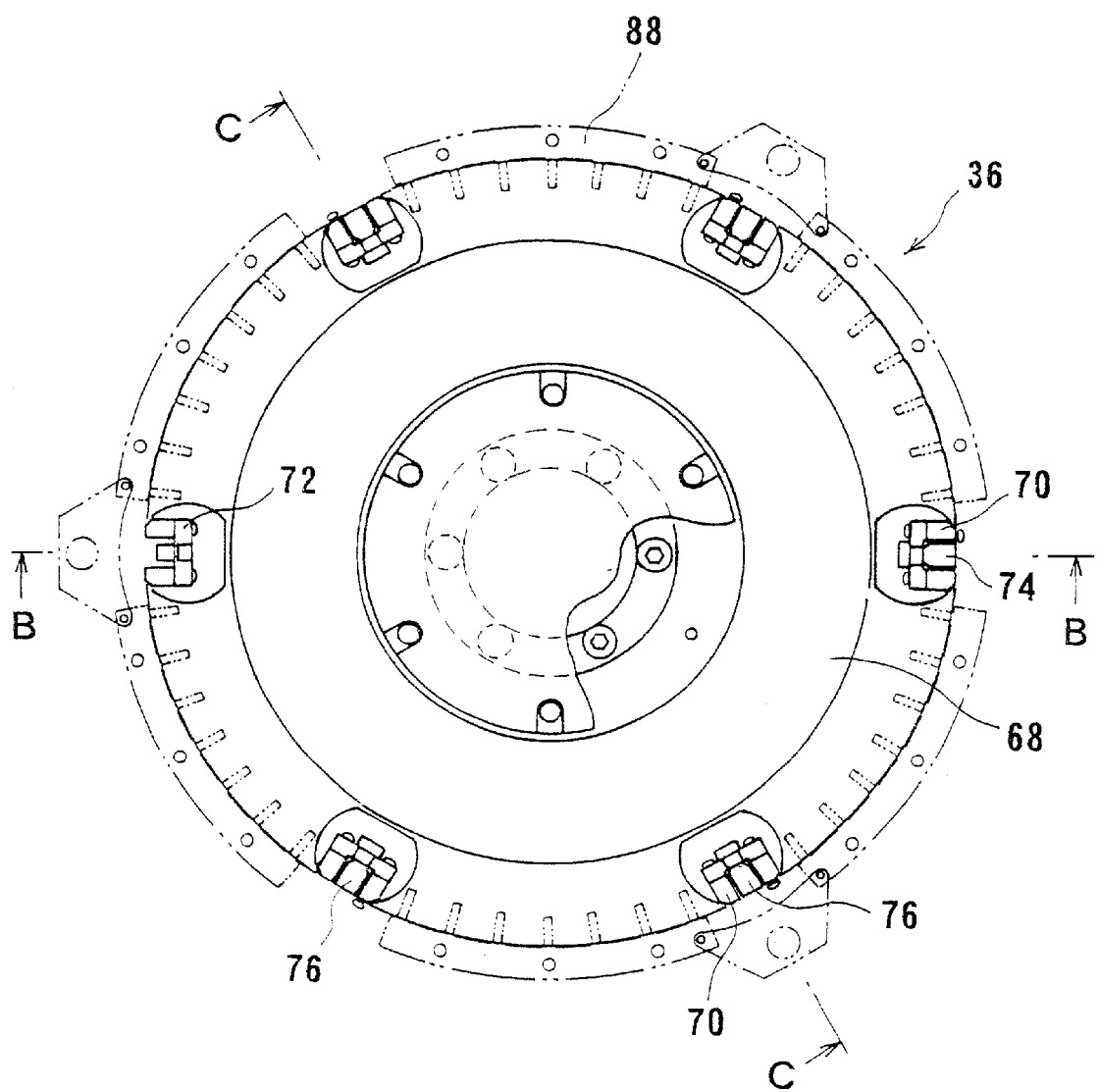
FIG. 11 is a plan view of the substrate holding portion.
Figure 12:
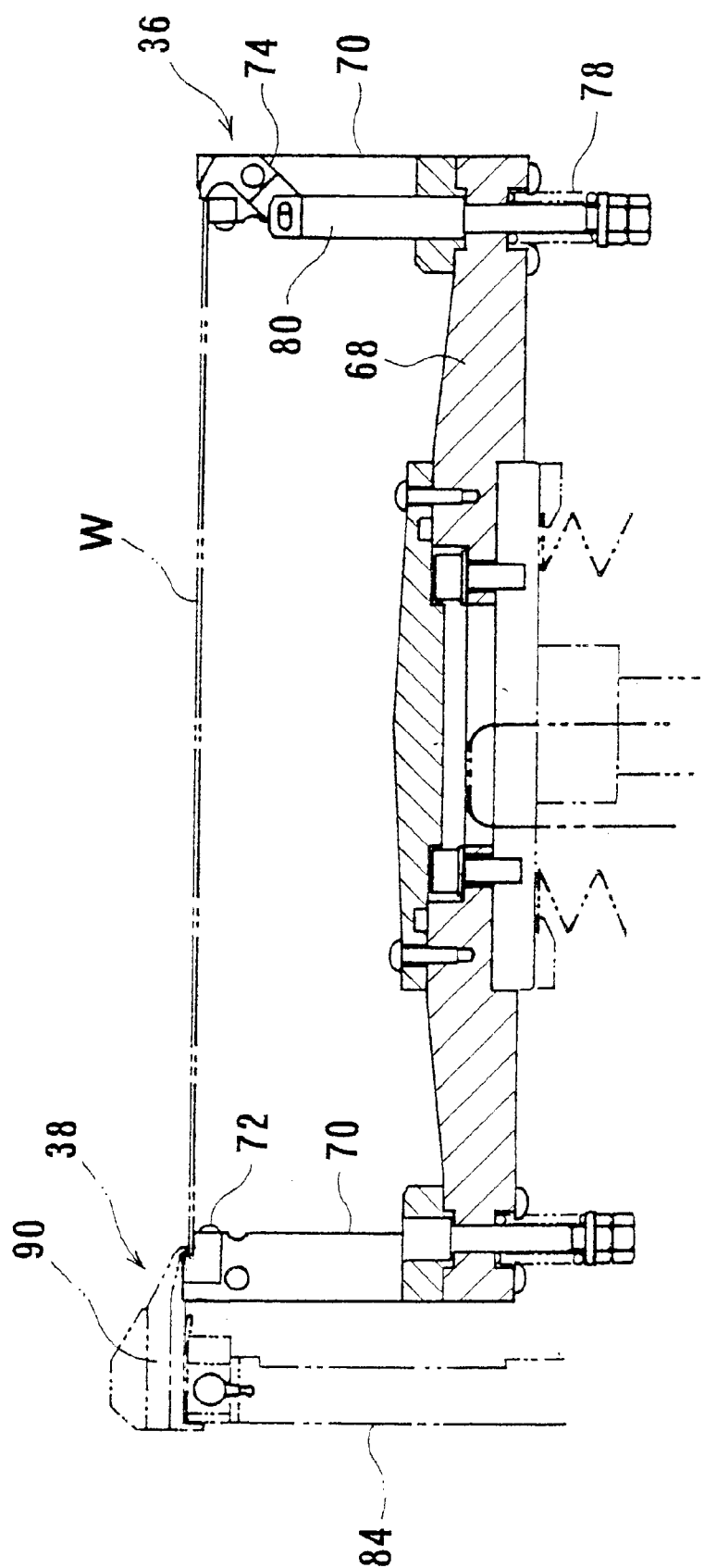
FIG. 12 is a sectional view taken on line B—B of FIG. 11.
Figure 13:
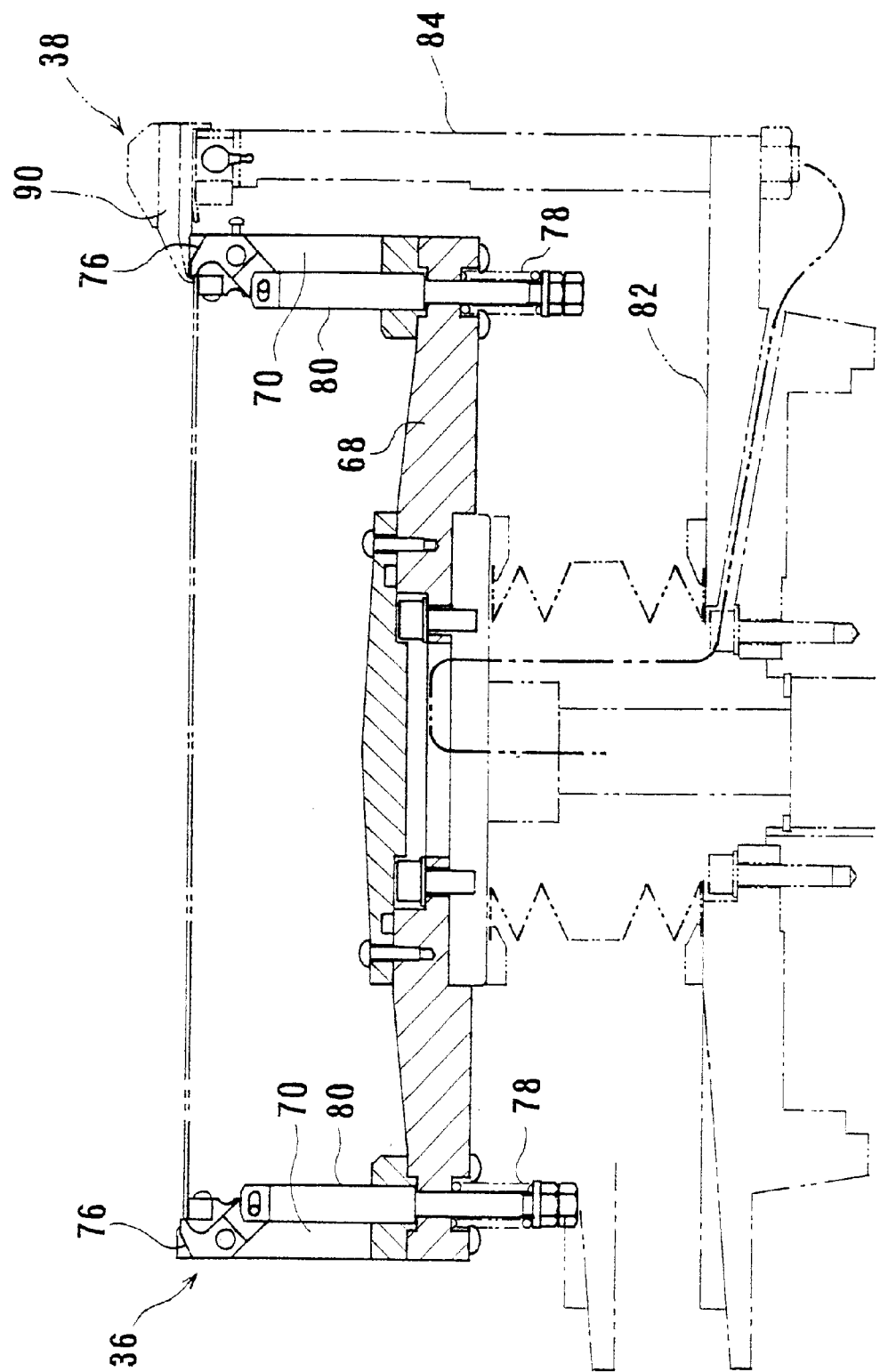
FIG. 13 is a sectional view taken on line C—C of FIG. 11.

As shown in FIGS. 11 through 13, the substrate holding portion 36 has a disk-shaped substrate stage 68 and six vertical support arms 70 disposed at spaced intervals on the circumferential edge of the substrate stage 68 for holding a substrate W in a horizontal plane on respective upper surfaces of the support arms 70. A positioning plate 72 is mounted on an upper end one of the support arms 70 for positioning the substrate by contacting the end face of the substrate. A pressing finger 74 is rotatably mounted on an upper end of the support arm 70 which is positioned opposite to the support arm 70 having the positioning plate 72 for abutting against an end face of the substrate W and pressing the substrate W the positioning plate 72 side when rotated. Chucking fingers 76 are rotatably mounted on upper ends of the remaining four support arms 70 for pressing the substrate W downwardly and gripping the circumferential edge of the substrate W.

The pressing finger 74 and the chucking fingers 76 have respective lower ends coupled to upper ends of pressing pins 80 that are normally urged to move downwardly by coil springs 78. When the pressing pins 80 are moved downwardly, the pressing finger 74 and the chucking fingers 76 are rotated radially inwardly into a closed position. A support plate 82 is disposed below the substrate stage 68 for engaging lower ends of the opening pins 80 and pushing them upwardly.

When the substrate holding portion 36 is located in the substrate transfer position A shown in FIG. 5, the pressing pins 80 are engaged and pushed upwardly by the support plate 82, so that the pressing finger 74 and the chucking fingers 76 rotate outwardly and open. When the substrate stage 68 is elevated, the opening pins 80 are lowered under the resiliency of the coil springs 78, so that the pressing finger 74 and the chucking fingers 76 rotate inwardly and close.

Figure 14:
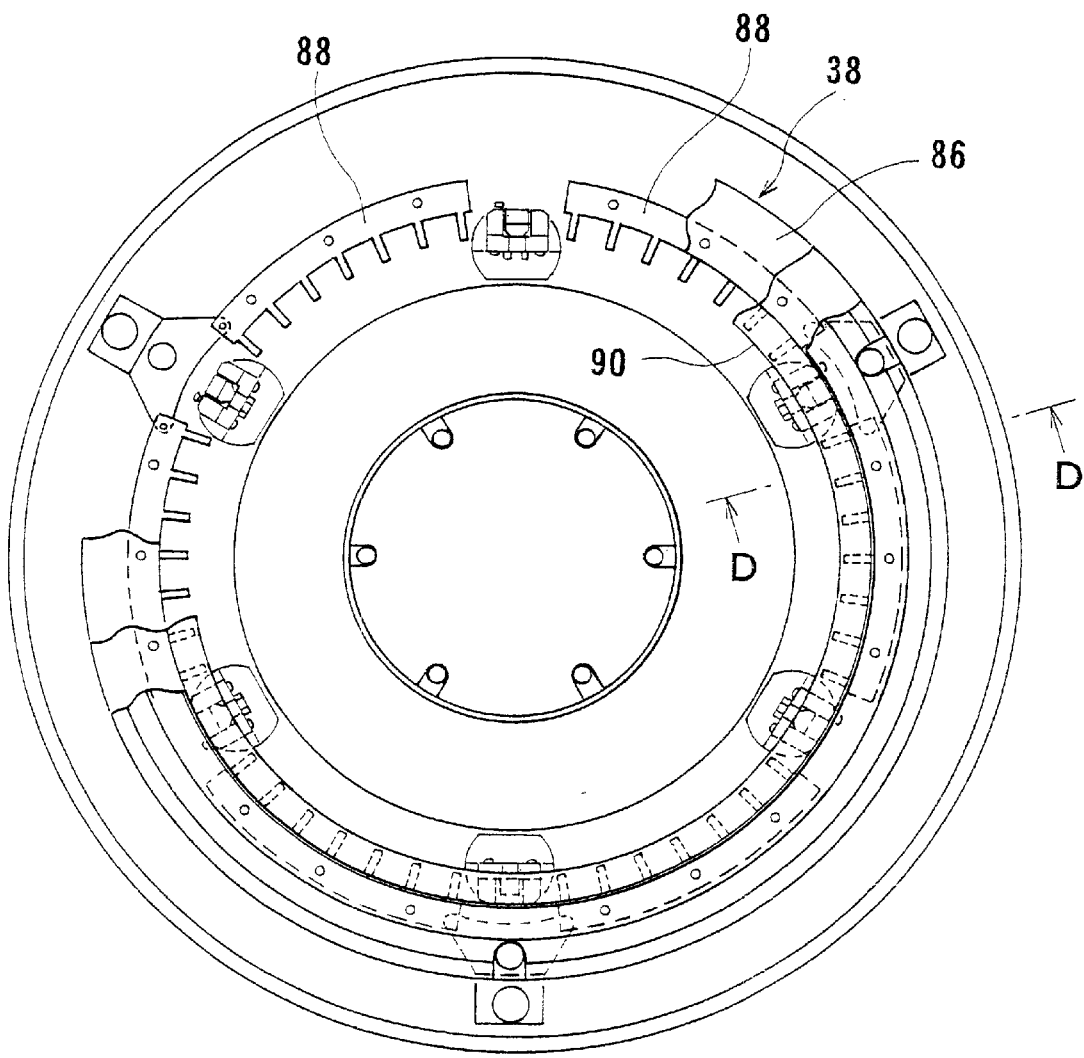
FIG. 14 is a plan view of the cathode portion.
Figure 15:
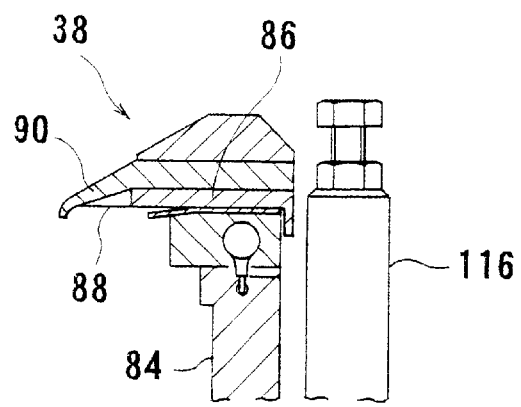
FIG. 15 is a sectional view taken on line D—D of FIG. 14.
Figure 16:
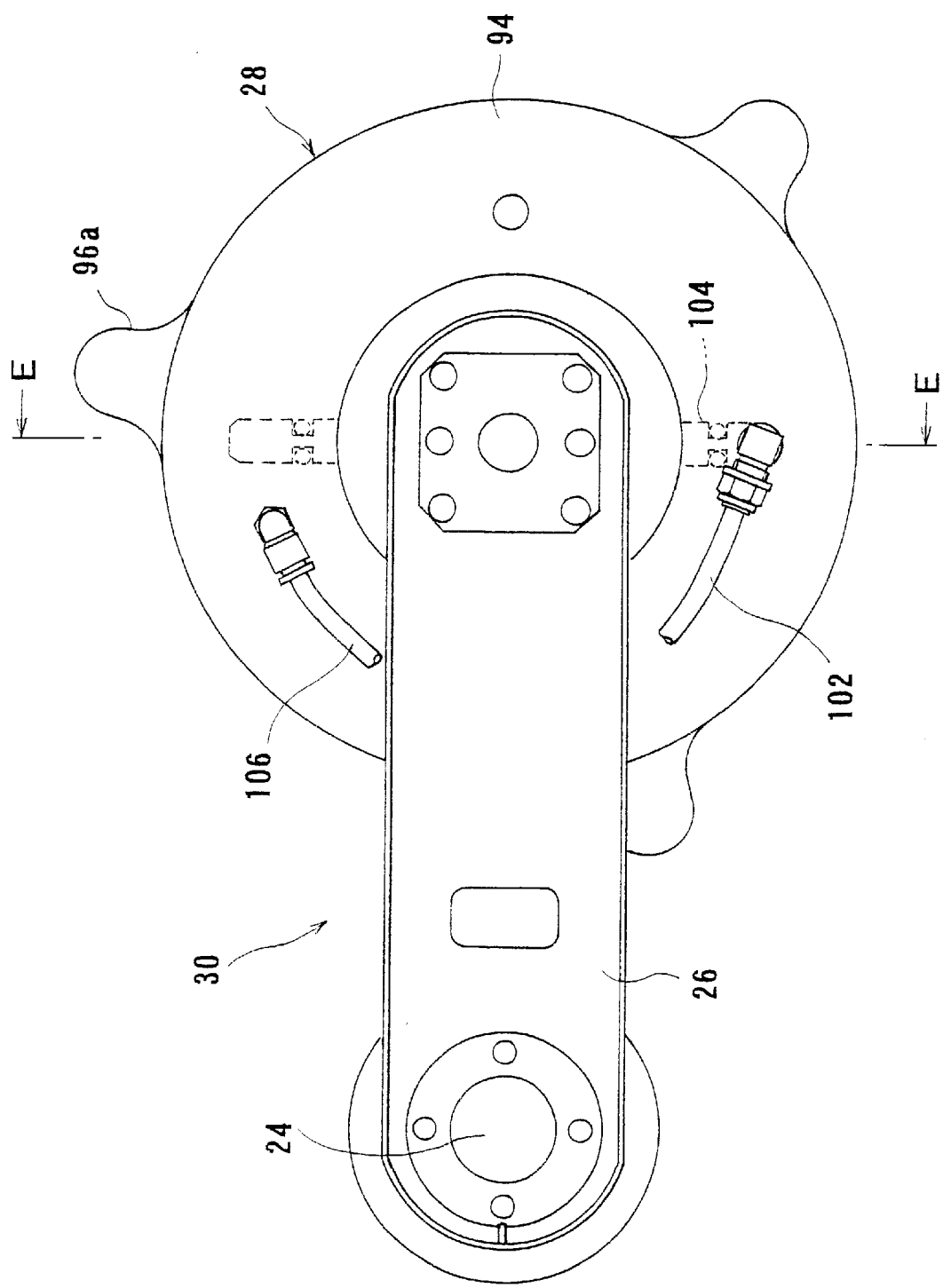
FIG. 16 is a plan view of an electrode arm.

As shown in FIGS. 14 and 15, the cathode portion 38 comprises an annular frame 86 fixed to upper ends of vertical support columns 84 mounted on the peripheral edge of the support plate 82 (see FIGS. 5 and 13), a plurality of, six in this embodiment, cathode electrodes 88 attached to a lower surface of the annular frame 86 and projecting inwardly, and an annular sealing member 90 mounted on an upper surface of the annular frame 86 in covering relation to upper surfaces of the cathode electrodes 88. The sealing member 90 is adapted to have an inner peripheral edge portion inclined inwardly downwardly and progressively thin-walled, and to have an inner peripheral end suspending downwardly.

When the substrate holding portion 36 has ascended to the plating position B, as shown FIG. 5, the cathode electrodes 88 are pressed against the peripheral edge portion of the substrate W held by the substrate holding portion 36 for thereby allowing electric current to pass through the substrate W. At the same time, an inner peripheral end portion of the seal member 90 is brought into contact with an upper surface of the peripheral edge of the substrate W under pressure to seal its contact portion in a watertight manner. As a result, the plating liquid supplied onto the upper surface (surface to be plated) of the substrate W is prevented from seeping from the end portion of the substrate W, and the plating liquid is prevented from contaminating the cathode electrodes 88.

In the present embodiment, the cathode portion 38 is vertically immovable, but rotatable in a body with the substrate holding portion 36. However, the cathode portion 38 may be arranged such that it is vertically movable and the sealing member 90 is pressed against the surface, to be plated, of the substrate W when the cathode portion 38 is lowered.

As shown in FIGS. 16 through 20, the electrode head 28 of the electrode arm portion 30 comprises a housing 94 coupled to a free end of the swing arm 26 through a ball bearing 92, a cylindrical support frame 96 surrounding the housing 94, and an anode 98 fixed by having a peripheral edge portion gripped between the housing 94 and the support frame 96. The anode 98 covers an opening of the housing 94, which has a suction chamber 100 defined therein. In the suction chamber 100, there is disposed a diametrically extending plating liquid introduction pipe 104 connected to a plating liquid supply pipe 102 which extends from the plating liquid supply unit 18 (see FIG. 2), and held in abutment against an upper surface of the anode 98. A plating liquid discharge pipe 106 communicating with the suction chamber 100 is connected to the housing 94.

The plating liquid introduction pipe 104 is effective to supply the plating liquid uniformly to the surface to be plated if the plating liquid introduction pipe 104 is of a manifold structure. Specifically, the plating liquid introduction pipe 104 has a plating liquid introduction passage 104*a* extending continuously in its longitudinal direction, and a plurality of plating liquid introduction ports 104*b* spaced at a given pitch along the plating liquid introduction passage 104*a* and extending downwardly therefrom in communication therewith. The anode 98 has a plurality of plating liquid supply ports 98*a* defined therein at positions corresponding to the plating liquid introduction ports 104*b*. The anode 98 also has a number of vertically extending through holes 98*b* defined therein over its entire region. The plating liquid that is introduced from the plating liquid supply pipe 102 into the plating liquid introduction pipe 104 flows through the plating liquid introduction ports 104*b* and the plating liquid supply ports 98*a* to a position below the anode 98. With the anode 98 being immersed in the plating liquid, the plating liquid discharge pipe 106 is evacuated to discharge the plating liquid below the anode 98 via the through holes 98*b* and the suction chamber 100 from the plating liquid discharge pipe 106.

In order to suppress the generation of slime, the anode 98 is made of copper containing 0.03 to 0.05% of phosphorus (phosphorus copper). When the anode 98 is made of phosphorus copper, a black film is formed on the surface of the anode 98 as the plating process progresses. The black film is made of a $Cu^+$ complex containing phosphorus and Cl, and comprises $Cu_2Cl_2 \cdot Cu_2O \cdot Cu_3P$, etc. Since the black film suppresses a copper disproportionation reaction, it is important to stably form the black film on the surface of the anode 98 for the purpose of stabilizing the plating process. However, if the black film is dried and oxidized, and peeled off the anode 98, then it tends to produce particles.

In this embodiment, a plating liquid impregnated material 110 comprising a water retaining material and covering the entire surface of the anode 98 is attached to the lower surface of the anode 98. The plating liquid impregnated material 110 is impregnated with the plating liquid to wet the surface of the anode 98, thereby preventing a black film from falling onto the plated surface of the substrate by drying, and oxidizing, and simultaneously facilitating escape of air to the outside when the plating liquid is poured between the surface, to be plated, of the substrate and the anode 98.

The plating liquid impregnated material 110 has both functions of retaining liquid and passing liquid therethrough, and has excellent chemical resistance. Specially, the plating liquid impregnated material 110 has endurance against an acid plating liquid including sulfuric acid having high concentration. The plating liquid impregnated material 110 comprises, for example, a woven fabric of polypropylene to prevent elution of the impurity in the sulfuric acid solution from having a bad influence to the plating efficiency (plating speed, resistivity and filling characteristics). The plating liquid impregnated material 110 may comprises at least one material of polyethylene, polyester, polyvinyl chloride, Teflon, polyvinyl alcohol, polyurethane, and derivatives of these materials, other than polypropylene. Nonwoven fabric or sponge-like structure may be used in place of woven fabric. Porous ceramics and sintered polypropylene made of Alumina and SiC and the like are available.

That is, many fixing pins 112 each having a head portion at the lower end are arranged such that the head portion is provided in the plating liquid impregnated material 110 so as not to be releasable upward and a shaft portion of the fixing pin pierces the interior of the anode 98, and the fixing pins 112 are urged upward by U-shaped plate springs 114, whereby the plating liquid impregnated material 110 is brought in close contact with the lower surface of the anode 98 by the resilient force of the plate springs 114 and is attached to the anode 98. With this arrangement, even when the thickness of the anode 98 gradually decreases with the progress of plating, the plating liquid impregnated material 110 can be reliably brought in close contact with the lower surface of the anode 98. Thus, it can be prevented that air enters between the lower surface of the anode 98 and the plating liquid impregnated material 110 to cause poor plating.

Incidentally, columnar pins made of PVC (polyvinyl chloride) or PET and having a diameter of, for example, about 2 mm may be arranged from the upper surface side of the anode so as to pierce the anode, and an adhesive may be applied to the front end surface of each of the pins projecting from the lower surface of the anode to fix the anode to the plating liquid impregnated material.

When the impregnated material has a sufficient strength such as a porous ceramic, the anode may be placed on the impregnated material without using pins for fixing the impregnated material.

When the substrate holding portion 36 is in the plating position B (see FIG. 5), the electrode head 28 is lowered until the gap between the substrate W held by the substrate holding portion 36 and the plating liquid impregnated material 110 becomes about 0.5 to 3 mm, for example. Then, the plating liquid is supplied from the plating liquid supply pipe 102 to fill the gap between the upper surface, to be plated, of the substrate W and the anode 98 while impregnating the plating liquid impregnated material 110 with the plating liquid, thus plating the upper surface of the substrate W.

Figure 21:
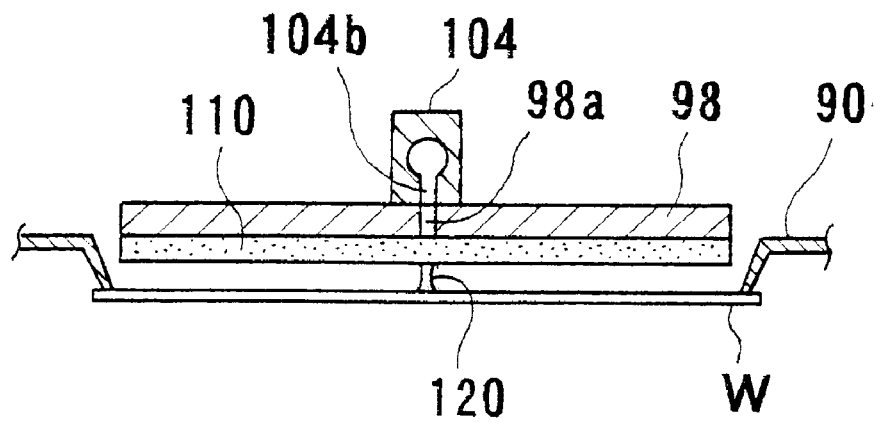
FIG. 21 is a sectional view schematically showing an initial stage of pouring a plating liquid between a surface, to be plated, of a substrate and an anode.
Figure 22:
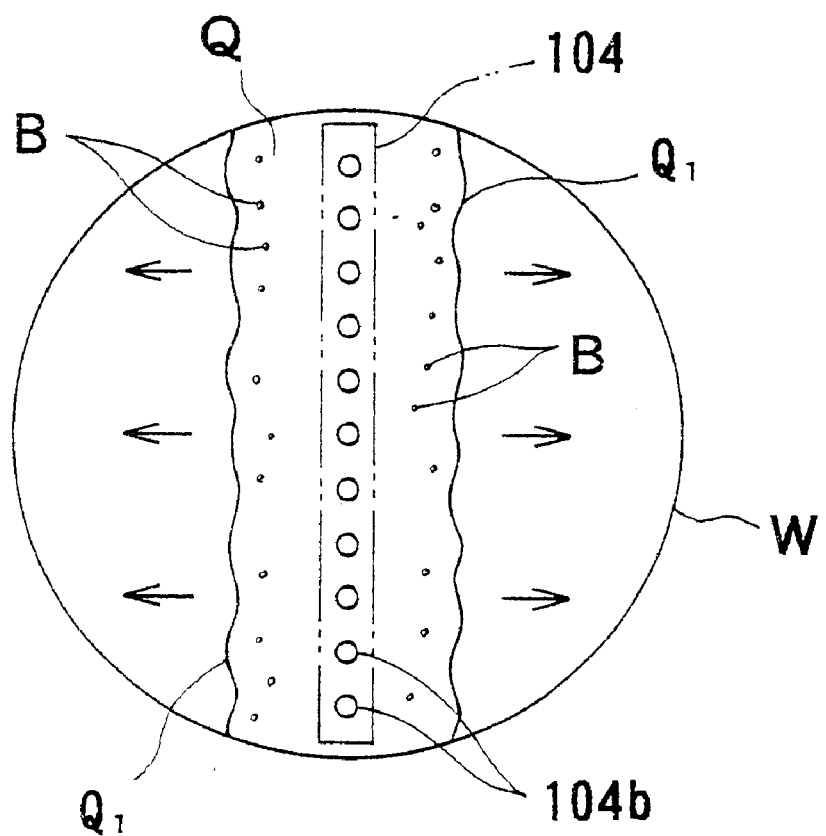
FIG. 22 is a plan view schematically showing a state in which the plating liquid is spreading over all of the surface of the substrate to be plated.

At this time, shown in FIG. 21, at positions approximately corresponding to the plating liquid supply ports 98*a* of the anode 98, the plating liquid reaches the upper surface (surface to be plated) of the substrate W from the lower surface of the plating liquid impregnated material 110, thereby forming plating liquid columns 120 which bridge the plating liquid impregnated material 110 and the surface, to be plated, of the substrate W. By continuing the supply of the plating liquid, the plating liquid columns 120 are gradually grown, or connected to each other. Then a flow of the plating liquid Q, which advances in a direction perpendicular to the plating liquid introduction pipe 104 and spreads over the entire surface of the surface, to be plated, of the substrate W, occurs as shown in FIG. 22.

As a result, air bubbles B entrained by this flow of the plating liquid Q are pushed outward, and a front line $Q_1$ of the flow of the plating liquid Q is a nearly straight line, so that the plating liquid Q does not enclose air. Thus, the air bubbles are prevented from remaining in the plating liquid filled between the plating liquid impregnated material 110 and the surface, to be plated, of the substrate W.

As shown in FIG. 4, stopper bars 116 are erected outwardly of the support columns 84 supporting the cathode portion 38. Protrusions 96*a* provided on the periphery of the support frame 96 are brought into contact with the upper surfaces of the stopper bars 116, whereby the descent of the electrode portion 28 is controlled.

A plating process carried out by the substrate plating apparatus according to the above embodiment will be described below.

First, a substrate W to be plated is taken out from one of the loading/unloading units 10 by the transfer robot 14, and transferred, with the surface to be plated being oriented upwardly, through the substrate carry-in and carry-out opening 50 defined in the side panel, into one of the plating units 12. At this time, the substrate holding portion 36 is in the lower substrate transfer position A. After the hand of the transfer robot 14 has reached a position directly above the substrate stage 68, the hand of the transfer robot 14 is lowered to place the substrate W on the support arm 70. The hand of the transfer robot 14 is then retracted through the substrate carry-in and carry-out opening 50.

After the hand of the transfer robot 14 is retracted, the cup 40 is elevated. Then, the substrate holding portion 36 is lifted from the substrate transfer position A to the pretreating/cleaning position C. As the substrate holding portion 36 ascends, the substrate W placed on the support arms 70 is positioned by the positioning plate 72 and the pressing finger 74 and then reliably gripped by the fixing fingers 76.

On the other hand, the electrode head 28 of the electrode arm portion 30 is in a normal position over the plating liquid tray 22 now, and the plating liquid impregnated material 110 or the anode 98 is positioned in the plating liquid tray 22. At the same time that the cup 40 ascends, the plating liquid starts being supplied to the plating liquid tray 22 and the electrode head 28. Until the step of plating the substrate W is initiated, the new plating liquid is supplied, and the plating liquid discharge pipe 106 is evacuated to replace the plating liquid in the plating liquid impregnated material 110 and remove air bubbles from the plating liquid in the plating liquid impregnated material 110. When the ascending movement of the cup 40 is completed, the substrate carry-in and carry-out opening 50 in the side panel is closed by the cup 40, isolating the atmosphere in the side panel and the atmosphere outside of the side panel from each other.

When the cup 40 is elevated, the pre-coating step is initiated. Specifically, the substrate holding portion 36 that has received the substrate W is rotated, and the precoating/recovering arm 32 is moved from the retracted position to a position confronting the substrate W. When the rotational speed of the substrate holding portion 36 reaches a preset value, the pre-coating nozzle 64 mounted on the tip end of the pre-coating/recovering arm 32 intermittently discharges a pre-coating liquid which comprises a surface active agent, for example, toward the surface to be plated of the substrate W. At this time, since the substrate holding portion 36 is rotating, the pre-coating liquid spreads all over the surface to be plated of the substrate W. Then, the precoating/recovering arm 32 is returned to the retracted position, and the rotational speed of the substrate holding portion 36 is increased to spin the pre-coating liquid off and dry the surface to be plated of the substrate W.

After the completion of the pre-coating step, the plating step is initiated. First, the substrate holding portion 36 is stopped against rotation, or the rotational speed thereof is reduced to a preset rotational speed for plating. In this state, the substrate holding portion 36 is lifted to the plating position B. Then, the peripheral edge of the substrate W is brought into contact with the cathode electrodes 88, when it is possible to pass an electric current, and at the same time, the sealing member 90 is pressed against the upper surface of the peripheral edge of the substrate W, thus sealing the peripheral edge of the substrate W in a water-tight fashion.

Based on a signal indicating that the pre-coating step for the loaded substrate W is completed, the electrode arm portion 30 is swung in a horizontal direction to displace the electrode head 28 from a position over the plating liquid tray 22 to a position over the plating position. After the electrode head 28 reaches this position, the electrode head 28 is lowered toward the cathode portion 38. At this time, the plating liquid impregnated material 110 does not contact with the surface to be plated of the substrate W, but is held closely to the surface to be plated of the substrate W at a distance ranging from 0.5 mm to 3 mm. When the descent of the electrode head 28 is completed, a plating current is supplied, and the plating liquid is supplied from the plating liquid supply pipe 102 into the electrode head 28, and then from the plating liquid supply ports 98a through the anode 98 to the plating liquid impregnated material 110.

As a result, plating liquid columns 120 which bridge the plating liquid impregnated material 110 and the surface, to be plated, of the substrate W are formed at positions approximately corresponding to the plating liquid supply ports 98a of the anode 98. By continuing the supply of the plating liquid, the plating liquid columns 120 are gradually grown, and tied to each other. The resulting flow advances in a direction perpendicular to the plating liquid introduction pipe 104 and spreads over the entire surface, to be plated, of the substrate W. Thus, air bubbles on board this flow of the plating liquid are pushed outward, and the plating liquid does not enclose air. Hence, the air bubbles are prevented from remaining in the plating liquid residing between the plating liquid impregnated material 110 and the surface, to be plated, of the substrate W. Consequently, the plating liquid containing copper ions, which has seeped from the plating liquid impregnated material 110, is filled into a gap between the plating liquid impregnated material 110 and the surface, to be plated, of the substrate W without leaving air bubbles. By this measure, copper plating is performed on the surface, to be plated, of the substrate. At this time, the substrate holding portion 36 may be rotated at a low speed.

While the plating liquid is being poured, it is preferred to apply a constant voltage between the substrate W and the anode 98. By so doing, an electric current of a constant density can be flowed through the plating liquid contact portion, and when an appropriate voltage is selected, the copper seed layer of the substrate W can be protected from etching.

Further, the plating liquid may be supplied from the plating liquid supply ports 98a to the plating liquid impregnated material 110 during plating treatment to pour the plating liquid between the plating liquid impregnated material 110 and the surface, to be plated, of the substrate W. Simultaneously, the plating liquid may be sucked and discharged through the plating liquid discharge pipe 106. As a result, the plating liquid filled between the substrate W and the anode 98 may be circulated and stirred during the plating treatment, whereby air bubbles in the plating liquid can be extracted. The pouring/suction of the plating liquid may be performed throughout the plating time, rather than at the initial stage of plating only.

When the supply of the plating liquid continues, the plating liquid containing copper ions, which has seeped out of the plating liquid impregnated material 110, is filled into the gap between the plating liquid impregnated material 110 and the surface, to be plated, of the semiconductor substrate W so that copper plating is performed on the surface, to be plated, of the substrate. At this time, the substrate holding portion 36 may be rotated at a low speed.

When the plating treatment is completed, the electrode arm portion 30 is raised and then swung to return to the position above the plating liquid tray 22 and to lower to the ordinary position. Then, the pre-coating/recovering arm 32 is moved from the retreat position to the position confronting to the semiconductor substrate W, and lowered to recover the remainder of the plating liquid on the substrate W by a plating liquid recovering nozzle 66. After recovery of the remainder of the plating liquid is completed, the pre-coating/recovering arm 32 is returned to the retreat position, and pure water is supplied from the fix nozzle 34 for supplying pure water toward the central portion of the substrate W for rinsing the plated surface of the substrate. At the same time, the substrate holding portion 36 is rotated at an increased speed to replace the plating liquid on the surface of the substrate W with pure water. Rinsing the substrate W in this manner prevents the splashing plating liquid from contaminating the cathode electrode 88 of the cathode portion 38 during descent of the substrate holding portion 36 from the plating position B.

After completion of the rinsing, the washing with water step is initiated. That is, the substrate holding portion 36 is lowered from the plating position B to the treatment/cleaning position C. Then, while pure water is supplied from the fixed nozzle 34 for supplying pure water, the substrate holding portion 36 and the cathode portion 38 are rotated to perform washing with water. At this time, the seal member 90 and the cathode electrodes 88 can also be cleaned, simultaneously with the substrate W, by means of pure water directly supplied to the cathode 38, or pure water scattered from the surface of the substrate W.

After washing with water is completed, the drying step is initiated. That is, supply of pure water from the fixed nozzle 34 is stopped, and the rotational speed of the substrate holding portion 36 and the cathode portion 38 is further increased to remove pure water on the surface of the substrate W by centrifugal force and to dry the surface of the substrate W. The seal member 90 and the cathode electrodes 88 are also dried at the same time. Upon completion of the drying, the rotation of the substrate holding portion 36 and the cathode portion 38 is stopped, and the substrate holding portion 36 is lowered to the substrate transfer position A. Thus, the gripping of the substrate W by the fixing fingers 76 is released, and the substrate W is just placed on the upper surfaces of the support arms 70. At the same time, the cup 40 is also lowered.

All the steps including the plating step, the pretreating step accompanying to the plating step, the cleaning step, and the drying step are now finished. The transfer robot 14 inserts its hand through the substrate carry-in and carry-out opening 50 into the position beneath the substrate W, and raises the hand to receive the processed substrate W from the substrate holding portion 36. Then, the transfer robot 14 returns the processed substrate W received from the substrate holding portion 36 to one of the loading/unloading units 10.

By the way, when plating treatment is performed, with the plating liquid impregnated material being attached to the lower surface of the anode as in this embodiment, air bubbles may enter inside the pores formed in the plating liquid impregnated material 110. Such air bubbles act as insulators, becoming the cause of disturbing the electric current distribution during plating treatment. To overcome this trouble, it is effective to suck the plating liquid discharge pipe 106 prior to plating treatment, thereby decompressing the space where the plating liquid impregnated material 110 is placed, and then to introduce the plating liquid from the plating liquid introduction pipe 104 into the plating liquid impregnated material 110. By this way, outward escape of the air bubbles entering the interior of the pores of the plating liquid impregnated material 110 can be promoted. The resulting uniform current distribution enables high quality plating to be achieved. This treatment, if performed at the start-up of the plating apparatus, is effective, because that can remove air bubbles that have entered the pores of the plating liquid impregnated material 110 from the first.

In this embodiment, while the substrate W is being held, with its surface upward, by the substrate holding portion, the plating step and other steps including the pretreatment and cleaning/drying steps associated with the plating step can be carried out before and after the plating step. Therefore, all the steps of the plating process can be carried out by the single plating apparatus, which can provide the plating apparatus which is simplified and takes up a small installation area cheaply. Since the plating apparatus can be installed as a plating unit on another semiconductor fabrication apparatus, it provides advantages in clustering a series of interconnects forming steps including plating, annealing, and CMP.

Figure 23A:
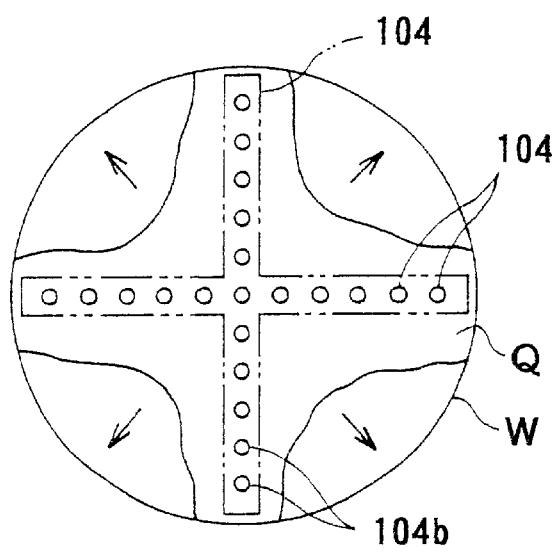
FIGS. 23A and 23B are views, corresponding to FIG. 22, showing a second embodiment of the present invention.

Here, as shown in FIG. 23A, the plating liquid introduction pipe 104 which has blade portions extending cruciformly in directions perpendicular to each other and which has plating liquid introduction ports 104b at predetermined positions along the longitudinal direction of each blade portion may be used, and the anode (not shown) which has plating liquid supply ports 98a at positions corresponding to the plating liquid introduction ports 104b may be used. In this case, in the same manner as described above, plating liquid columns which bridge the plating liquid impregnated material and the surface, to be plated, of the substrate W are formed at positions approximately corresponding to the plating liquid supply ports 98a of the anode. As the supply of the plating liquid continues, the plating liquid columns gradually grow. Then, a flow of the plating liquid Q, which spreads radially in quadrants defined by the plating liquid introduction pipe 104, is generated and the plating liquid Q spreads over the entire surface of the surface, to be plated, of the substrate W.

Figure 23B:
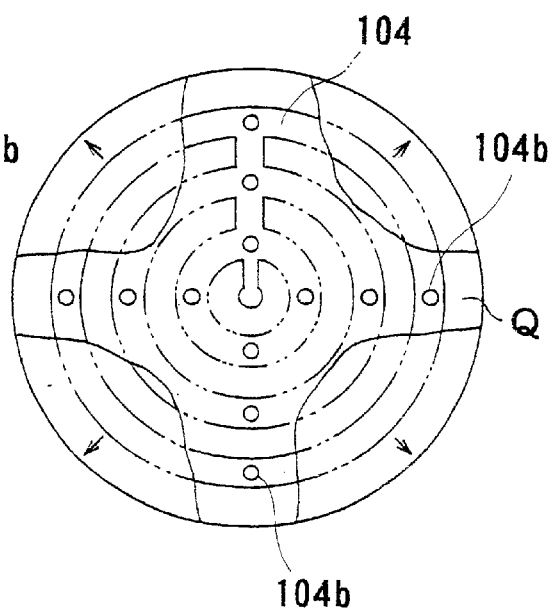

As shown in FIG. 23B, a similar flow of the plating liquid Q is generated, when the plating liquid introduction pipes 104 are placed in a concentric manner and communicated with each other, and plating liquid introduction ports 104b are provided at predetermined positions. The plating liquid introduction ports 104b of the plating liquid introduction pipe 104 may be provided at equal pitch and with equal diameter, but discharge of the liquid may be controlled by adjusting the pitch of the ports and the diameter of the ports.

Figure 24:
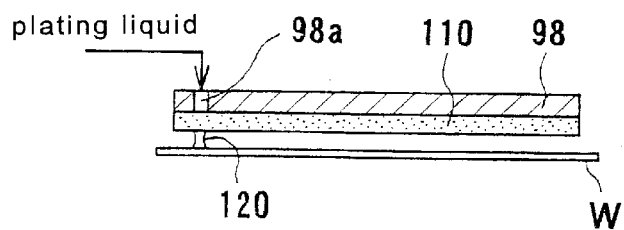
FIG. 24 is a view, corresponding to FIG. 21, showing a third embodiment of the present invention.
Figure 25:
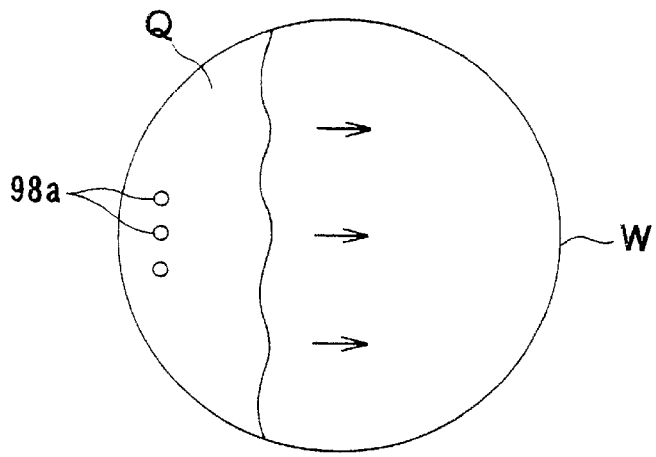
FIG. 25 is a view, corresponding to FIG. 22, showing the third embodiment of the present invention.

In addition, as shown in FIGS. 24 and 25, one or a plurality of plating liquid supply ports 98a may be provided concentrically at an end portion of the anode 98, and the plating liquid may be introduced simultaneously into the respective plating liquid supply ports 98a. In this case, in the same manner as described above, plating liquid columns 120 which bridge the plating liquid impregnated material 110 and the surface, to be plated, of the substrate W are formed at positions approximately corresponding to the plating liquid supply ports 98a of the anode 98. As the supply of the plating liquid continues, the plating liquid columns gradually grow. Then, a flow of the plating liquid Q, which flows in one direction toward the opposite side, occurs, and the plating liquid Q spreads over the entire surface, to be plated, of the substrate W.

Figure 26:
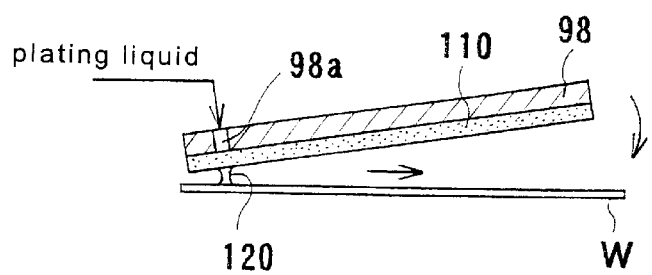
FIG. 26 is a view, corresponding to FIG. 21, showing a fourth embodiment of the present invention.
Figure 27:
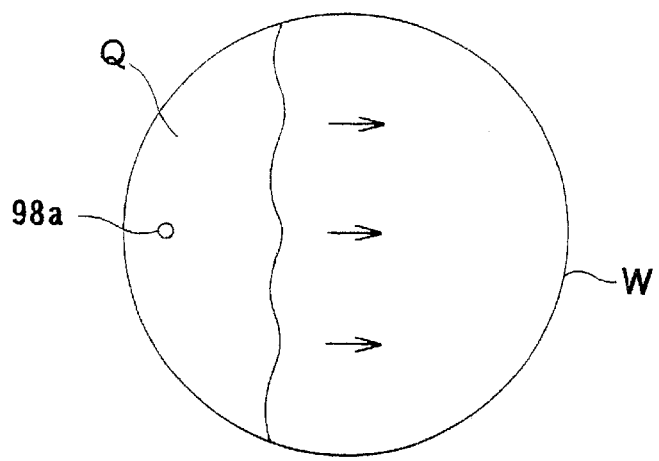
FIG. 27 is a view, corresponding to FIG. 22, showing the fourth embodiment of the present invention.

Besides, as shown in FIGS. 26 and 27, the anode 98 may be placed in an inclined state relative to the substrate W, with the substrate W being held horizontally. A plating liquid supply port 98a is provided at a position in the anode 98 close to the substrate W. The plating liquid is introduced into the plating liquid supply port 98a, and the anode 98 is gradually lowered toward the substrate W so as to be horizontal to the substrate W, simultaneously. In this case, in the same manner as described above, a plating liquid column 120 which bridges the plating liquid impregnated material 110 and the surface, to be plated, of the substrate W is formed at a position corresponding to the plating liquid supply port 98a of the anode 98. As the inclination angle between the anode 98 and the substrate W gradually decreases, a flow of the plating liquid Q, which spreads in one direction between the anode 98 and the surface, to be plated, of the substrate W, occurs, and the plating liquid Q spreads over the entire surface, to be plated, of the substrate W.

Alternatively, contrary to the above, the anode side may be placed horizontally, while the substrate may be inclined relative to the anode side, and simultaneously with pouring of the plating liquid, the substrate may be gradually raised so as to be horizontal to the anode side.

Figure 28:
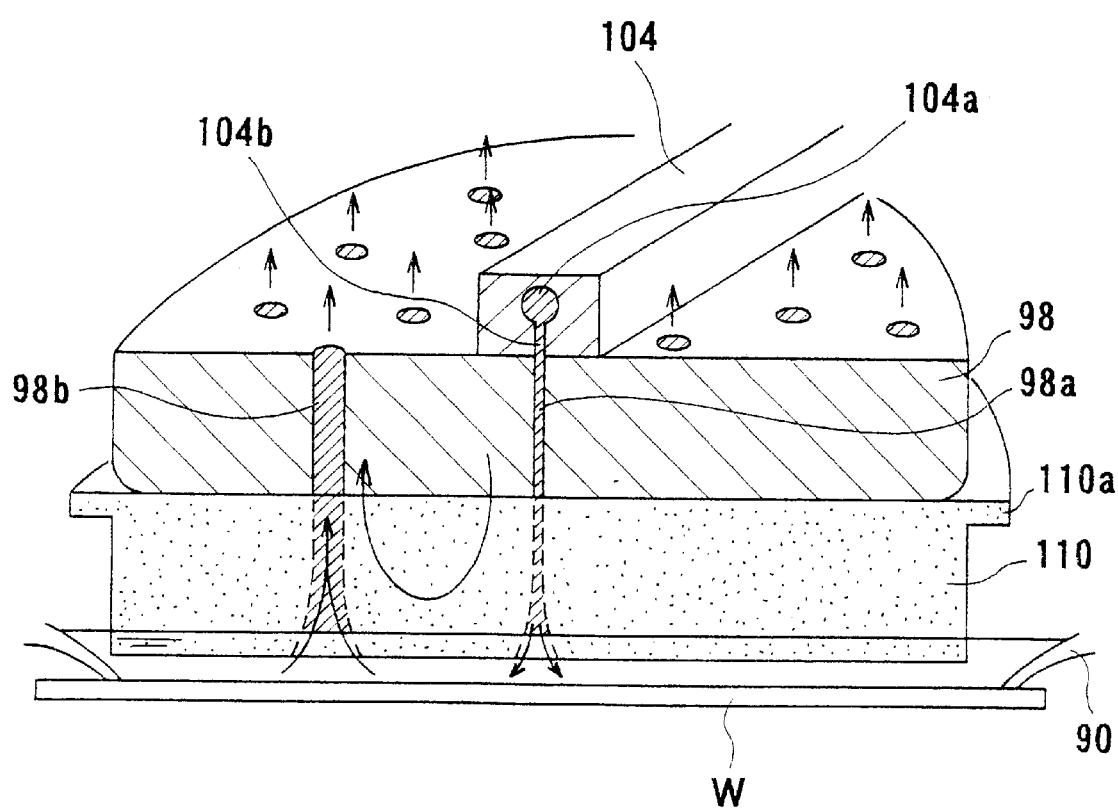
FIG. 28 is a perspective view showing an essential part of a fifth embodiment of the present invention.
Figure 29:
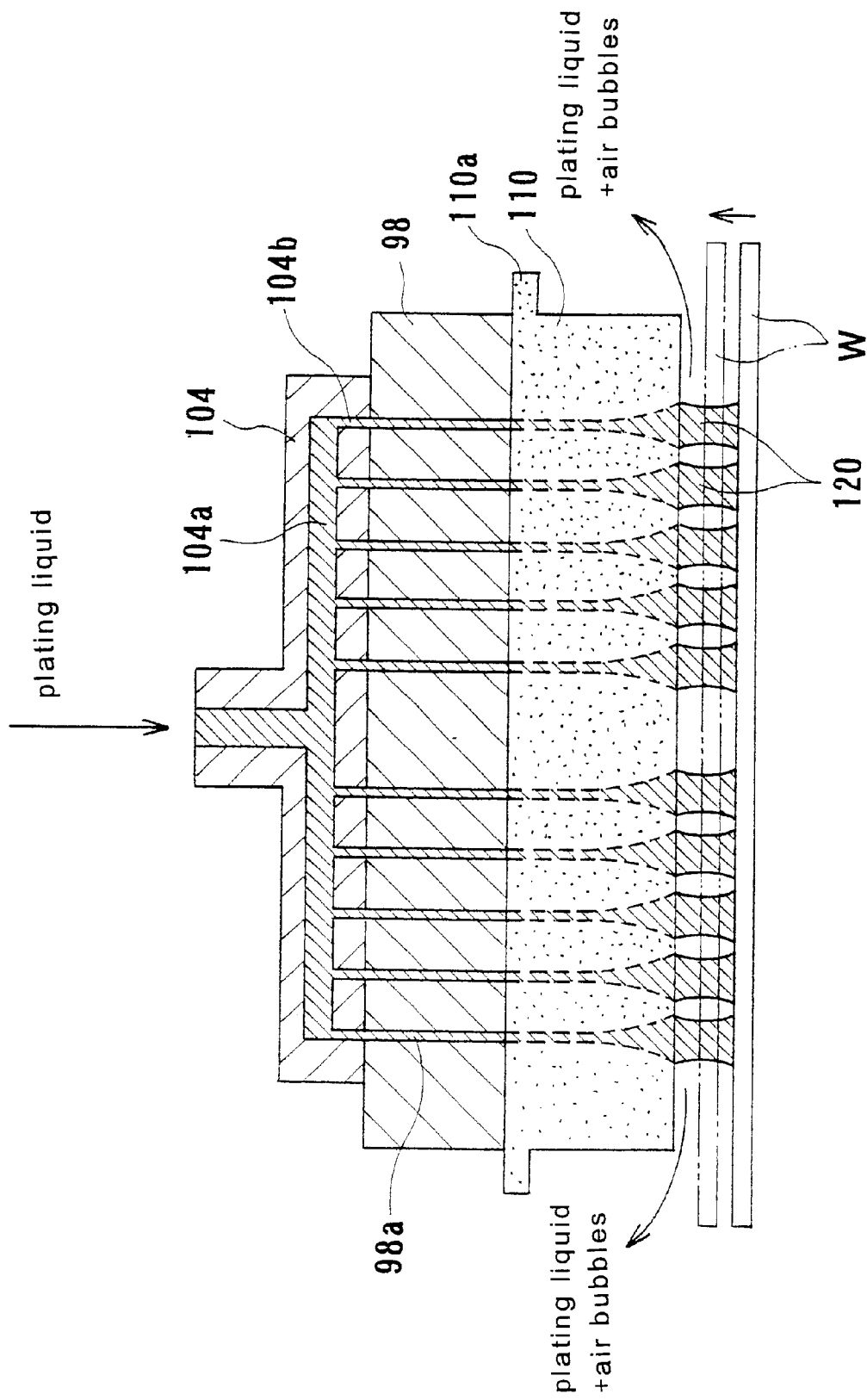
FIG. 29 is a longitudinal sectional front view of the essential part of a fifth embodiment of the present invention.

FIGS. 28 and 29 show the anode 98 and the plating liquid impregnated material 110 according to another embodiment of the present invention. That is, in this embodiment, the plating liquid impregnated material 110 is composed of porous ceramics such as alumina, SiC, mullite, zirconia, titania or cordierite, or a hard porous material such as a sintered compact of polypropylene or polyethylene, or a composite material comprising these materials. In case of the alumina-based ceramics, for example, the ceramics with a pore diameter of 30 to 200 μm, a porosity of 20 to 95%, and a thickness of about 5 to 20 mm, preferably 8 to 15 mm, are used.

Figure 17:
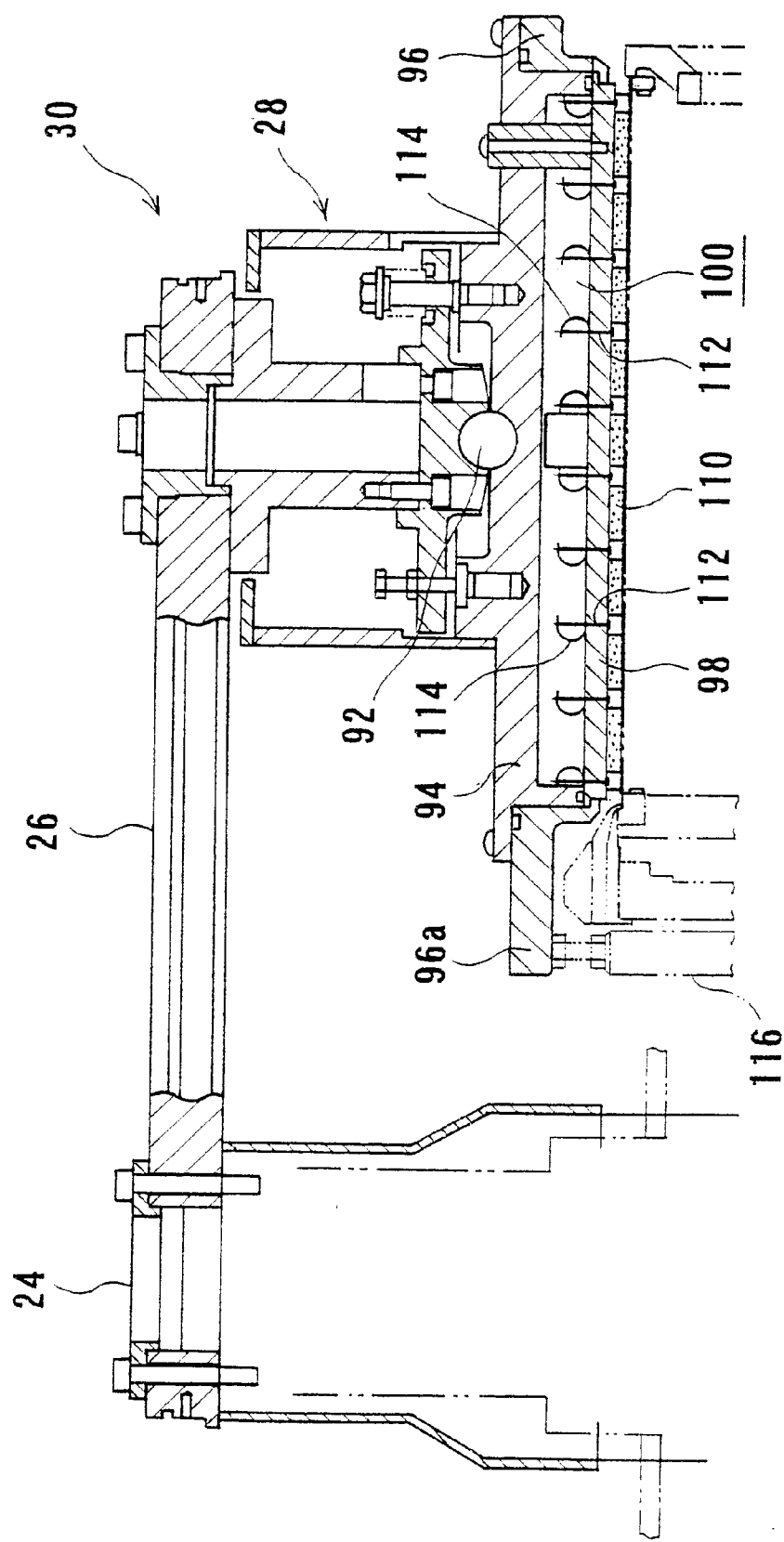
FIG. 17 is a longitudinal sectional front view of FIG. 16.
Figure 18:
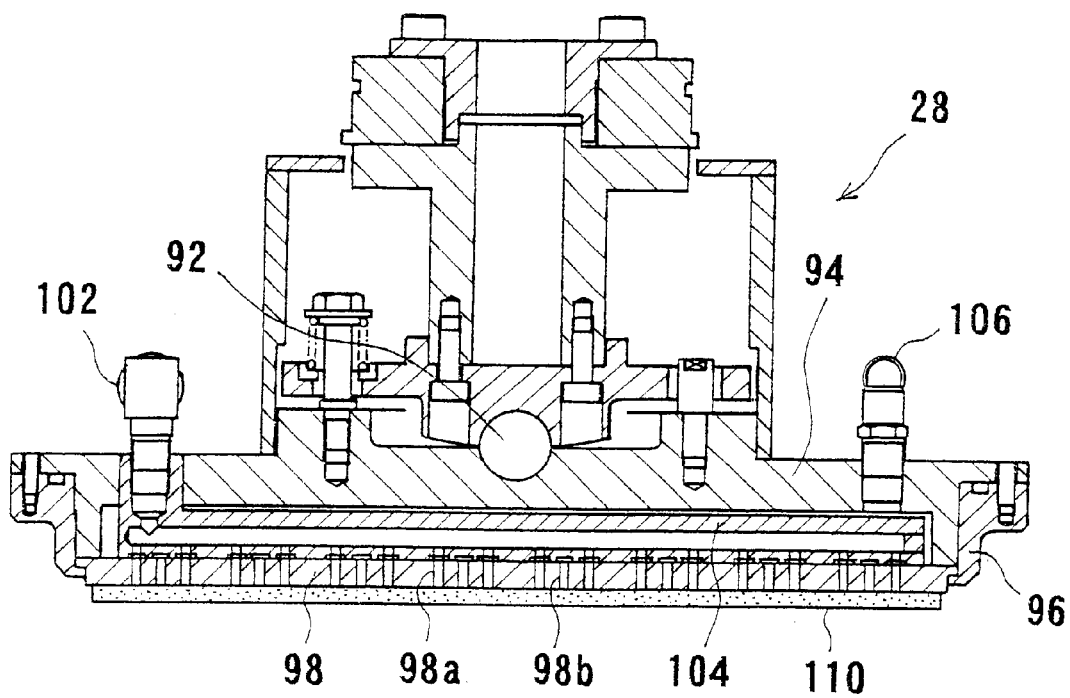
FIG. 18 is a sectional view taken on line E—E of FIG. 16.
Figure 19:
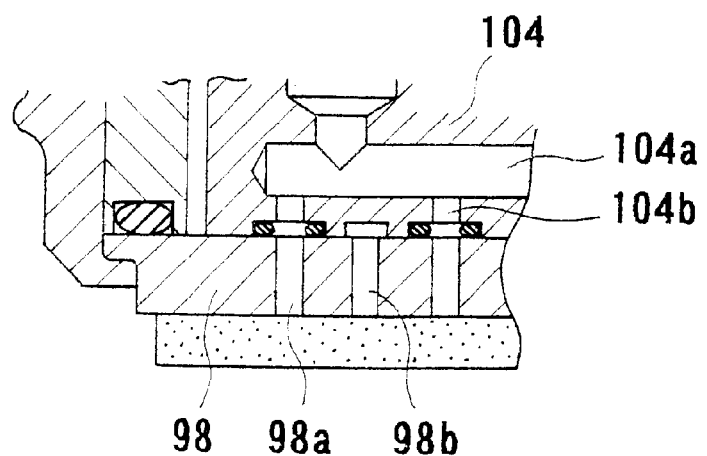
FIG. 19 is an enlarged view showing a part of FIG. 18 in an enlarged manner.
Figure 20:
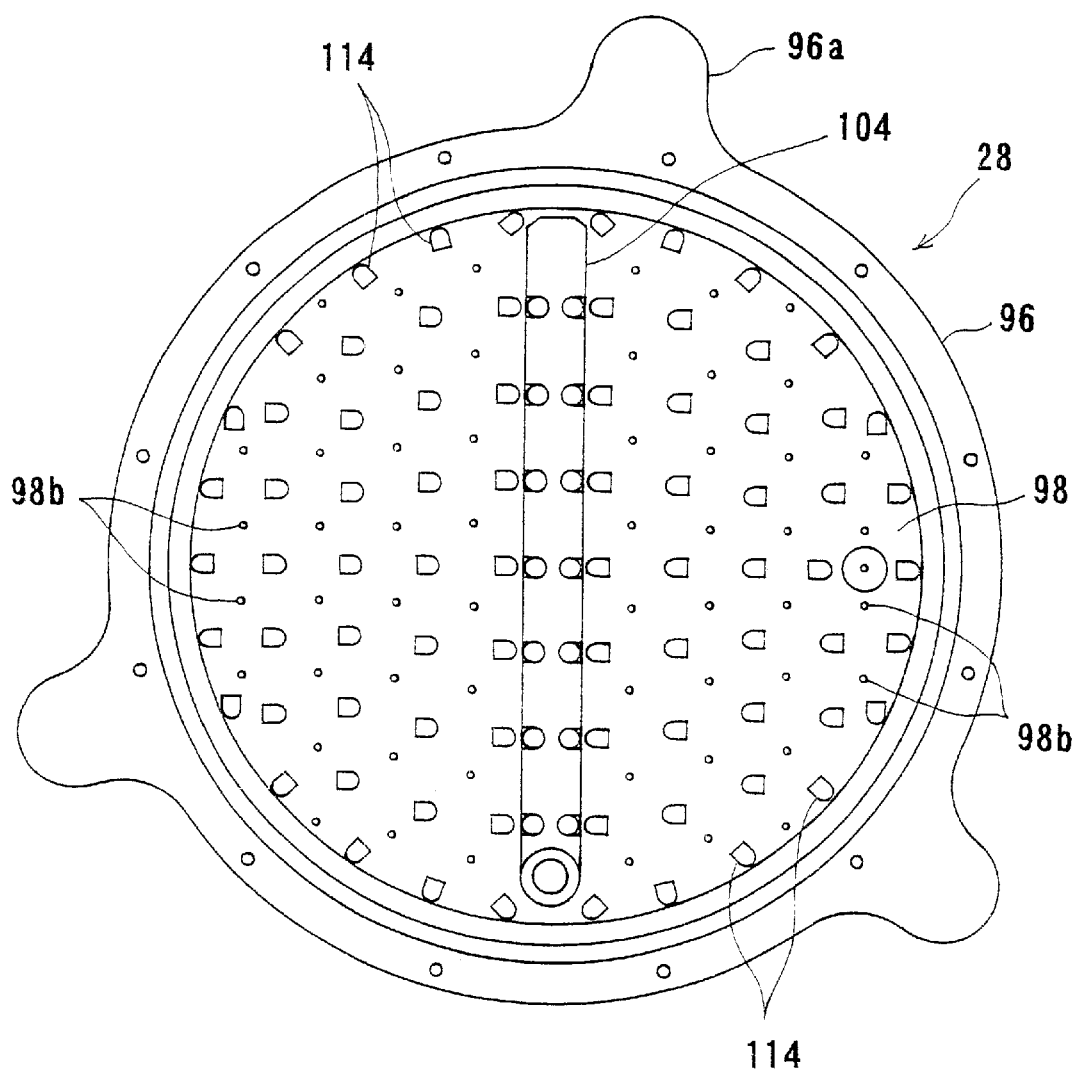
FIG. 20 is a plan view of a state in which a housing of an electrode portion of the electrode arm has been removed.

The plating liquid impregnated material 110 has a flange portion 110a provided at the upper portion thereof, and is fixed by holding this flange portion 110a between the housing 94 and the support frame 96 (see FIGS. 17 and 18). The anode 98 is placed and held on the upper surface of the plating liquid impregnated material 110. In this embodiment, the anodes of various shapes, such as porous ones or mesh-like ones may be placed.

As described above, in the case where the plating liquid impregnated material 110 is composed of a porous material, the electrical resistance of the interior of the plating liquid impregnated material 110 can be increased by the plating liquid which has complicatedly entered the plating liquid impregnated material 110. Thus, the thickness of the plated film can be uniformized, and the generation of particles can be prevented. Furthermore, the anode 98 is placed and held on the plating liquid impregnated material 110. Thus, even when the side of the lower surface of the anode 98 which is in contact with the plating liquid impregnated material 110 is dissolved with the progress of plating, the distance between the lower surface of the anode 98 and the substrate W can be kept constant by the own weight of the anode 98 without the use of a jig for fixing the anode 98, and air accumulation caused by air entering therein can be prevented.

In this embodiment, a plating liquid introduction pipe 104 of a cruciform shape extending in a diametrical direction in the same manner as shown in FIG. 22 is installed on the upper surface of the anode 98. Plating liquid supply ports 98a of the anode 98 are provided at positions corresponding to plating liquid introduction ports 104b provided in the plating liquid introduction pipe 104. Many through holes 98b are provided in the anode 98.

In this embodiment, there is shown an example in which the anode 98 is placed and held on the upper surface of the plating liquid impregnated material 110. However, the plating liquid impregnated material 110 and the anode 98 may be placed at spaced apart positions. In this case, when a soluble anode is used as the anode 98, the anode is dissolved from its lower portion. Thus, as time passes, the gap between the anode and the plating liquid impregnated material may enlarge and form a gap in the range of 0 to about 20 mm.

According to the present embodiment, at positions approximately corresponding to the plating liquid supply ports 98a of the anode 98, the plating liquid reaches the upper surface (surface to be plated) of the substrate W from the lower surface of the plating liquid impregnated material 110, thereby forming the plating liquid columns 120 which bridge the liquid impregnated material 110 and the surface, to be plated, of the substrate W. At this time, when the plating liquid flows inside the plating liquid impregnated material 110, the plating liquid is slightly diffused along its flow direction, thereby alleviating damage to the seed layer 5 (see FIG. 1A) upon arrival of the plating liquid at the substrate W, namely, alleviating the phenomenon of the seed layer due to local application of a jet, and thus contributing to the uniformity of the film thickness during a subsequent plating step.

As indicated by imaginary lines in FIG. 29, after the plating liquid reaches the upper surface (surface to be plated) of the substrate W from the lower surface of the plating liquid impregnated material 110 to form the plating liquid columns 120, the substrate W, for example, may be instantaneously raised to bring the plating liquid impregnated material 110 and the substrate W close to each other instantaneously. Further, it is possible to form the plating liquid columns 120 similarly while bending the substrate in a concave form under slight pressure on the edge of the substrate, and then to release the pressure, thereby restoring the substrate to the original shape. With this measure, the plating liquid impregnated material 110 and the substrate W may be instantaneously brought close to each other.

When the plating liquid impregnated material 110 has a large thickness and a high density (low porosity), for example, resistance becomes large when the plating liquid flows inside the plating liquid impregnated material 110. As a result, a predetermined amount of the plating liquid does not flow out of the plating liquid impregnated material 110, and binding of the plating liquid columns 120 is disturbed. Even if air is dragged at this time, a rapid outward flow of the plating liquid can be generated to drive out air bubbles together with the plating liquid, and the supply of the plating liquid between the plating liquid impregnated material 110 and the substrate W can be performed in a short time by instantaneously bringing the plating liquid impregnated material 110 and the substrate W close to each other.

Contact between the plating liquid and the seed layer 5 (see FIG. 1A) in a non-energized state induces a decrease in the seed layer 5. Even in an energized state, the failure of the plating liquid to spread on the surface of the substrate W in a short time causes variations in the film thickness at the initial stage of plating, and impairs the uniformity of subsequent plated film thickness. However, these troubles can be prevented by supplying the plating liquid between the plating liquid impregnated material 110 and the substrate W in a short time.

Further, as shown in FIG. 28, the plating liquid may be supplied from the plating liquid supply ports 98a to the plating liquid impregnated material 110 during plating treatment to pour the plating liquid between the plating liquid impregnated material 110 and the surface, to be plated, of the substrate W. Simultaneously, the plating liquid in the same amount as the amount of the poured plating liquid can be sucked and discharged via the through holes 98b through a plating liquid discharge pipe 106.

The plating liquid is stirred in this manner during plating treatment, whereby it becomes possible to remove air bubbles which have not been withdrawn during liquid filling, and air bubbles which have occurred during plating treatment after liquid filling.

In the present plating apparatus, the spacing between the surface, to be plated, of the substrate W and the anode 98 is small, so that a small amount of the plating liquid to be used is sufficient. However, since the additives and ions in the plating liquid become in limited amounts, in order to perform efficient plating in a short time, it is necessary to distribute the additives and the like uniformly in the plating liquid. In this respect, according to the present embodiment, because the plating liquid is stirred during plating treatment, it is possible to perform plating in such a state that the additives and ions are distributed uniformly.

Figure 30:
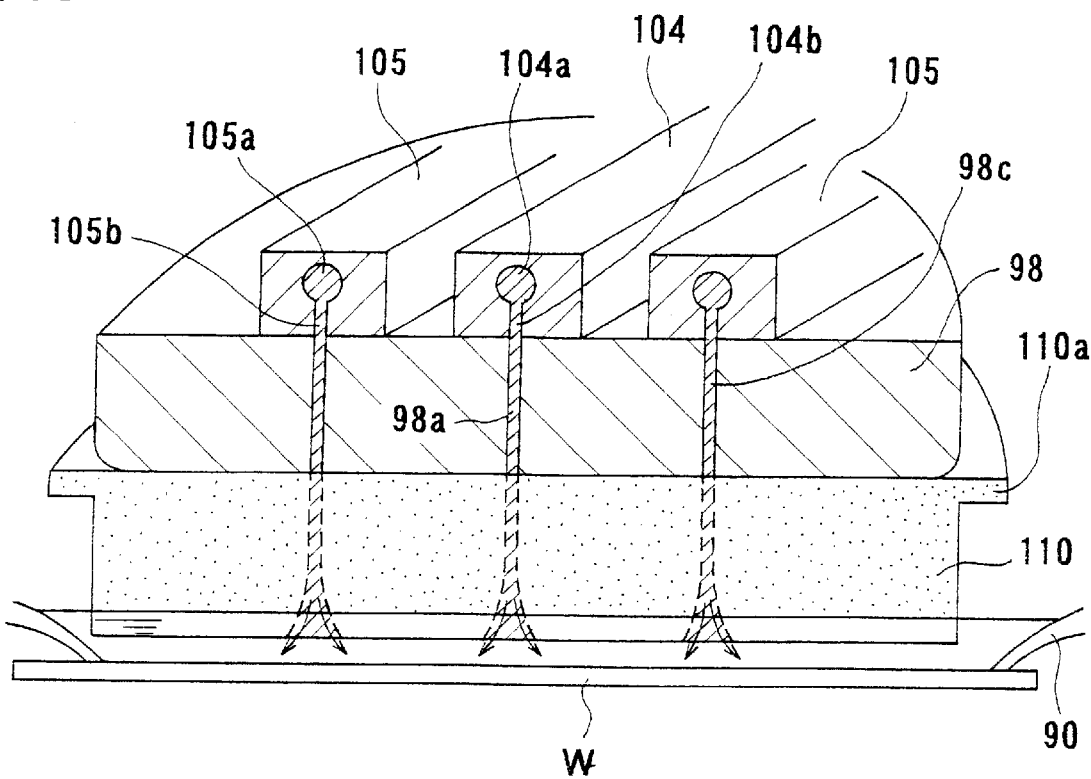
FIG. 30 is a perspective view showing an essential part of a modification of the fifth embodiment of the present invention.

As shown in FIG. 30, additive introduction pipes 105, of substantially the same constitution as the plating liquid introduction pipe 104 and having an additive introduction path 105a and additive introduction ports 105b, may be further provided on the upper surface of the anode 98. Additive pouring holes 98c may be provided at positions of the anode 98 corresponding to the additive introduction ports 105b. A liquid containing additives, such as a leveler and a carrier, and ions (a plating liquid) may be supplied intermittently or continuously from the additive pouring holes 98c during plating treatment. By this measure, the additives and ions consumed by plating may be supplemented. In this case, the additives are in tiny amounts, so that the plating liquid need not be discharged through the through holes 98b. Furthermore, the proportions of the components of the additives may be varied during plating, whereby the level difference of the film thickness between the line and space portion (interconnects portion) and the flat portion can be decreased, and the CMP characteristics in a subsequent step can be improved.

FIGS. 31A and 31B, and FIGS. 32A and 32B show different embodiments of the present invention in which the plating liquid impregnated material 110 is composed of a hard porous material. In these embodiments, means for causing radial outward spread of the plating liquid between the plating liquid impregnated material 110 and the substrate W by their relative rotation is provided on the lower surface of the plating liquid impregnated material 110. Other constitutions are the same as in the embodiment shown in FIGS. 28 and 29.

Figure 31A:
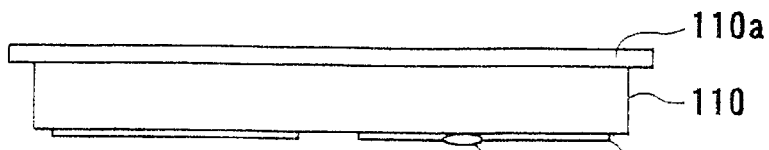
FIG. 31A is a front view showing a plating liquid impregnated material in a sixth embodiment of the present invention.
Figure 31B:
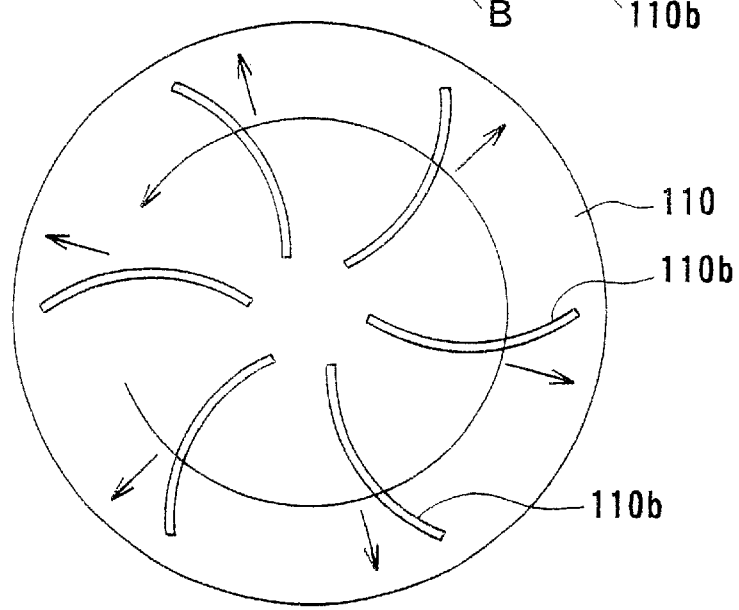
FIG. 31B is a bottom view of the plating liquid impregnated material.
Figure 32A:
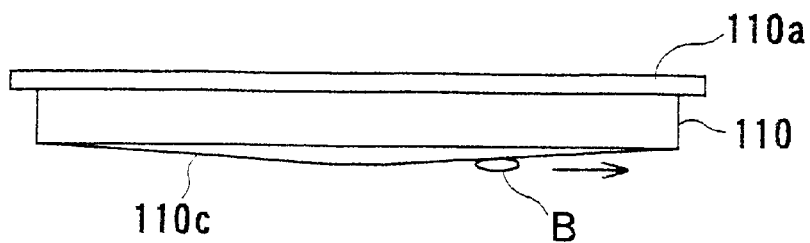
FIG. 32A is a front view showing a plating liquid impregnated material in a seventh embodiment of the present invention.
Figure 32B:
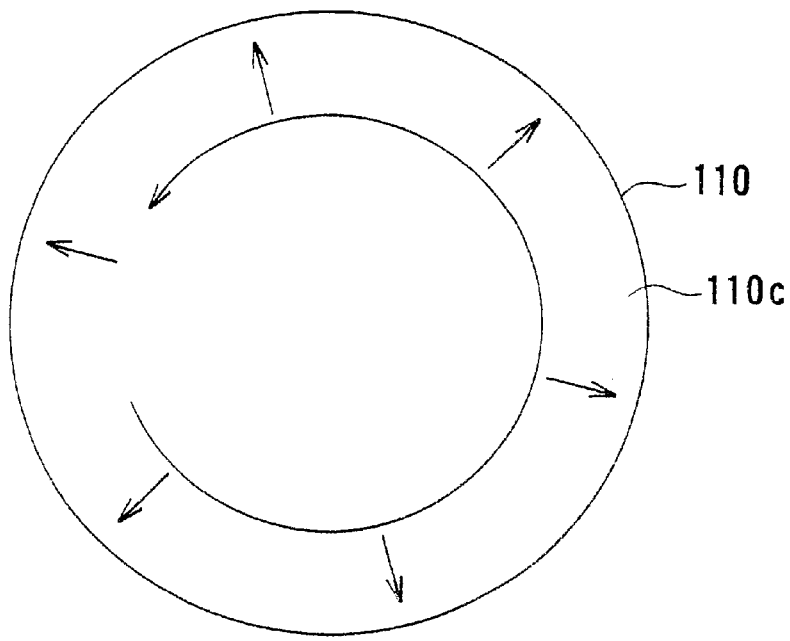
FIG. 32B is a bottom view of the plating liquid impregnated material.

That is, in FIGS. 31A and 31B, a plurality of spiral projections (blades) 110b curved outward along a rotating direction are provided on the lower surface of the plating liquid impregnated material 110. In FIGS. 32A and 32B, the lower surface of the plating liquid impregnated material 110 is per se formed as a tapered surface 110c having a taper, for example, of about 1/100 and bulging downward at the center.

In these embodiments, after plating liquid columns 120 which bridge the plating liquid impregnated material 110 and the surface, to be plated, of the substrate W are formed, the substrate W is rotated, for example, to rotate the plating liquid impregnated material 110 and the substrate W relative to each other. In accordance with this rotation, the plating liquid between the plating liquid impregnated material 110 and the substrate W is caused to spread radially outwardly while being agitated. As a result, air bubbles B having entered between the plating liquid impregnated material 110 and the substrate W are driven outward forcibly together with the plating liquid. At the same time, supply of the plating liquid between the plating liquid impregnated material 110 and the substrate W can be performed in a short time.

Particularly, as shown in FIGS. 31A and 31B, the projections 110b having a flow-arranging action for assisting in the spread of the plating liquid, and an agitating action associated with rotation are provided on the lower surface of the plating liquid impregnated material 110. Consequently, the limited additives and ions in the plating liquid can be distributed uniformly on the surface of the substrate W.

Instead of the spiral projections 10b shown in FIGS. 31A and 31B, there may be provided projections widening outwardly radially. Instead of such projections, depressions (grooves) may be provided. Alternatively, an arc-shaped round surface may be used instead of the tapered surface 110c shown in FIGS. 32A and 32B.

Figure 33:
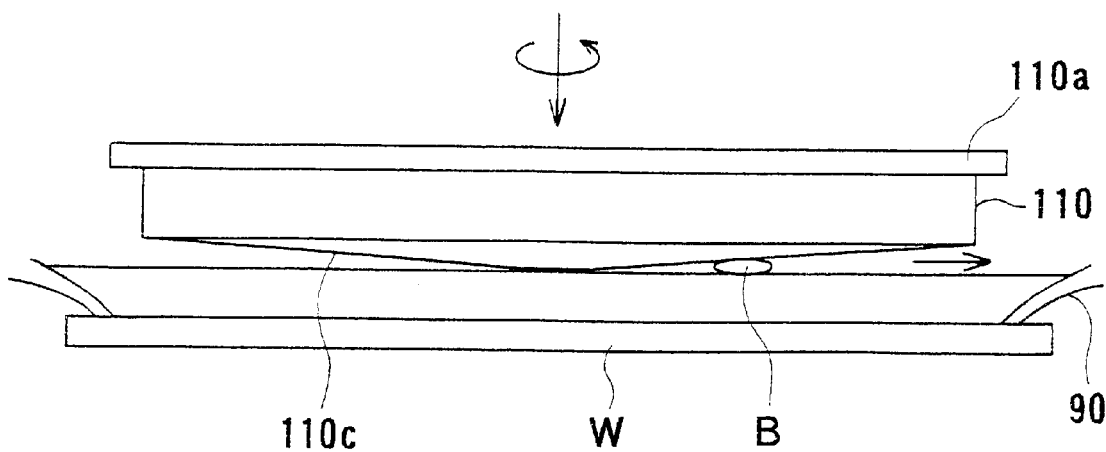
FIG. 33 is a front view showing another use example of the embodiment shown in FIG. 32A.

Further, as shown in FIG. 33, a plating liquid may be fed beforehand on the surface, to be plated, of a substrate W having a peripheral edge portion sealed in a watertight manner with a seal material 90. The plating liquid impregnated material 110 having a lower surface like the tapered surface 110c shown in FIGS. 32A and 32B may, for example, be lowered while being rotated. By this measure, the plating liquid impregnated material 110 and the substrate W may be gradually brought close to each other while being relatively rotated, whereby the plating liquid may be filled between the plating liquid impregnated material 110 and the substrate w. By so doing, air bubbles B between the plating liquid impregnated material 110 and the substrate W can be gradually moved outward and reliably driven off, as the plating liquid impregnated material 110 and the substrate W approach each other. As a result, the space between the plating liquid impregnated material 110 and the substrate W can be filled with the plating liquid free from air bubbles.

In the respective embodiments above, examples in which the substrate is held face-up are shown. However, it goes without saying that the vertical relationship between the substrate and the anode is not restricted thereto.

According to the plating apparatus of this embodiment, plating treatment, pretreatment incidental to plating treatment, and other treatments such as cleaning/drying treatment can be performed before and after plating treatment, with the substrate being held face-up by the substrate holding portion. Thus, simplification of the apparatus can be achieved, and the plating apparatus occupying only a small area can be provided inexpensively. In addition, the space between the surface, to be plated, of the substrate and the anode can be filled with the plating liquid, with no air bubbles remaining. Thus, a uniform and high quality plated film can be formed on the surface to be plated.

Figure 34:
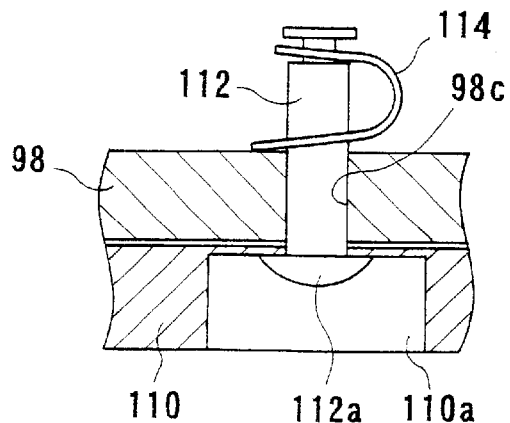
FIG. 34 is an enlarged sectional view showing a state of mounting of the plating liquid impregnated material onto the anode.
Figure 35:
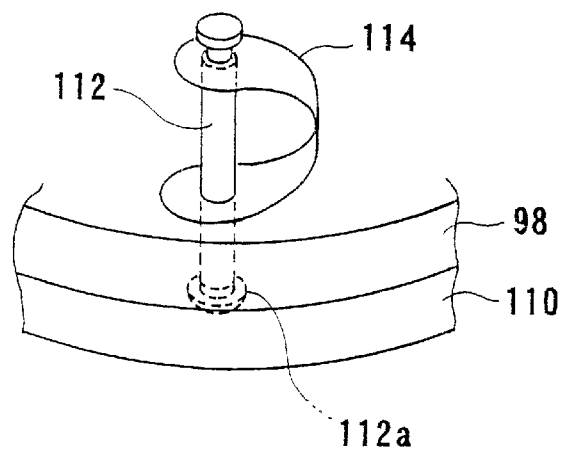
FIG. 35 is perspective view of the state of mounting of the plating liquid impregnated material onto the anode.

As shown in FIGS. 34 and 35, a number of substantially columnar fixing pins 112 each having a large-diameter head portion 112a at the lower end are placed such that the head portions 112a are buried and fixed in the plating liquid impregnated material 110 so as not to be escapable upward, and shaft portions of the pins are inserted into through-holes 98c provided in the interior of the anode 98, and are protruded upward. Moreover, the fixing pins 112 are urged upward, for example, via U-shaped plate springs 114 of synthetic resin, whereby the plating liquid impregnated material 110 is attached to the lower surface of the anode 98 in an intimately contacted via the resilient force of the plate springs 114.

In this embodiment, slits 110a of a predetermined depth are provided on a lower surface side of the plating liquid impregnated material 110. Each of the shaft portion 112a of the fixing pin 112 is positioned in this slit 110a, and the shaft portion is stuck into the plating liquid impregnated material 110, whereby the fixing pin 112 is fixed to the plating liquid impregnated material 110. The plating liquid impregnated material 110 is returned to close the slits 110a by its resilient force.

The material for the fixing pin 112 is, for example, polypropylene, PEEK, PVC or polyethylene, but these materials, needless to say, are not restrictive, and any material having sufficient durability to the plating liquid and sufficient strength as the pin may be used. The diameter of the fixing pin 112 is, for example, about 0.5 to 4 mm. The mounting pitch for the fixing pins 112 differs according to the plating liquid impregnated material 110 that is used, the plating area, etc. With plating of an 8-inch substrate, for example, the mounting pitch is about 5 to 40 mm, and the number of the fixing pins mounted is about 10 to 150. Desirably, the mounting pitch is 20 mm, and the number of fixing pins mounted is about 50 to 100.

Because of such constitutions, the lower surface of the anode 98 where a black film is formed is wetted with the plating liquid held by the plating liquid impregnated material 110. Moreover, the plating liquid impregnated material 110 plays the role of a filter, so that the drying and dropout of the black film, and further, oxidation can be prevented. In addition, even when the anode 98 gradually dissolves and fades and its thickness decreases with the progress of plating, the anode 98 and the plating liquid impregnated material 110 are always kept in close contact under the resilient force of the plate springs 114. Thus, formation of air accumulation between them is prevented. Normally, the anode 98 is consumed in an amount of about 20 to 40 mm as a result of one month of plating.

Figure 36:
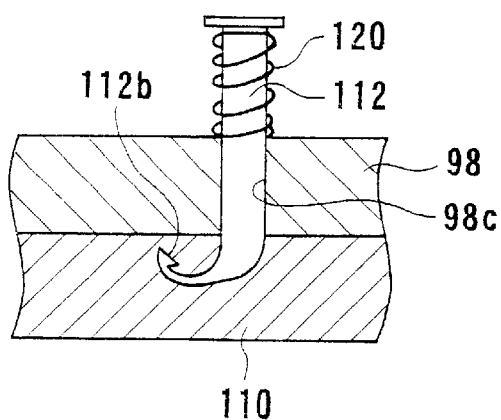
FIG. 36 is an enlarged sectional view showing another state of mounting of the plating liquid impregnated material onto the anode.

As shown in FIG. 36, there may be used the fixing pin 112 which has a fishhook-like portion 112b at the lower end. This fishhook-like portion 112b may be pushed in from the upper surface side of the plating liquid impregnated material 110, and hooked on and fixed thereto. Further, the fixing pin 112 may be urged upward, for example, using a coil spring 120 of synthetic resin. A plate spring is more advantageous than the coil spring in terms of the mounting method and price.

Figure 37:
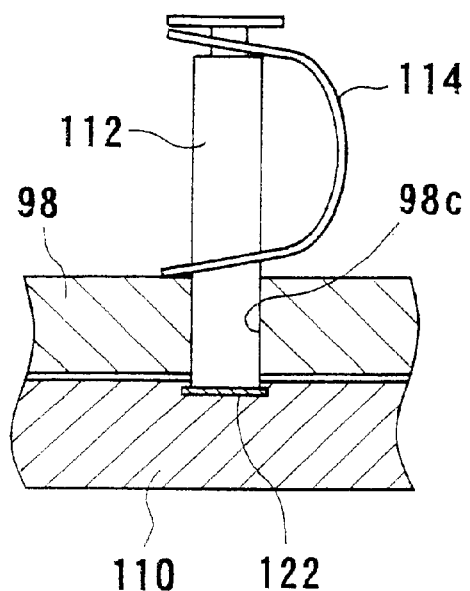
FIG. 37 is an enlarged sectional view showing still another state of mounting of the plating liquid impregnated material onto the anode.

Besides, as shown in FIG. 37, columnar fixing pins 112 of PVC (polyvinyl chloride) or PET, for example, of about 2 mm in diameter may be placed from the upper surface side of the anode so as to be inserted into the through-holes 98c of the anode 98, and an adhesive 122 may be applied to each of the front end surface of the fixing pins 112 appearing on the lower surface of the anode 98 to adhere and fix to the plating liquid impregnated material 110. As the adhesive 122, a vinyl chloride-based adhesive, a silicon modified polymer adhesive, a rubber-based adhesive, or a cyanoacrylate-based adhesive can be cited. Needless to say, however, they are not restrictive, and any adhesives may be used, if they are durable to the plating liquid, and minimal in solving-out of organic substances and occurrence of particles.

Figure 38:
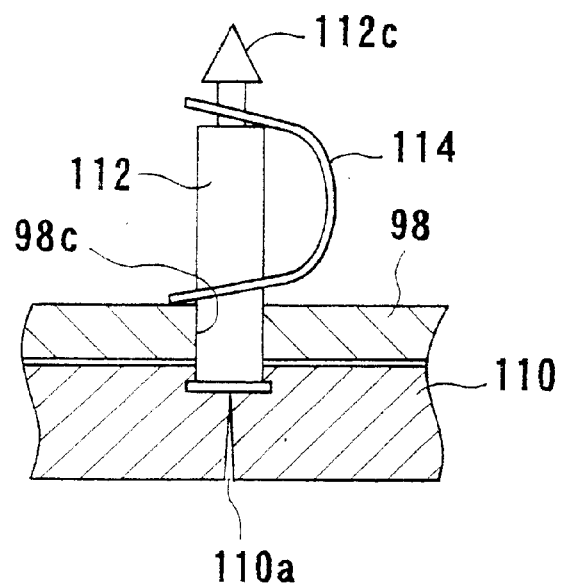
FIG. 38 is an enlarged sectional view showing still another state of mounting of the plating liquid impregnated material onto the anode.

Further, as shown in FIG. 38, a pinnacle-shaped portion 112c may be provided at the front end of the fixing pin 112 to make it convenient for the fixing pin 112 to be stuck into the plating liquid impregnated material 110. In this case, as shown in FIG. 38, pinhole-like slits 110a may be provided on the lower surface side of the plating liquid impregnated material 110.

Figure 39:
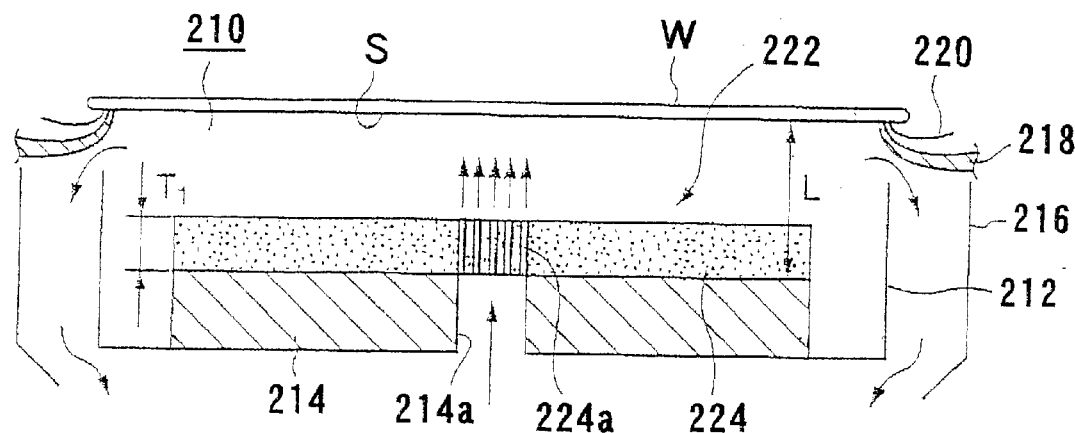
FIG. 39 is a schematic view of an essential part of an electrolytic treatment apparatus applied to an electroplating apparatus according to still another embodiment of the present invention.
Figure 40:
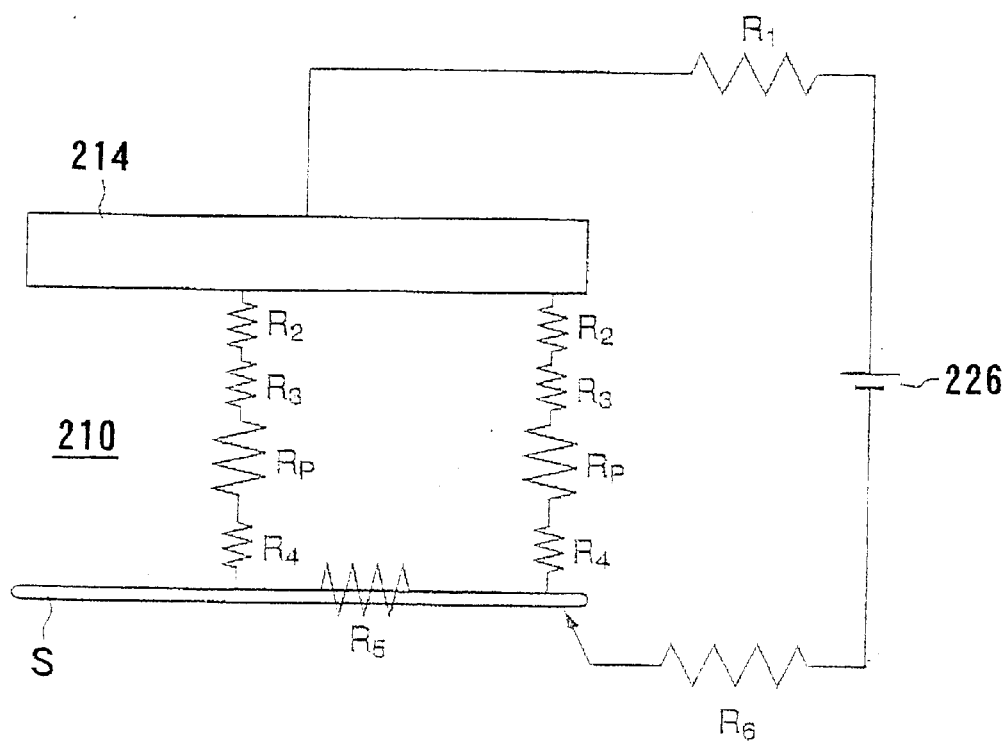
FIG. 40 is an electrical equivalent circuit diagram of FIG. 39.

FIG. 39 is a schematic view of an essential part of an electrolytic treatment apparatus applied to an electroplating apparatus according to still another embodiment of the present invention. FIG. 40 is an electrical equivalent circuit diagram thereof. This apparatus holds a silicon substrate (hereinafter referred to as a substrate) of 200 mm in diameter in a so-called face-down manner, and applies copper plating onto its surface (lower surface). A thin film of sputtered copper as a conductive layer (seed layer) S is formed, for example with a film thickness of 100 nm, on the lower surface (surface to be plated) of this substrate W.

This plating apparatus includes a cup-shaped plating tank 212 opening upward and holding a copper sulfate-based plating liquid 210 therein. A doughnut-shaped anode plate 214 having a central hole 214a, for example, of 30 mm in diameter is installed at the bottom of the plating tank 212. The material of this anode plate 214 is copper containing 0.04% by weight of phosphorus, for example. Around the plating tank 212, a plating liquid receiver 216 is placed for recovering the plating liquid 210 that has overflowed from the top of the plating tank 212.

On the peripheral portion of the substrate W, a lip seal 218, which makes pressure contact with the peripheral edge portion of the lower surface of the substrate W to inhibit outflow of the plating liquid 210 from this site, is provided above the plating tank 212. Outwardly of the lip seal 218, contacts 220 are provided for contacting the substrate W to introduce a cathode potential into the substrate W.

Inside the plating tank 212, a high resistance structure 222 of a lower electrical conductivity than the electrical conductivity of the plating liquid 210 is placed between the anode plate 214 and the substrate W. The high resistance structure 222, in this embodiment, is constituted, for example, by holding the plating liquid 210 in a porous ceramic plate 224 of alumina having a porosity of 30%, an average pore diameter of 100 $\mu$m and a thickness $T_1$ of 20 mm. That is, the porous ceramic plate 224 per se is an insulator, but the high resistance structure 222 is constituted by causing the plating liquid 210 to enter its interior complicatedly and follow a considerably long path in the thickness direction. That is, the flexing rate of pores formed in a porous ceramic plate is high. Thus, compared with many holes formed in an insulator with a thickness d, pores in the porous ceramic plate with the same thickness d constitute a long path measuring 2d to 3d. At positions of the porous ceramic plate 224 facing the central hole 214a of the anode plate 214, a plurality of through-holes 224a, for example, of 1 mm in diameter are provided with 5 mm pitch. The porous ceramic plate 224 may be in intimate contact with the anode plate 214, or may be in intimate contact with the substrate W.

According to the above constitution, the substrate W is placed face-down above the plating tank 212, and the plating liquid 210 is gushed upward from the bottom of the plating tank 212 through the central hole 214a of the anode plate 214 and the through-holes 224a of the porous ceramic plate 224 to strike a jet of the plating liquid 210 on the lower surface (surface to be plated) of the substrate W. During this action, a predetermined voltage from a plating power source 226 is applied between the anode plate 214 (anodic electrode) and an conductive layer S (cathodic electrode) of the substrate W, whereby a plated film is formed on the lower surface of the substrate W. At this time, the plating liquid 210 that has overflowed into the plating tank 212 is recovered from the plating liquid receiver 216.

Using the plating apparatus of this embodiment, electroplating with copper was performed, with the current density set at 20 mA/cm$^2$ and the distance L between the upper surface of the anode plate 214 and the lower surface of the substrate W set at 50 mm. A power supply voltage necessary for plating increased by about 2V compared with that before installation of the porous ceramic plate 224. This increase results from the fact that the porous ceramic plate 224 functioned as a resistor with a lower electrical conductivity than the plating liquid 210.

Figure 74:
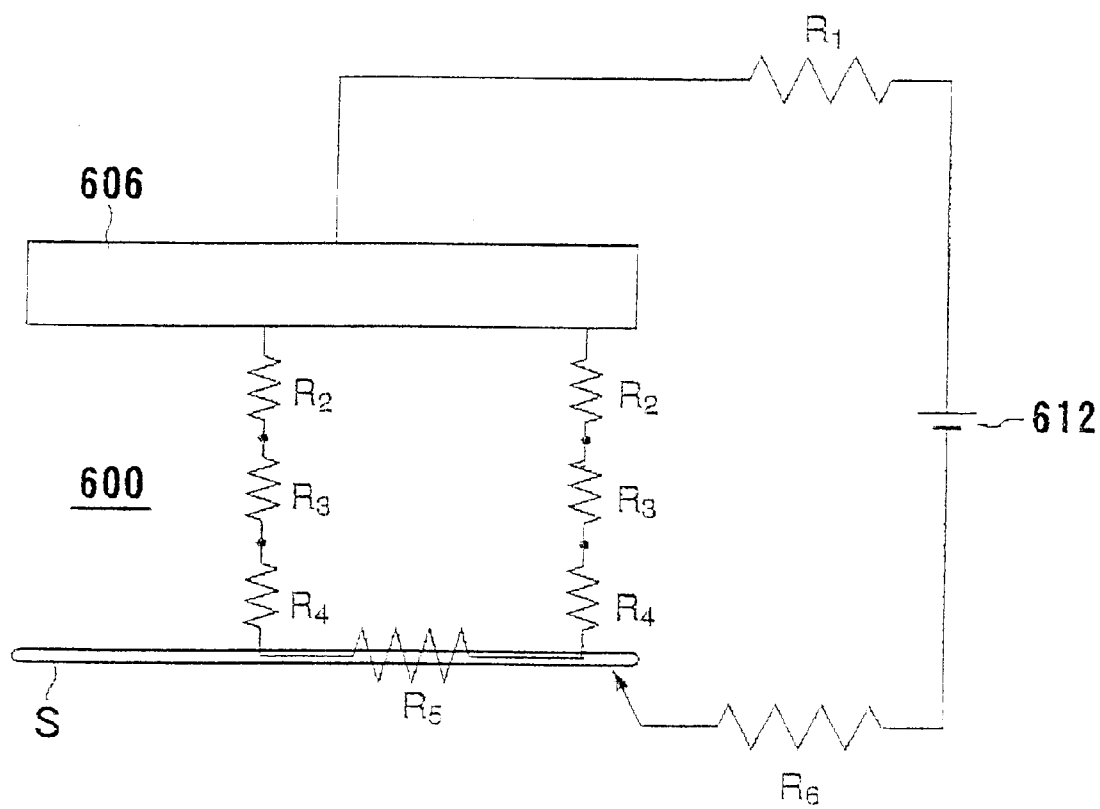
FIG. 74 is an electrical equivalent circuit diagram of the plating apparatus shown in FIG. 71.

That is, the cross sectional area of the plating tank 212 is about 300 cm², so that the resistance of the high resistance structure 222 is about 0.333 Ω. In the equivalent circuit shown in FIG. 40, therefore, a resistance Rp generated by this high resistance structure 222 is added as a new resistance. In FIG. 40, the resistances R1 to R5 show the same resistance values as the resistances R1 to R5 shown in FIG. 74.

When the great resistance Rp adds because of the high resistance structure 222, the ratio of the resistance at the center of the substrate to the resistance in the peripheral portion, namely, (R2+Rp+R3+R4)/(R2+Rp+R3+R4+R5), approaches 1. Hence, the influence of the resistance R5 of the conductive layer becomes a negligible degree. Consequently, the difference in current density over the surface of the substrate due to electrical resistance on the surface of the substrate W becomes small, and the uniformity of the plated film over the surface of the substrate improves.

The resistance value of a high resistance structure 222 is 0.01 Ω or more, preferably 0.01 to 2 Ω, more preferably 0.03 to 1 Ω, and even more preferably 0.05 to 0.5 Ω, for example, in the case of a 200 mm wafer. The resistance value of this high resistance structure 222 is measured by the following procedure: First, in the plating apparatus, a direct current (I) of a predetermined value is flowed between both electrodes comprising the anode plate 214 and the substrate W spaced by a predetermined distance to perform plating, and the voltage (V1) of the direct current power source at this time is measured. Then, in the same plating apparatus, the high resistance structure of a predetermined thickness is placed between both electrodes, and a direct current (I) of the same value is flowed to perform plating. At this time, the voltage (V2) of the direct current power source is measured. With this method, the resistance value Rp of the high resistance structure can be calculated from Rp (V2−V1)/I. In this case, the purity of copper constituting the anode plate is preferably 99.99% or more. The distance between the two electrode plates comprising the anode plate and the substrate is preferably in the range of 5 to 25 mm in the case of the substrate having a diameter of 200 mm, and is preferably in the range of 15 to 75 mm in the case of the substrate having a diameter of 300 mm. The resistance R5 of the conductive layer S on the substrate W can be determined by measuring the resistance value between the outer periphery and the center of the substrate with the use of a tester, or calculated from the resistivity of the material and the thickness of the conductive layer S.

Figure 41:
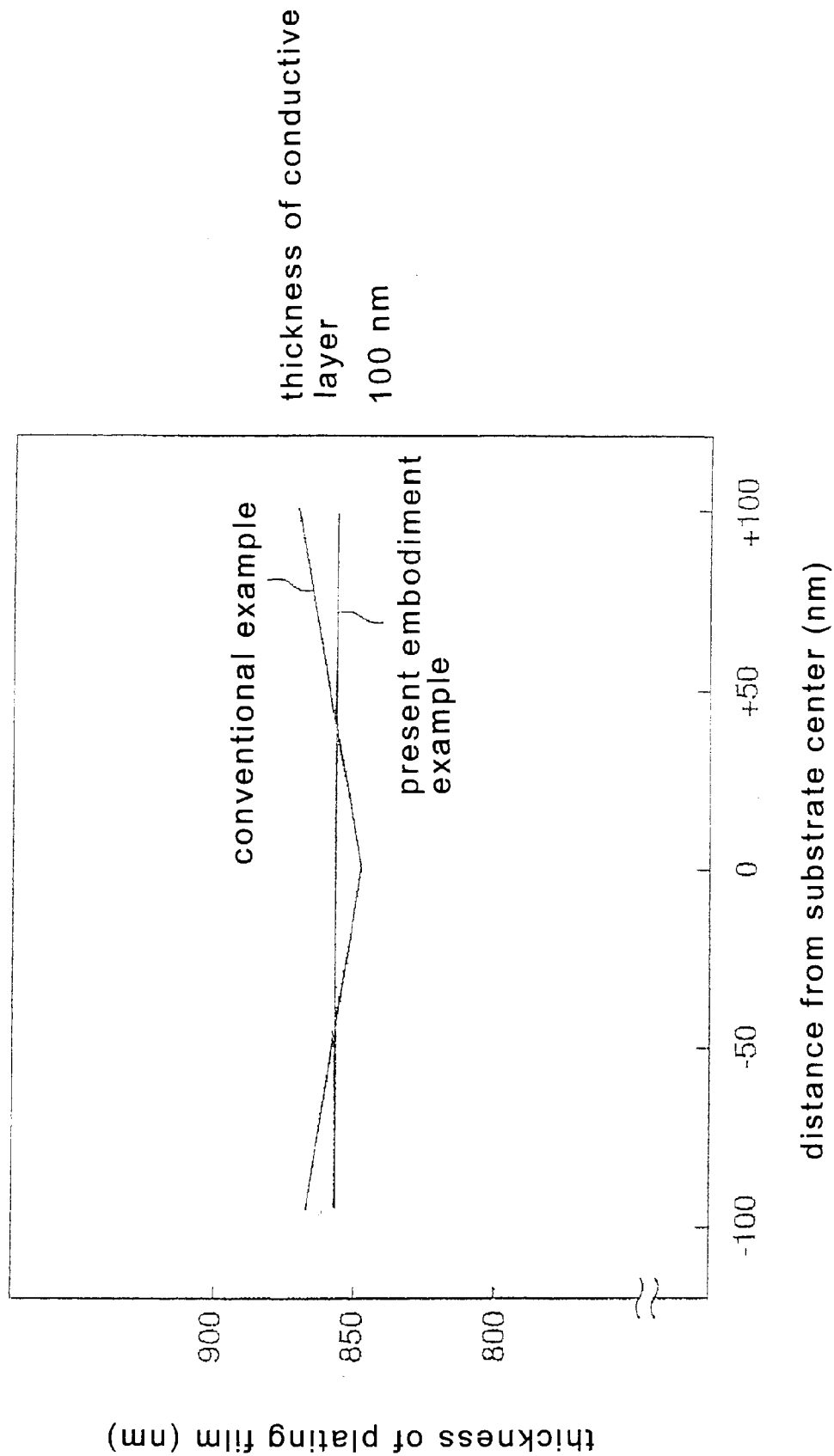
FIG. 41 is a view showing the film thickness distribution of a plated film over a surface of a substrate when plating was performed by each of the plating apparatus shown in FIG. 39 and a conventional plating apparatus.

FIG. 41 shows the film thickness distribution of a plated film over a surface of a substrate when copper plating was performed on the surface of the substrate W with the use of a plating apparatus having the high resistance structure 222 comprising the porous ceramic plate 224 installed therein as described earlier (present embodiment example), and a plating apparatus without the high resistance structure (conventional example). FIG. 41 shows that a thin film phenomenon at the center of the substrate did not take place in the plating apparatus of this embodiment, but uniform plating was performed.

On the other hand, the resistivity of the plating liquid is about 5.5 Ω·m and the cross sectional area of the plating tank 212 is about 300 cm². Thus, if it is attempted to obtain the same effect, i.e., a resistance of about 0.333 Ω using the plating liquid 210, by increasing the distance between the substrate W and the anode plate 214, there is need to separate them by an additional distance of about 18 cm, thus resulting in the upsizing of the apparatus.

In this embodiment, an example in which the high resistance structure is constituted of an alumina porous ceramic plate is shown. However, other materials, such as silicon carbide ceramics, have also been confirmed to obtain the same effect. The porosity, the pore diameter, the flexing rate of pores, etc. can be selected, as desired, according to the purpose. In this embodiment, for example, the 1 mm through-holes were bored in the porous ceramic plate to promote circulation of the plating liquid, but this will be unnecessary, if the pore diameter is large.

Moreover, the use of a material formed by bundling vinyl chloride in a fibrous form, and fusing them together can obtain a plate having large amounts of holes rectilinearly piercing in the thickness direction. The high resistance structure may be constituted of such a plate. Alternatively, the high resistance structure may be constituted of a material formed by shaping foam such as polyvinyl alcohol, or a fiber such as Teflon (trade name) into a form such as a woven fabric or a nonwoven fabric. Furthermore, the same effect can be obtained by use of a composite of any of them combined with a conductor and an insulator, or conductors.

Any of these high resistance structures can be subjected, as desired, to pretreatment before being assembled into the plating apparatus. Especially, acid pickling, degreasing, or joint washing with the plating liquid or a component in the plating liquid is effective. The thickness and shape of the high resistance structure can, of course, be changed, as desired, unless the change departs from the gist of the present invention.

In this embodiment, electroplating has been described. However, if the direction of electric current is reversed, in other words, if the apparatus is used unchanged, and the polarity of the power source is reversed, electrolytic etching can be performed. In this case, uniformity of etching can be improved. With plating process for copper interconnects in LSI, it is known to perform electrolytic etching while applying reverse electrolysis before and after the plating process. For example, using this apparatus, plating is performed for 7.5 seconds at a current density of 20 mA/cm² to form a 50 nm copper plated film, and then etching is performed for 20 seconds at a current density of 5 mA/cm², with the polarity of the power source being reversed to etch the copper plated film 33 nm thick, followed by performing final plating. In this manner, it has been confirmed that etching is carried out uniformly, and embedding characteristics are improved.

Figure 42:
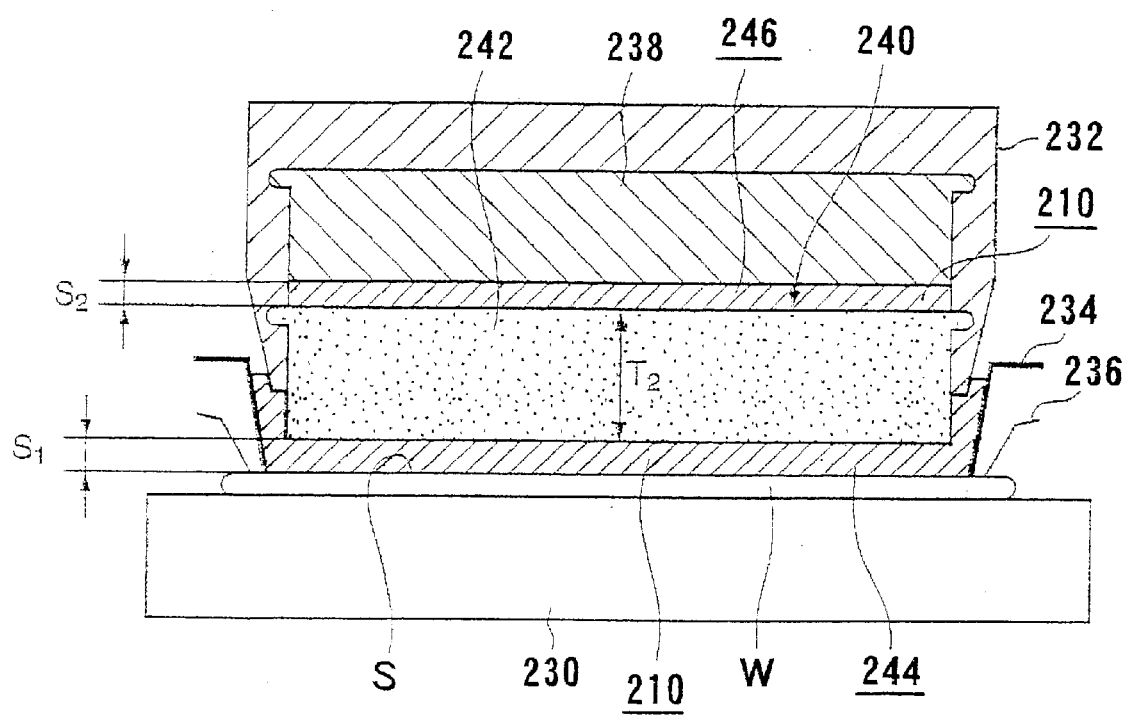
FIG. 42 is a schematic view of an essential part of an electrolytic treatment apparatus applied to an electroplating apparatus according to still another embodiment of the present invention.

FIG. 42 shows an electrolytic treatment apparatus applied to electroplating according to still another embodiment of the present invention. This plating apparatus adapts to a so-called face-up system, in which a substrate W is placed on a substrate placing stand 230 so as to face upward. On the periphery of the substrate W, a lip seal 234, for example, of Bayton rubber is provided. Outwardly of the lip seal 234, contacts 236 are provided for contacting an conductive layer S of the substrate W to introduce a cathode potential into the substrate W. The lip seal 234, for example at a height of 10 mm, can hold a plating liquid 210.

A holding tool 232 is arranged above the substrate placing stand 230. An anode plate 238, and a porous ceramic plate 242 constituting a high resistance structure 240 are held on and fixed to the holding tool 232 with a predetermined spacing provided therebetween. The porous ceramic plate 242, in this embodiment, is a SiC plate, for example, having a porosity of 20%, an average pore diameter of 50 μm and a thickness $T_2$ of 10 mm, and holding the plating liquid 210 therein, thereby constituting the high resistance structure 240. The anode plate 238 is of a structure completely covered with the holding tool 232 and the porous ceramic plate 242. The porous ceramic plate 242, desirably, is impregnated with the plating liquid, beforehand, in a separate tank (not shown) storing the plating liquid.

A first plating chamber 244 with a gap $S_1$ set at about 2 mm is provided between the upper surface of the substrate W and the lower surface of the porous ceramic plate 242, and a second plating chamber 246 with a gap $S_2$ set at about 1.5 mm is provided between the upper surface of the porous ceramic plate 242 and the lower surface of the anode plate 238. The plating liquid 210 is introduced into these plating chambers 244, 246. A method adopted for introducing the plating liquid 210 is to introduce the plating liquid 210 from a gap between the lip seal 234 and the end surface of the porous ceramic plate 242, or introduce the plating liquid 210, which has been pressurized, to the rear side (upper portion) of the porous ceramic plate 242 via a through-hole provided in the anode plate 238.

In this embodiment, the substrate W and the substrate placing stand 230, or the anode plate 238 and the porous ceramic plate 242 may be rotated during electroplating.

Copper plating was performed on the upper surface (surface to be plated) of the substrate W with the use of the plating apparatus of this embodiment, and the film thickness of the resulting copper plated film was examined. By providing the high resistance structure 240 composed of the porous ceramic plate 242, it has been confirmed that the uniformity of the film thickness over the surface of the substrate is improved as in the aforementioned embodiment.

This embodiment has a structure in which the anode plate 238 is completely covered with the porous ceramic plate 242 and the holding tool 232, and the plating liquid 210 is filled between the anode plate 238 and the porous ceramic plate 242. The apparatus is so structured, and the porosity, flexing rate, pore diameter, etc. of the porous ceramic plate 242 are suitably selected, whereby an unprecedented novel effect can be obtained.

Figure 43:
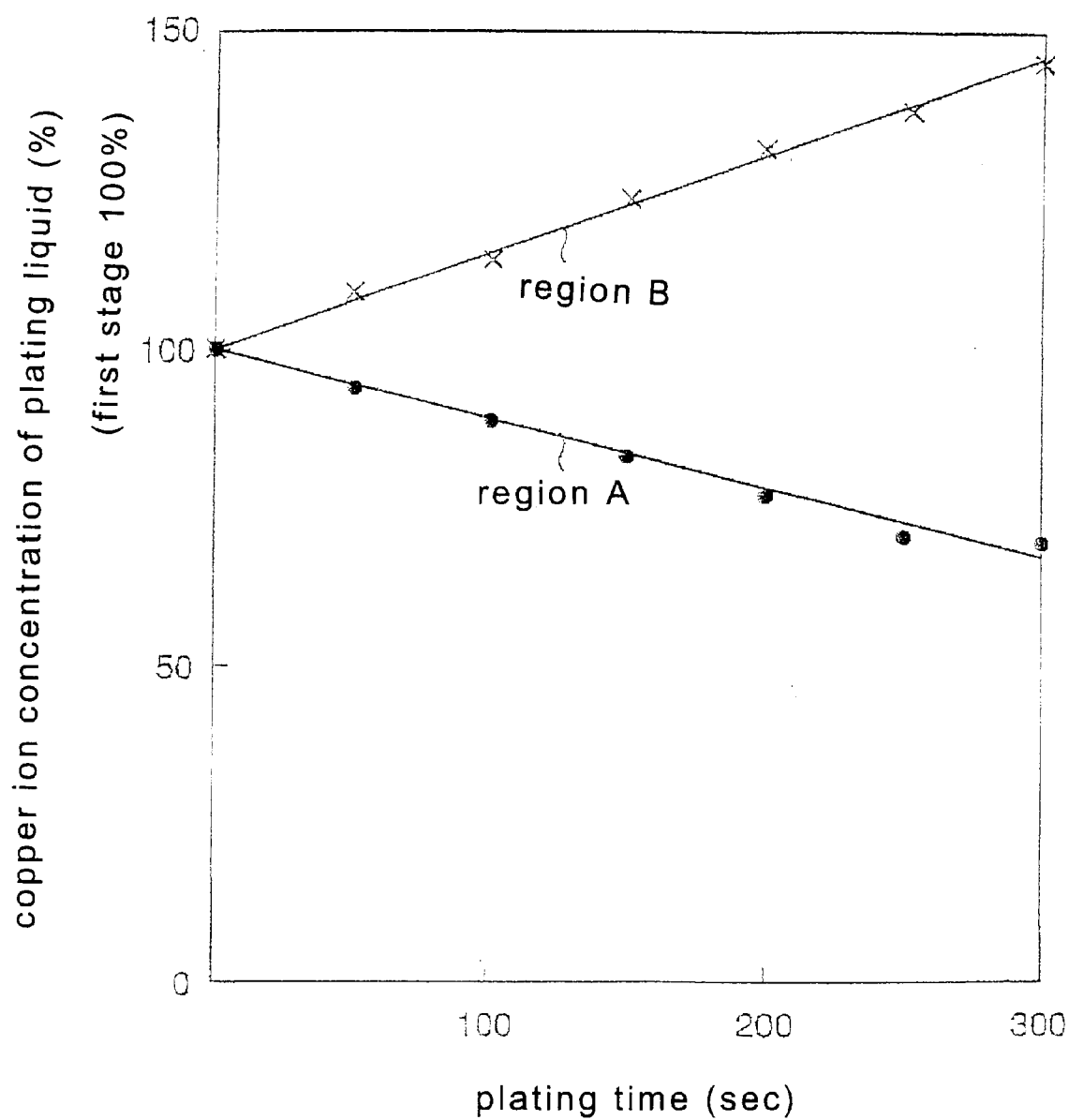
FIG. 43 is a graph showing changes in the copper ion concentration of the plating liquid in a region A and a region B when plating treatment was performed by use of the plating apparatus shown in FIG. 42.

FIG. 43 shows changes in the copper ion concentration of the plating liquid 210 when plating treatment for 300 seconds (2 μm) was performed by use of the electroplating apparatus of this embodiment. In FIG. 43, a region A represents data on the plating liquid 210 within the plating chamber 244 between the porous ceramic plate 242 and the substrate W, while a region B represents data on the plating liquid 210 within the plating chamber 246 between the anode plate 238 and the porous ceramic plate 242.

As shown in FIG. 43, in the region A, the copper ion concentration decreases as plating proceeds. The decrease rate agrees with the theoretical values of the copper ions consumed on the substrate surface by plating. In the region B, on the other hand, the copper ion concentration increases, and the increase rate agrees with the theoretical values of the copper ions generated on the anode plate.

From the above facts, it is seen that copper ion exchange minimally takes place between the region A (plating chamber 244) and the region B (plating chamber 246) sandwiching the porous ceramic plate 242, showing that the porous ceramic plate 242 behaves like a diaphragm. In other words, the reaction occurring on the anode side does not affect the substrate side.

Normally, special considerations should be given to the anode during copper electroplating. First, phosphorus-containing copper should be used as the material for anode, out of the necessity for forming a gluey black-colored film, called black film, on the surface of the anode for capturing monovalent copper ions generated from the anode. This black film is said to be a composite of copper, phosphorus and chlorine, and acts to feed only divalent copper ions into the plating liquid and capture monovalent copper ions which become the cause of abnormal precipitation on the plating surface.

According to the plating apparatus of this embodiment, copper ion exchange between the regions above and below the porous ceramic plate 242 does not occur, as clear from FIG. 43. Thus, such considerations become unnecessary. Moreover, the anode plate 238 of copper electrolytically wastes away in accordance with plating, and its surface may fall off. The falling-off matter is captured by the porous ceramic plate 242, and does not deposit on the plated surface of the substrate W. Furthermore, instead of using a dissolvable copper anode as anode, there can be used an undissolvable anode, for example, having iridium oxide coated on the surface of titanium. In this case, a large amount of an oxygen gas is generated on the surface of the anode. However, the occurrence of a defect, such as part of the plated film falling off, can be eliminated by preventing this oxygen gas from arriving at the surface of the substrate.

As described above, the diaphragm effect can be obtained by introducing a suitable substance having a low electrical conductivity into the plating liquid, and arranging this substance between the anode and the cathode uniformly so as to separate the anode and the cathode.

Figure 44:
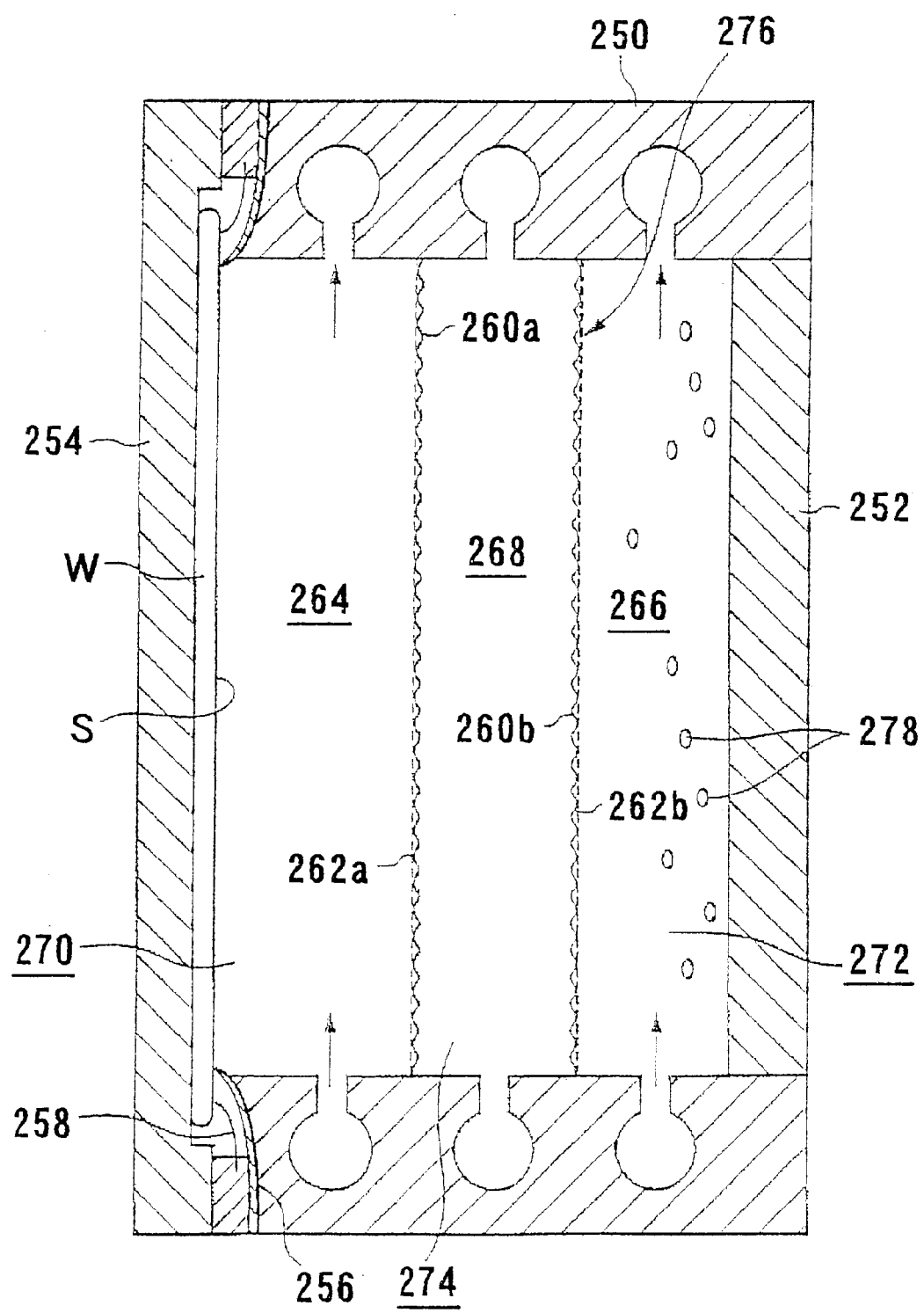
FIG. 44 is a schematic view of an essential part of an electrolytic treatment apparatus applied to an electroplating apparatus according to still another embodiment of the present invention.

FIG. 44 shows an electrolytic treatment apparatus applied to a gold electroplating apparatus according to still another embodiment of the present invention. This plating apparatus includes a box-shaped plating tank 250. One opening end of this plating tank 250 is closed, for example, with an undissolvable anode plate 252 having a titanium base material coated with iridium oxide, while the other opening end thereof is openably and closably closed with a cover body 254 holding a substrate W on the plating tank 250 side. At an end portion of the cover body 254 facing the plating tank 250, a lip seal 256 is provided for making pressure contact with the substrate W, and inhibiting outflow of the plating liquid 210 from this site. Outwardly of the lip seal 256, contacts 258 are provided for contacting a conductive layer S of the substrate W to introduce a cathode potential into the substrate W.

Inside the plating tank 250, two diaphragms 260a, 260b are placed and held by meshes 262a, 262b, which are provided beforehand in the plating tank 250, so as to separate the substrate W and the anode plate 252. As the diaphragms 260a, 260b, a strongly acidic cation exchange membrane, e.g., Tokuyama's CMS or Du Pont's N-350, is used.

As a result, a plating chamber 264 facing the substrate W, an electrolytic solution chamber 266 facing the anode plate 252, and a high resistance electrolytic solution chamber 268 sandwiched between the diaphragms 260a and 260b are partitioned and formed inside the plating tank 250. Furthermore, individual liquid circulation paths are provided with each of these chambers 264, 266 and 268.

A plating liquid 270, for example, based on gold potassium cyanide is introduced into the plating chamber 264, and an electrolytic solution (plating liquid) 272, for example, comprising an aqueous solution of sulfuric acid (80 g/l) is introduced into the electrolytic solution chamber 266. These liquids are circulated, for example, at a rate of 20 liters per minute. A high resistance electrolytic solution 274 with low electrical conductivity, which comprises, for example, an aqueous solution of diluted sulfuric acid (10 g/l), is introduced into the high resistance electrolytic solution chamber 268, without being subject to restrictions by plating treatment. By this arrangement, a high resistance structure 276 is constituted.

As described above, the high resistance structure 276, constituted by filling the high resistance electrolytic solution 274, such as an aqueous solution of diluted sulfuric acid, into the high resistance electrolytic solution chamber 268 partitioned by the two diaphragms 260a and 260b, is interposed between the plating liquids 270 and 272, whereby the plating resistance of the entire system can be increased, and the film thickness distribution of the gold plated film over the surface of the substrate due to the resistance of the conductive layer can be decreased markedly. In this embodiment, moreover, the resistance value of the plating system can be selected arbitrarily by changing the concentration of the diluted sulfuric acid solution, so that the plating conditions can be changed, as desired, according to the type of plating, status of the substrate, and so on.

This plating apparatus forms a plated film by holding the substrate W by the cover body 254, closing the cover body 254, introducing the plating liquid 270 into the plating chamber 264 and the electrolytic solution (plating liquid) 272 into the electrolytic solution chamber 266, circulating these liquids, respectively, filling the high resistance electrolytic solution chamber 268 with the high resistance electrolytic solution 274, and flowing a plating current between the anode plate 252 and the conductive layer S on the substrate W from an external power source (not shown), while keeping these states. An oxygen gas 278 generating on the surface of the anode plate 252 is discharged to the outside together with the electrolytic solution (plating liquid) 272.

In this embodiment as well, the same effect can be obtained by making the distance between the anode plate and the substrate very great to heighten the electrical resistance of the plating liquid per se. However, doing so makes the apparatus huge, and also expensive gold potassium cyanide for gold plating has to be used in a massive amount. Thus, industrial disadvantage becomes great.

In the above embodiment, the disk-shaped substrate is used as the substrate to be treated, but the substrate need not necessarily be disk-shaped, and needless to say, may be rectangular.

According to the electrolytic treatment apparatus of this embodiment, the electrical resistance between the anode and the cathode immersed in the electrolytic solution is made higher via the high resistance structure than that when the interior comprises the electrolytic solution alone. Thus, the difference of the current density over the surface of the substrate due to the electrical resistance on the surface of the substrate to be treated can be made small, so that the uniformity over the surface of the substrate to be treated by electrolytic treatment can be increased further.

[Embodiment Using Insulating Member as Electric Field State Control Means]

Figure 45:
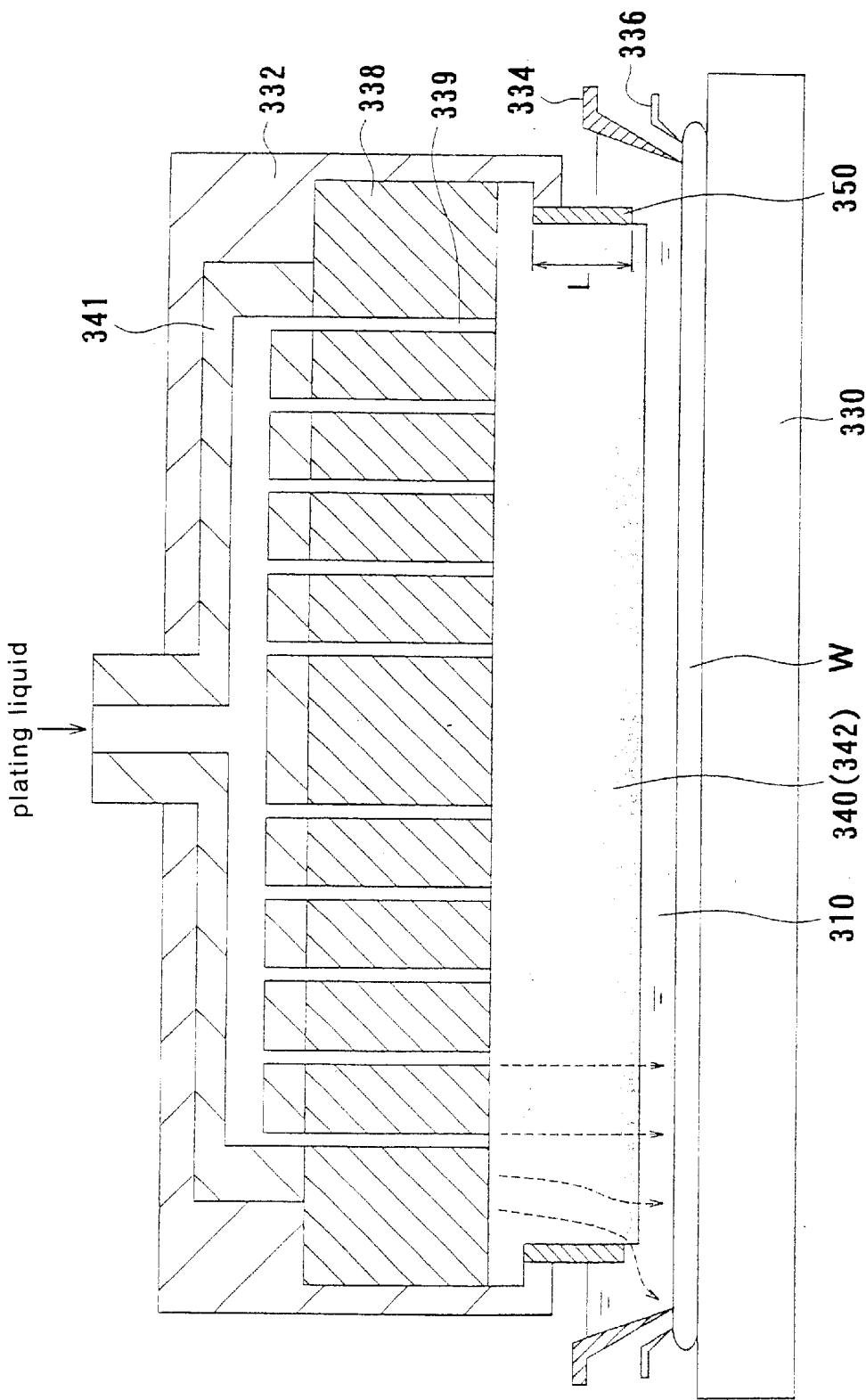
FIG. 45 is a schematic drawing of an electroplating apparatus according to still another embodiment of the present invention.

FIG. 45 is a schematic constitution drawing of an electroplating apparatus according to still another embodiment of the present invention. The electroplating apparatus shown in FIG. 45 is an electroplating apparatus adopting a so-called face-up system, and a substrate W is placed face upward on a substrate placing stand 330. The periphery of the substrate W is in contact with, and sealed with, the front end of a lip seal 334 formed like a ring. A plating liquid 310 is filled inwardly of the lip seal 334. Outwardly the lip seal 334 located on the face side of the substrate W, contacts 336 are disposed in contact with an conductive layer on the surface of the substrate W to apply a cathode potential to the substrate W.

Above the substrate W, a disk-shaped high resistance structure 340 and a disk-shaped anode plate 338 are arranged via a predetermined gap, and held by a holding member 332. The anode plate 338 is provided with many narrow holes 339 passing therethrough in the thickness direction. Above the anode plate 338, a plating liquid introduction pipe 341 for supplying a plating liquid to the narrow holes 339 in a distributed manner is installed.

The high resistance structure 340, in this embodiment, is constituted by holding the plating liquid 310 in a porous ceramic plate (e.g., a plate of SiC with a porosity of 20%, an average pore diameter of 50 Ωm, and a thickness of 10 mm) 342. The anode plate 338 is completely covered with the holding member 332 and the porous ceramic plate 342.

In the embodiment, a band-like insulating member 350 is wound around an outer peripheral side surface of a porous ceramic plate (porous substance) 342. As the material of the insulating member 350, an extensible material such as fluororubber is cited.

A plating liquid, which has been supplied under pressure from a plating liquid introduction pipe 341 to the porous ceramic plate 340 through the narrow holes 339 of an anode plate 338, permeates the interior of the porous ceramic plate 342 and is delivered from its lower surface. As a result, the interior of the porous ceramic plate 342 and a space between the substrate W and the porous ceramic plate 342 are filled with the plating liquid. Introduction of the plating liquid may be performed from a gap between a lip seal 334 and an end surface of the porous ceramic plate 342. In this case, neither the plating liquid introduction pipe 341 nor the narrow holes 339 of the anode plate 338 are necessary.

In this state, when a predetermined voltage is applied between the anode plate 338 and the substrate W to flow a direct current, plating (e.g. copper plating) is applied on the entire surface of the conductive layer of the substrate W. According to the present embodiment, the porous ceramic plate 342 is interposed between the anode plate 338 and the substrate W, and hence there is minimal influence due to the difference among the resistance values of the respective portions according to the difference in the distance from contacts 336 on the surface of the substrate W as stated above. Consequently, substantially uniform plating (e.g. copper plating) is applied on the entire surface of the conductive layer of the substrate W.

However, portions in the vicinity of the outer peripheral portion close to the contacts 336 are still high in current density, and tend to be thicker in plated film thickness than other portions.

In the present embodiment, therefore, an insulating member 350 is wound around the outer peripheral side surface of the porous ceramic plate 342 to prevent an electric current from concentrating at an area near the outer peripheral portion of the substrate W, as shown by dotted lines in FIG. 45, thereby decreasing the current density at such area and making it nearly equal to the current density directed toward the other portions of the substrate W.

Figure 46:
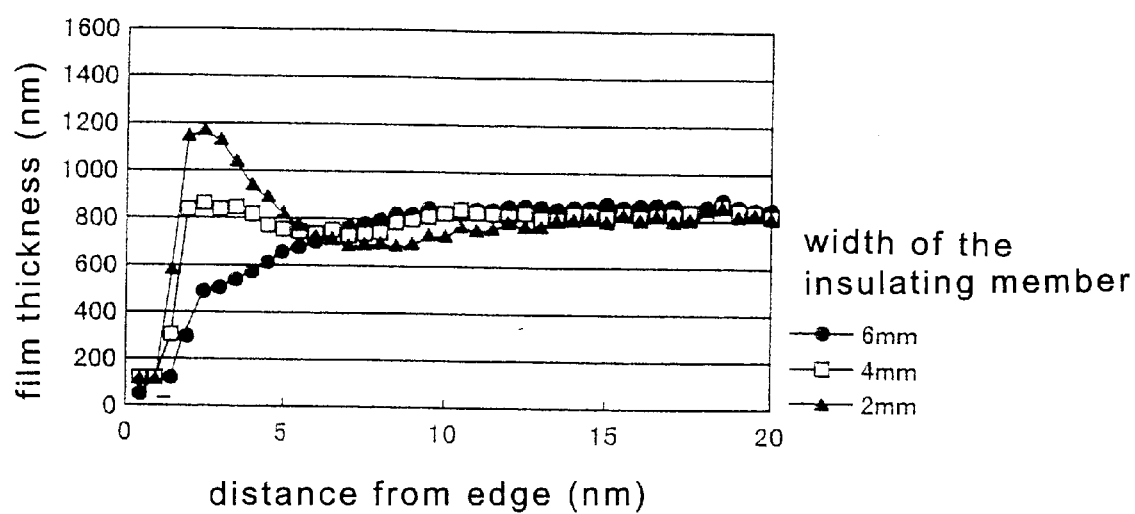
FIG. 46 is a view showing the results of measurement of the film thickness of copper plating in the vicinity of an outer peripheral portion of a substrate W when copper plating was performed on the substrate W.

FIG. 46 is a view showing the results of measurement of the film thickness of copper plating in the vicinity of an outer peripheral portion of a substrate W when copper plating was performed on the substrate W using the above-described method. As shown in FIG. 46, it is seen that the film thickness of copper plating in the vicinity of the outer peripheral portion of the substrate W is varied by changing the width L of the insulating member 350 (see FIG. 45). That is, as the width L increases, the current density in the vicinity of the outer peripheral portion of the substrate W lowers, and the plated film thickness decreases. Hence, the insulating member 350 having the desired width L (e.g., L=4 mm) is used, whereby the plated film thickness in the vicinity of the outer peripheral portion of the substrate W can be made the same as that in other portions. As noted from this, the insulating member 350 serves to adjust the shielding area of the outer peripheral side surface of the porous ceramic plate 340 by the length of the width L. However, the shielding area by the insulating member 350 may be adjusted not only by the width L, but also by boring holes in the shielding material per se.

The present invention is not necessarily used when making the plated film thickness in the vicinity of the outer peripheral portion of the substrate W the same as the plated film thickness in other portions. If it is desired to make the plated film thickness in the vicinity of the outer peripheral portion of the substrate W larger than in other portions, for example, the width L of the insulating member 350 may be made small. If an opposite case is desired, the width L may be made large. That is, according to this embodiment, the plated film thickness in the vicinity of the outer peripheral portion of the substrate W can be freely controlled to a desired value.

Figure 47:
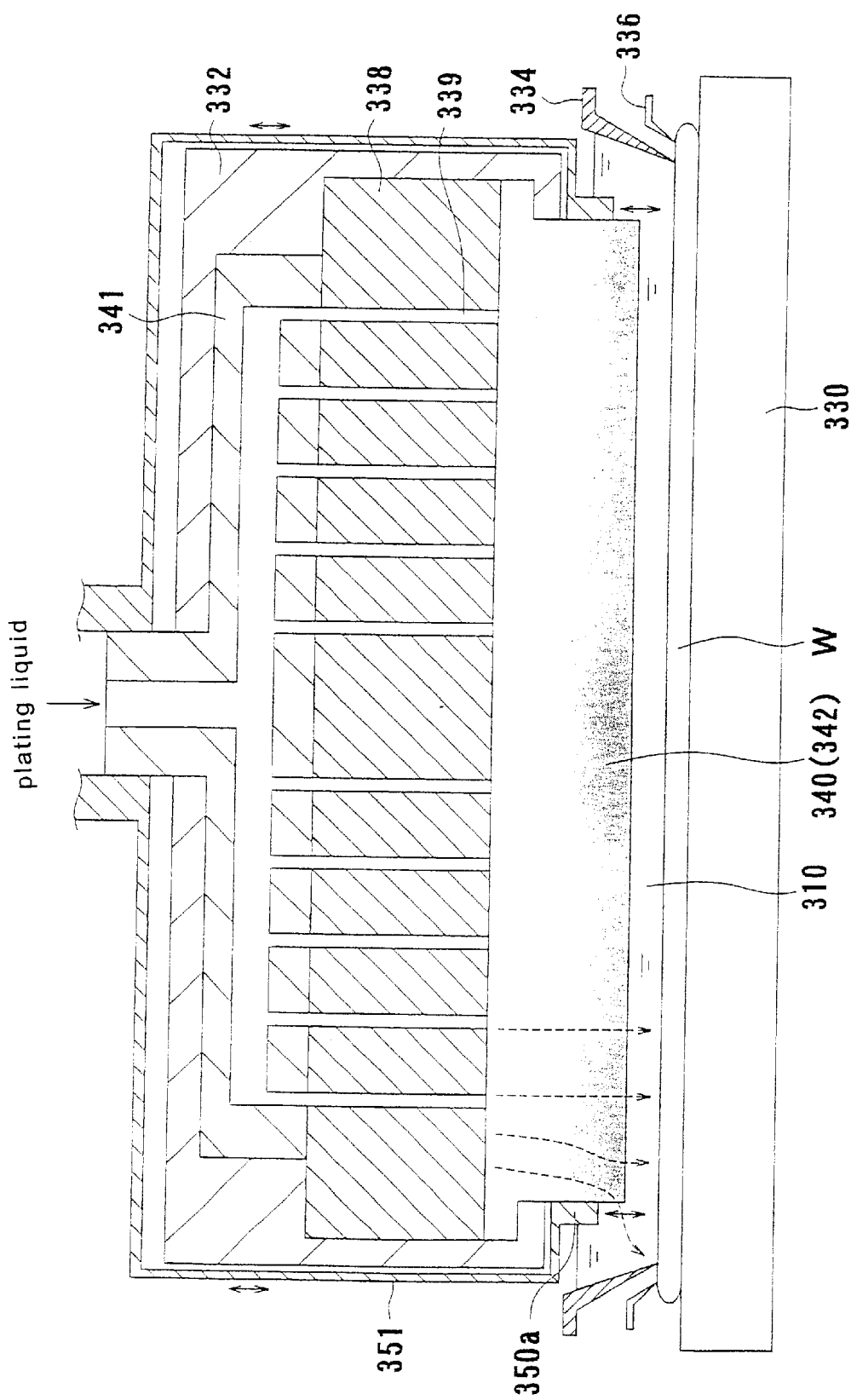
FIG. 47 is a view showing still another embodiment of the present invention.

FIG. 47 is a view showing still another embodiment of the present invention. The difference of this embodiment from the embodiment shown in FIG. 45 is that a movable, tubular insulating member 350a is installed on the outer periphery of the porous ceramic plate 342, instead of mounting the band-like insulating member 350. This insulating member 350a is provided at the lower end of an insulating member holder 351. The insulating member holder 351 is adapted to be movable upward and downward by an upwardly/downwardly moving drive mechanism (not shown). By so constituting, the position of the insulating member 350a is moved upward or downward to change its relative position against to the porous ceramic plate 342, thereby adjusting the exposure area of the outer peripheral side surface of the porous ceramic plate 342. By this measure, the current density in the vicinity of the outer peripheral portion of the substrate W can be arbitrarily controlled. Consequently, the plated film thickness in the vicinity of the outer peripheral portion of the substrate W can be adjusted arbitrarily, like the embodiment shown in FIG. 45.

Figure 48:
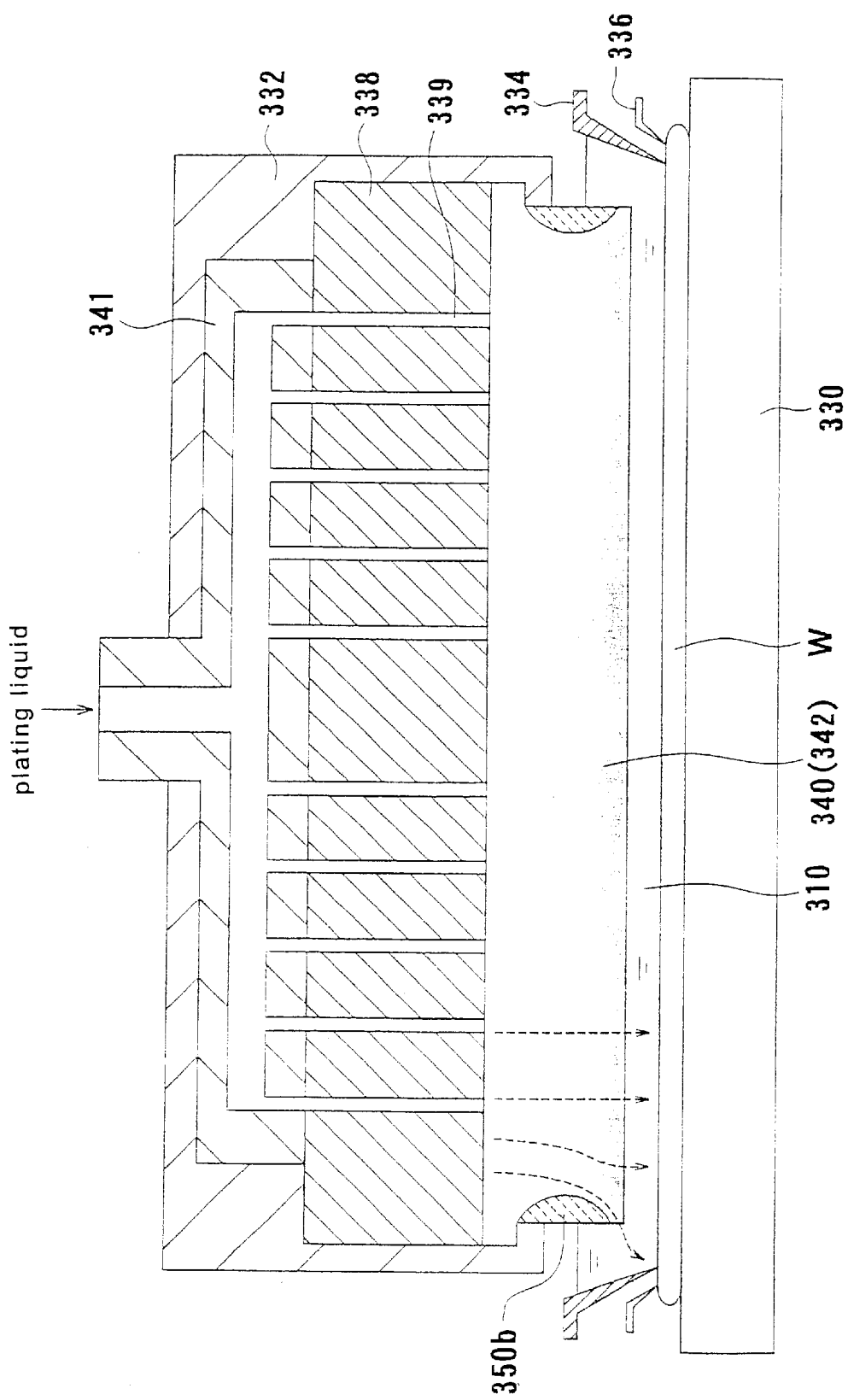
FIG. 48 is a view showing still another embodiment of the present invention.

FIG. 48 is a view showing still another embodiment of the present invention. The difference of this embodiment from the embodiment shown in FIG. 45 is that an insulating member 350b is provided by coating or permeating the outer peripheral side surface of the porous ceramic plate 342 with an insulating material, instead of mounting the band-like insulating member 350. For example, the insulating member 350b is provided by permeating the outer peripheral side surface of the porous ceramic plate 342 with an insulating material, such as glass, resin or silicone. In this case, the current density in the vicinity of the outer peripheral portion of the substrate W can be arbitrarily controlled by adjusting the width of permeating area and the distribution of the permeating depth. Consequently, the plated film thickness in the vicinity of the outer peripheral portion of the substrate W can be adjusted arbitrarily, like the embodiment shown in FIG. 45. Furthermore, it is also possible to control the current density by oxidizing part of the base material (e.g., SiC).

[Embodiment Using Seal Member]

Figure 49:
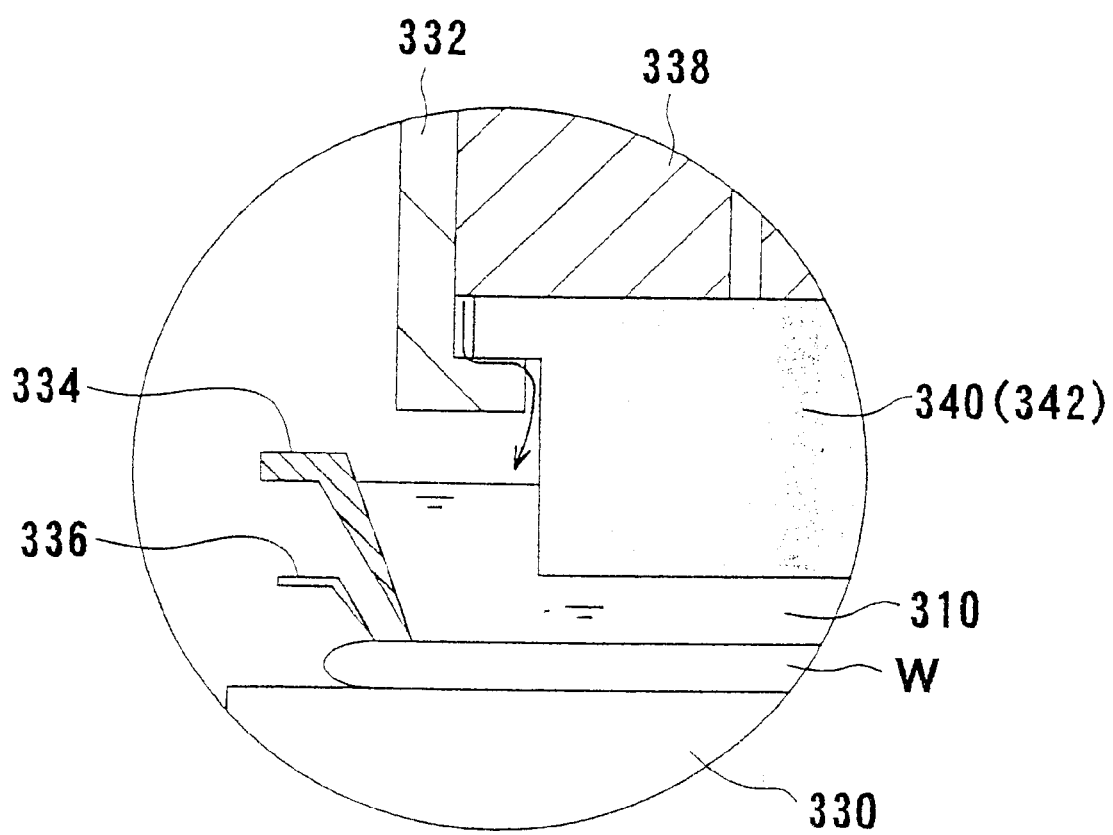
FIG. 49 is a schematic view of an essential part showing a portion close to an outer peripheral portion of a porous ceramic plate of the electroplating apparatus.

FIG. 49 is a schematic view of an essential part showing portions in the vicinity of the outer peripheral portion of a porous ceramic plate 342 of an electroplating apparatus having the same structure as that shown in FIG. 45. However, the insulating member 350 shown in FIG. 45 is not shown in this electroplating apparatus. In this electroplating apparatus, since a gap between a holding member 332 and the porous ceramic plate 340 is not sealed, a plating liquid flows out of the anode plate 338 through the gap between a holding member 332 and the porous ceramic plate 340 to form a passage for an electric current as shown by an arrow. Since this current passage is such a passage that current does not pass through the interior of the porous ceramic plate 340, its resistance value is small. Thus, the current density becomes so high that control for decreasing the plated film thickness in the vicinity of the outer peripheral portion of the substrate W may be impossible.

In this embodiment, therefore, a seal member 360 is provided between the porous ceramic plate 340 and the holding member 332, as shown in FIG. 50A. With this arrangement, leakage of the plating liquid from this portion is prevented so that the plated film thickness in the vicinity of the outer peripheral portion of the substrate W can be controlled so as to be small.

The seal member 360 in this embodiment has an inverted L-shaped cross section, and is composed of an insulating material, and thus the seal member 360 also serves as the insulating member shown in FIG. 45. The seal member 360, as its cross section is shown in FIG. 50B, may be constructed by attaching, as separate parts, an annular seal member portion 360a for sealing the portion at which the holding member 332 and the lower surface of the porous ceramic plate 340 are in contact with each other, and an insulating member portion 360b exhibiting the same function as the band-like insulating member 350 shown in FIG. 45.

The seal member 360, needless to say, can be applied to the respective embodiments other than the embodiment in FIG. 45. Specifically, more effective electric field control can be performed by jointly using the seal member 360 for preventing leakage of the plating liquid from a portion between the outer peripheral side surface of the high resistance structure 340 and the holding member 332, and electric field control means according to other various embodiments.

[Embodiment in Which a Portion Without a High Resistance Structure Interposed is Provided as Electric Field State Control Means in a Portion Between a Anode and a Substrate, where the Current Density is to be Increased]

Figure 51:
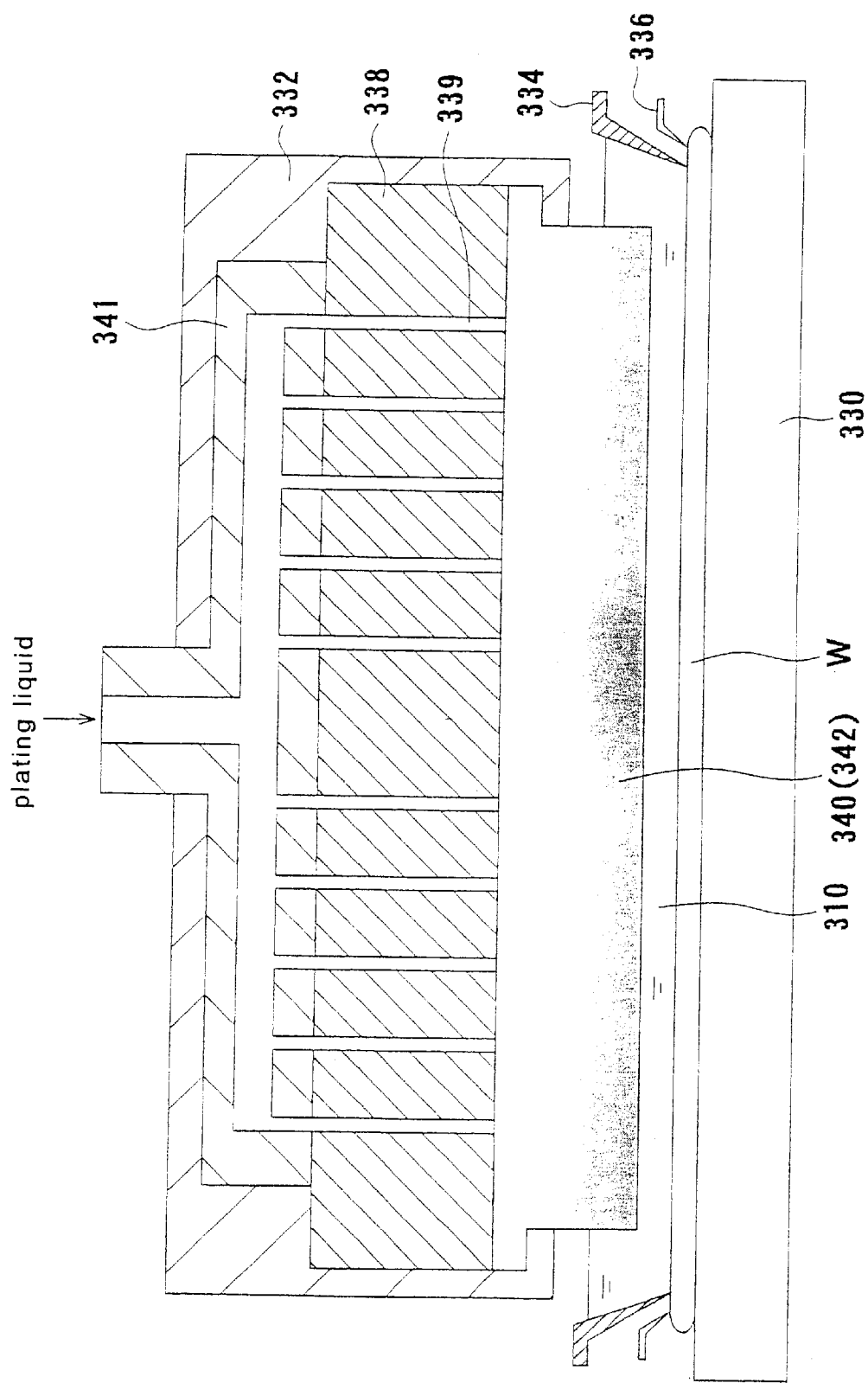
FIG. 51 is a view showing still another embodiment of the present invention.

FIG. 51 is a schematic constitution drawing of an electroplating apparatus according to still another embodiment. In FIG. 51, unlike the embodiment shown in FIG. 45, the insulating member 350 is not mounted on the outer periphery of the high resistance structure 340, but instead, the shape per se of the high resistance structure 340 is changed to control the plated film thickness.

Figure 52D:
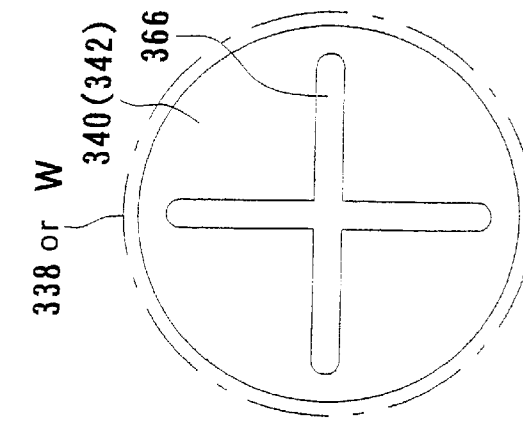
FIGS. 52A to 52D are plan views of high resistance structures used in the electroplating apparatus of FIG. 51.
Figure 52C:
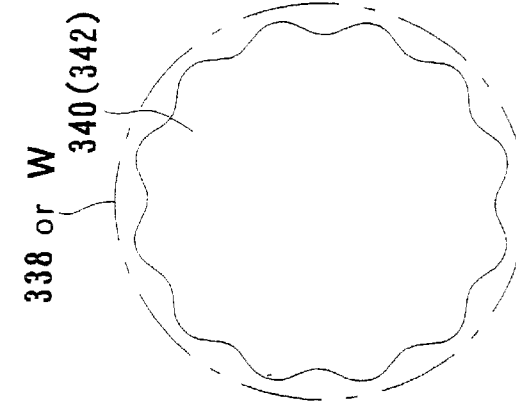
Figure 52B:
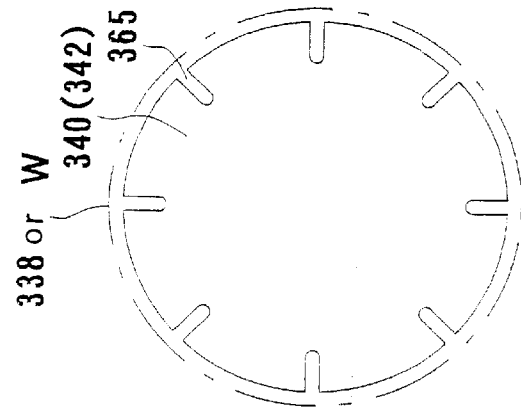
Figure 52A:
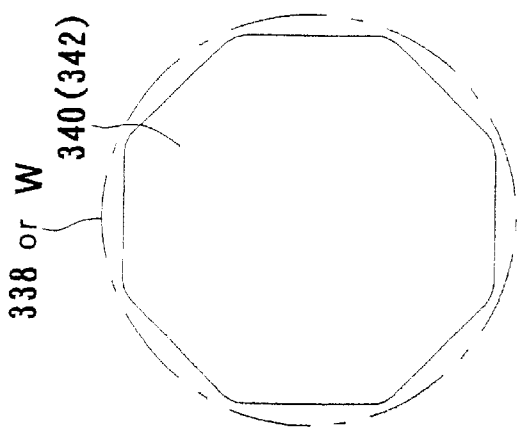

FIGS. 52A through 52D are plan views of the high resistance structure 340 used in the electroplating apparatus shown in FIG. 51. That is, the high resistance structure 340 in this embodiment is, for example, a porous ceramic plate 342. As shown in FIG. 52A, the outer peripheral shape of the porous ceramic plate 342 is polygonal, or as shown in FIG. 52B, the porous ceramic plate 342 is provided with slits 365 at predetermined intervals, or as shown in FIG. 52C, the porous ceramic plate 342 is wave-shaped (gear-shaped). On the other hand, the anode plate 338 and the substrate W are circular as indicated by a one-dot chain line, so that a portion, which is facing the anode plate 338, with only the plating liquid 310 interposed, without the porous ceramic plate 340 interposed, occurs near the outer periphery of the substrate W. In this portion, compared with the portion with the porous ceramic plate 340 interposed, the electrical resistance between the anode plate 338 and the substrate W lowers, and the electrical density in the outer peripheral portion of the substrate W increases. Hence, such embodiments can be utilized when it is desired to make the plated film thickness in the vicinity of the outer periphery of the substrate W larger than the plated film thickness near the center.

When the plated film thickness in other portions than the outer peripheral portion of the substrate W, such as the central portion of the substrate W, is controlled to be large, it is recommendable to provide a hole 366 inside the porous ceramic plate 342, as shown in FIG. 52D, thereby providing a portion where the porous ceramic plate 342 is not interposed between the anode plate 338 and the substrate W.

In the electroplating apparatus shown in FIG. 51, the substrate W is rotated, whereby plating with a uniform film thickness on the entire surface of the substrate W can be performed. Instead of rotation of the substrate W, or along with rotation of the substrate W, the holding member 332 side may be rotated. Permission of rotation of the substrate W and/or the holding member 332 is not restricted to the embodiment shown in FIG. 51.

[Embodiment in Which Distribution is Imparted to the Thickness of High Resistance Structure as Electric Field State Control Means]

Figure 53:
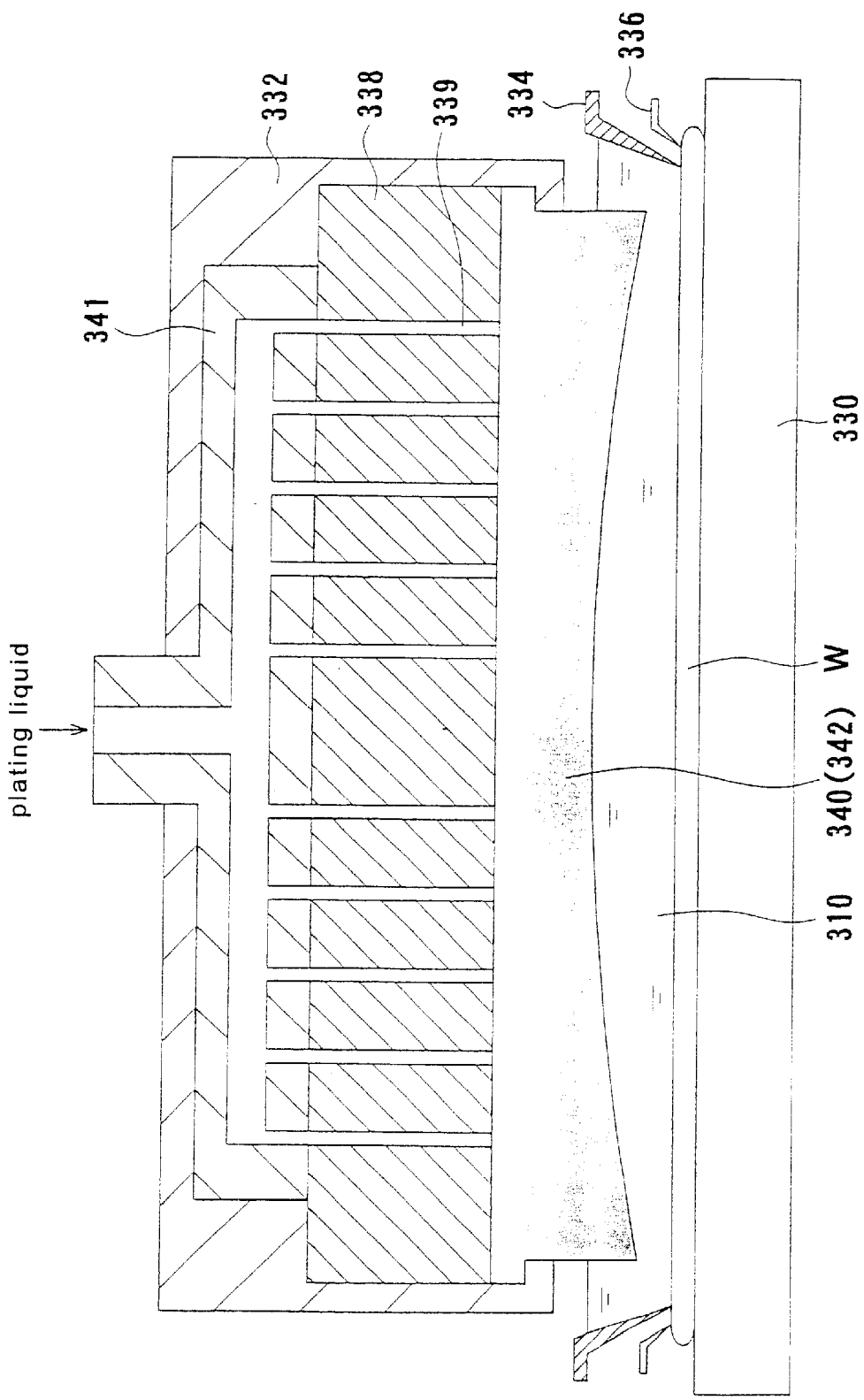
FIG. 53 is a view showing still another embodiment of the present invention.

FIG. 53 is a schematic constitution drawing of an electroplating apparatus according to still another embodiment of the present invention. In the electroplating apparatus shown in FIG. 53, a two-dimensional distribution is imparted to the thickness of the high resistance structure 342, whereby the current density distribution over the surface of the substrate W is controlled to be a desired one to control the plated film thickness. That is, in this embodiment, the high resistance structure 340 is, for example, a porous ceramic plate 342, and the porous ceramic plate 342 is circular and is adapted to be thinner at a central portion than at a peripheral portion. Because of this feature, the resistance value at the central portion between the anode plate 338 and the substrate W can be made lower than the resistance value at the peripheral portion. As described above, therefore, the plated film thickness, which tends to be smaller toward the center, can be controlled to be uniform.

Figure 54:
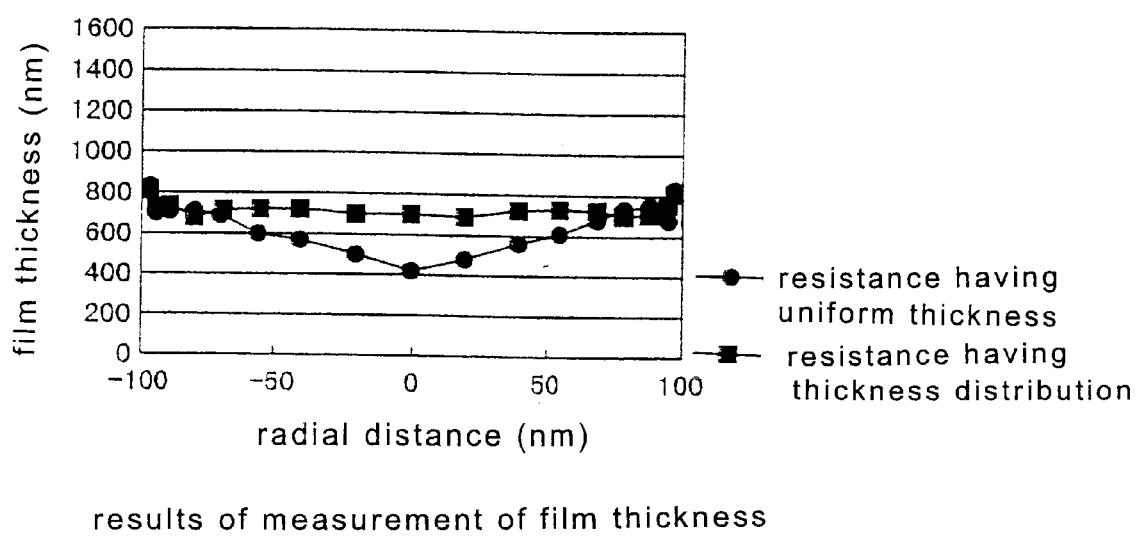
FIG. 54 is a view showing the results of measurement of the plated film thicknesses when plating was performed on the substrate W with the use of the porous ceramic plate having a uniform thickness and the porous ceramic plate having a thickness distribution as shown in FIG. 53.
Figure 55:
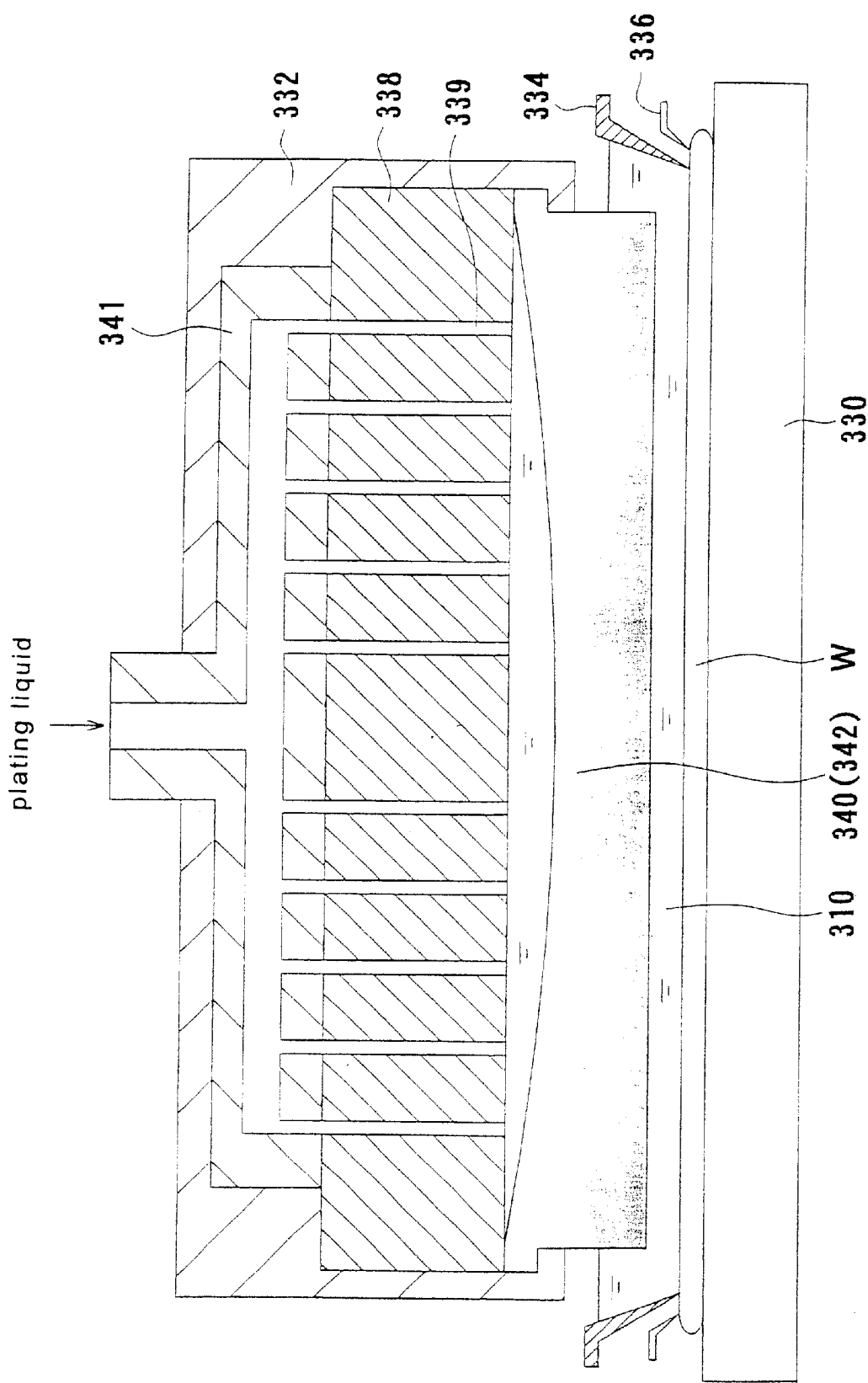
FIG. 55 is a view showing still another embodiment of the present invention.

FIG. 54 is a view showing a comparison of the measured values of the plated film thickness when plating was performed on the substrate W with the use of the porous ceramic plate 40 having a uniform thickness and the porous ceramic plate 40 having a thickness distribution as shown in FIG. 53. FIG. 54 shows that the use of the porous ceramic plate 342 shown in FIG. 53 achieves the uniformity of the plated film thickness on the substrate W. The same effect is obtained even when the porous ceramic plate 342 shown in FIG. 53 is installed with an inverted structure, as shown in FIG. 55.

Figure 56:
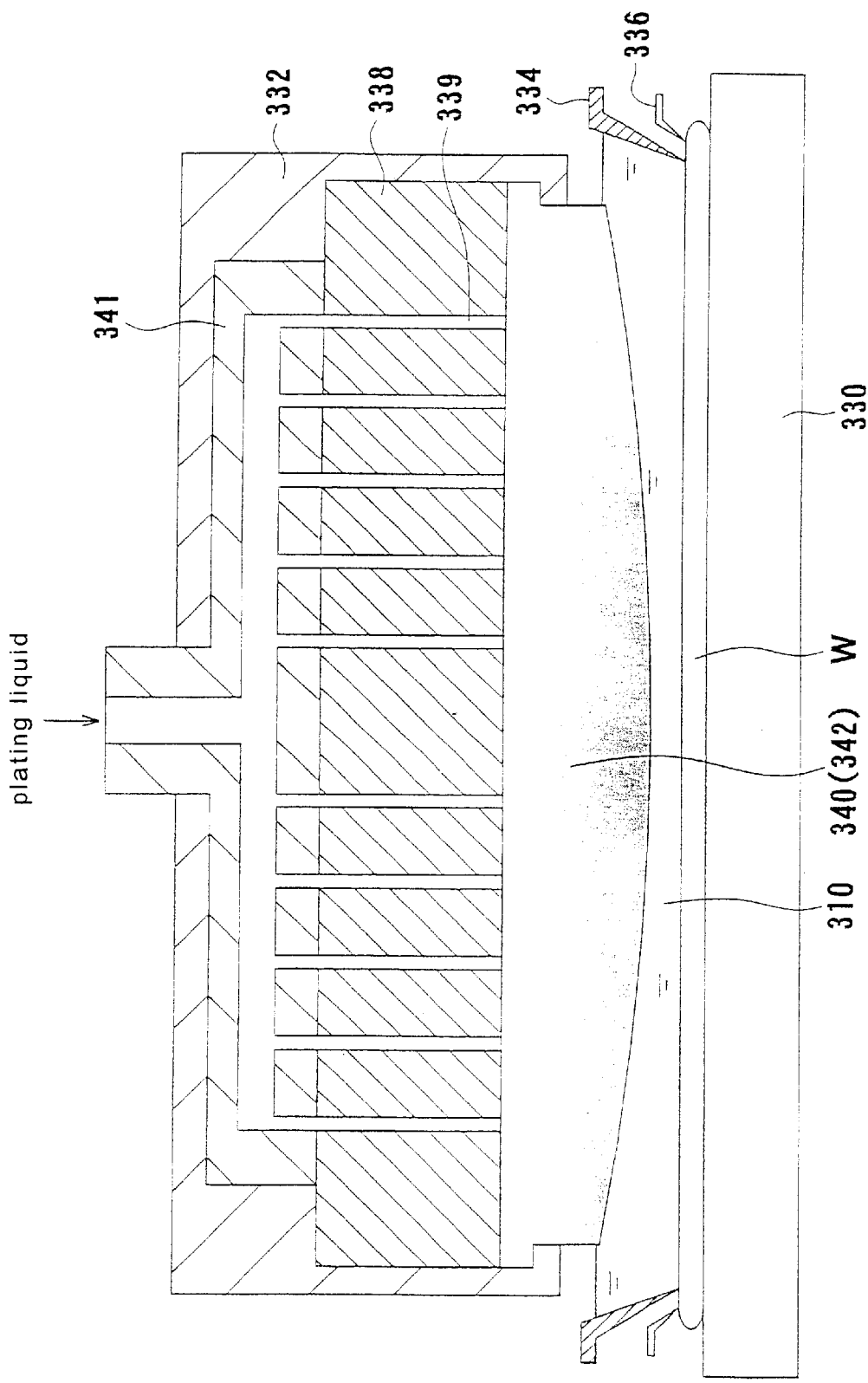
FIG. 56 is a view showing still another embodiment of the present invention.
Figure 57:
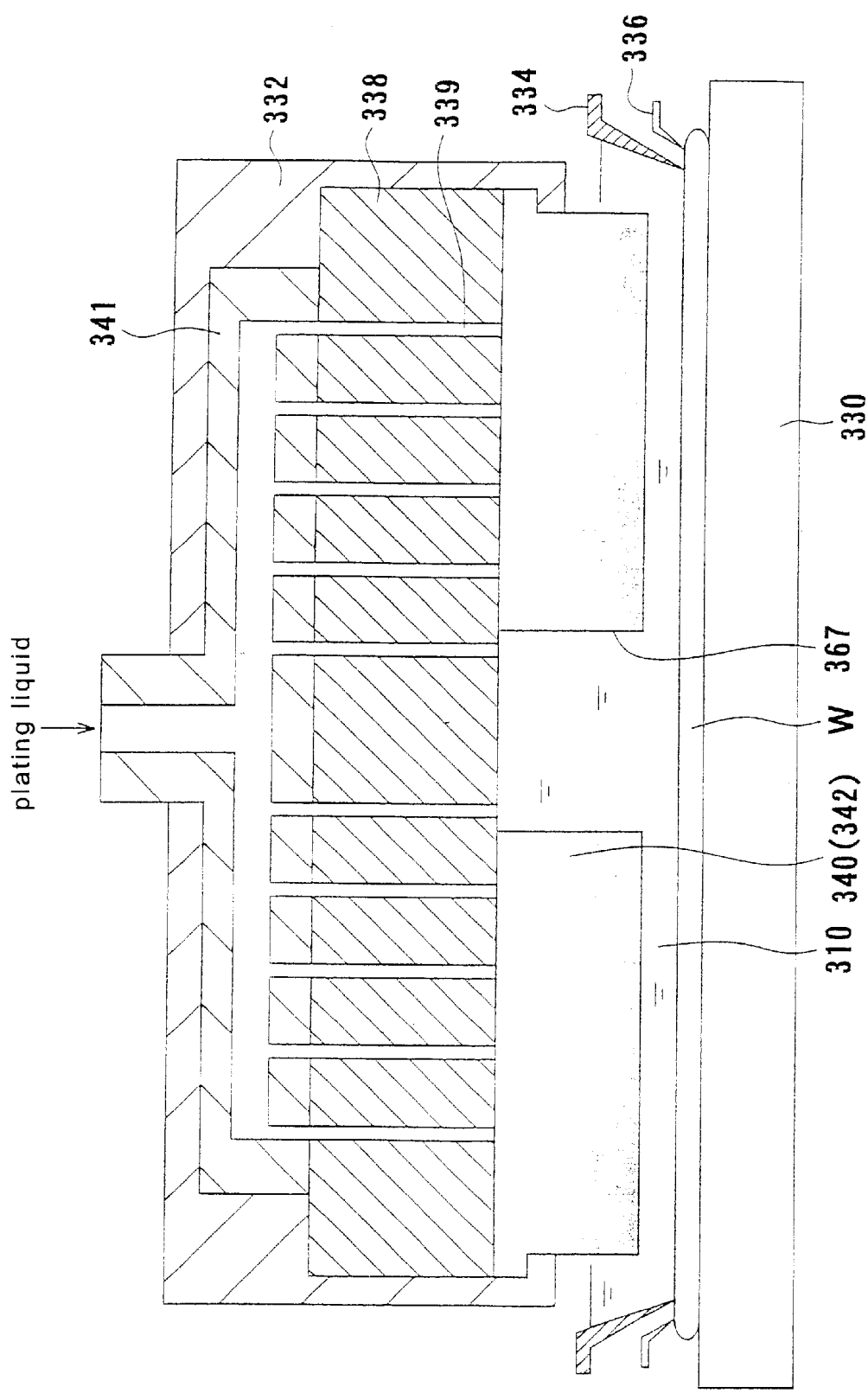
FIG. 57 is a view showing still another embodiment of the present invention.
Figure 58:
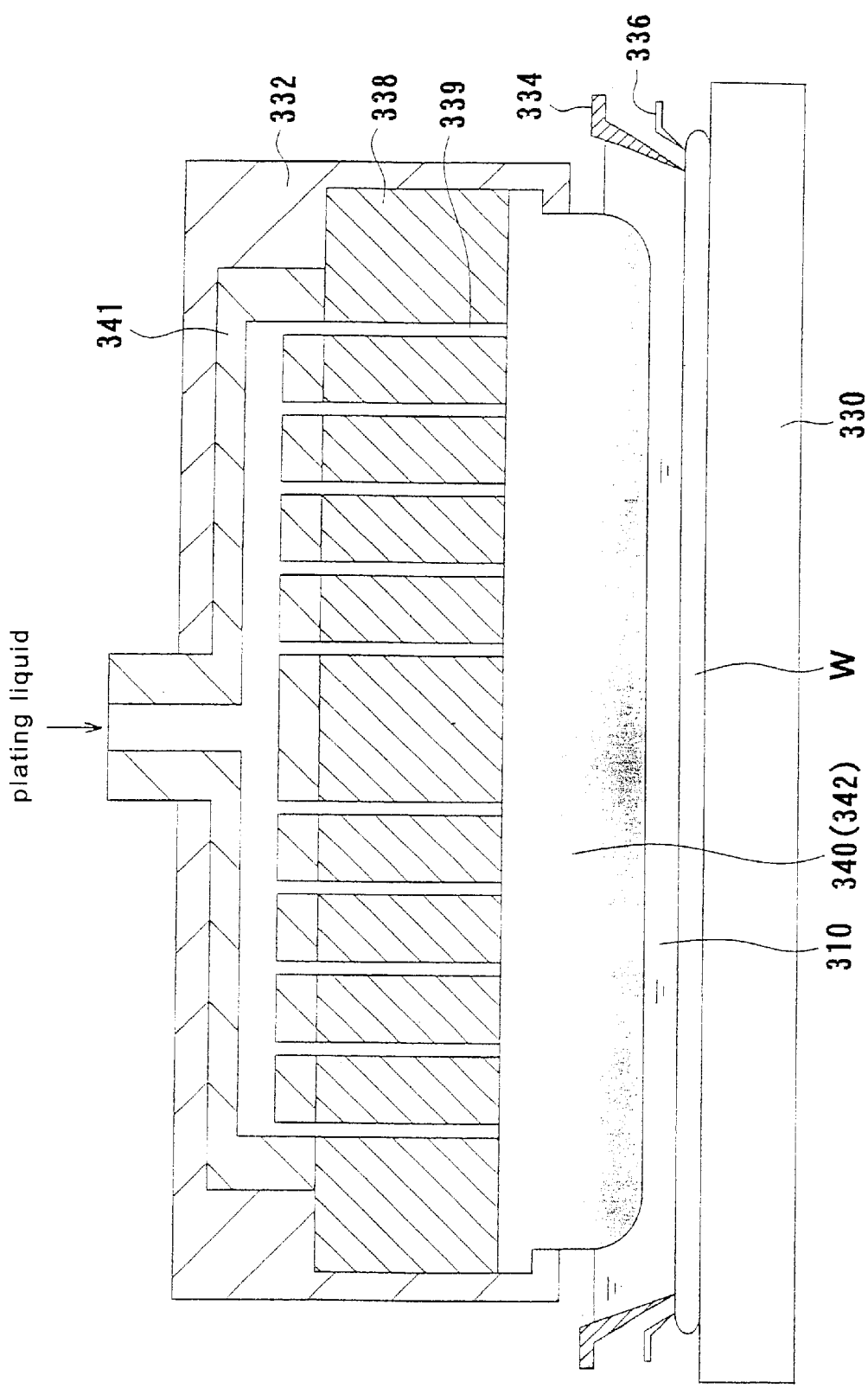
FIG. 58 is a view showing still another embodiment of the present invention.

Similarly, as shown in FIG. 56, the thickness of the porous ceramic plate 342 at the center is made larger than the thickness at the peripheral portion, whereby the plated film thickness at the peripheral portion can be made greater than at the central portion. Alternatively, as shown in FIG. 57, a through-hole 367 is provided in the porous ceramic plate 342, whereby the plated film thickness at the site where the through-hole 367 is provided may be larger than at other portions. Moreover, the plated film thickness in the vicinity of the outer periphery of the substrate W may be made smaller than at other portions by chamfering the outer peripheral corners of the porous ceramic plate 342, as shown in FIG. 58, to make the electrical resistance at this site lower than at other portions, whereby the plated film thickness at the peripheral portion can be made greater than at the central portion. In a word, it is possible to control the plated metal thickness at portions to desired one by imparting a distribution to the thickness (including thickness=zero) of the high resistance structure 342.

[Embodiment in Which Distribution is Imparted to Pore Structure of Porous Substance as Electrical Field State Control Means]

Figure 59:
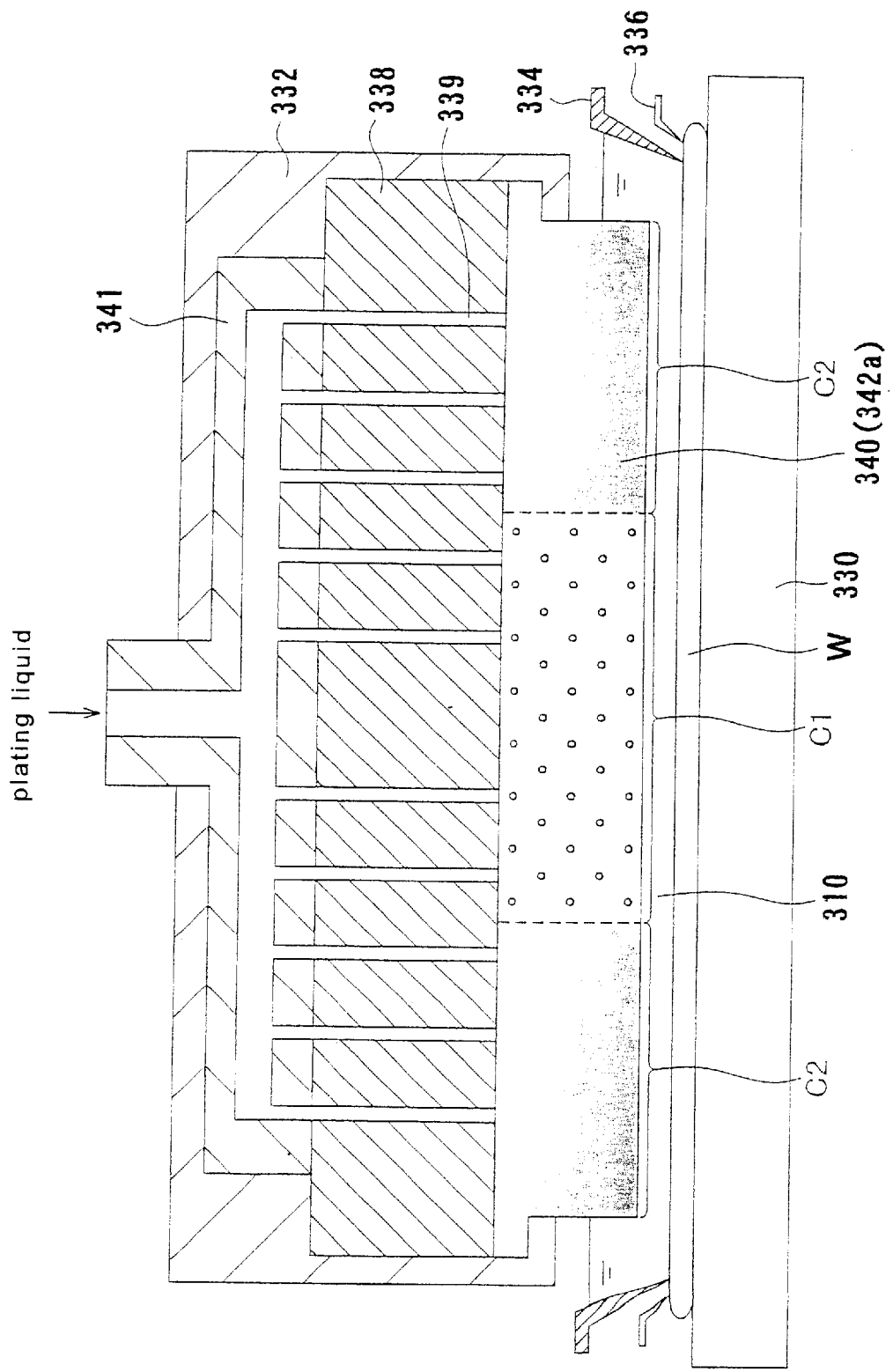
FIG. 59 is a view showing still another embodiment of the present invention.

FIG. 59 is a schematic constitution drawing of an electroplating apparatus according to still another embodiment of the present invention. In the electroplating apparatus shown in FIG. 59, a porous substance (e.g., porous ceramic) 342a with a pore structure having a two-dimensional or three-dimensional distribution is used as the high resistance structure 340. The porous substance 342a differs in the amount, and state of holding, of the plating liquid held therein, according to the diameter, number, state of arrangement, etc., of pores, and its resistance value varies accordingly. In this embodiment, therefore, the pore structure C1 in the vicinity of the center is made different from the pore structure C2 in the vicinity of the outer peripheral portion, and the pore structure C1 in the vicinity of the center is made lower in resistance. According to this constitution, the current density in the vicinity of the center increases, facilitating the formation of plating at this site. Needless to say, by contrast, the pore structure C2 in the vicinity of the outer peripheral portion can be made lower in resistance to make the plated film thickness in the vicinity of the outer periphery greater. Furthermore, three types or more of the pore structures may be used to perform more complicated control of the plated film thickness.

Figure 60A:
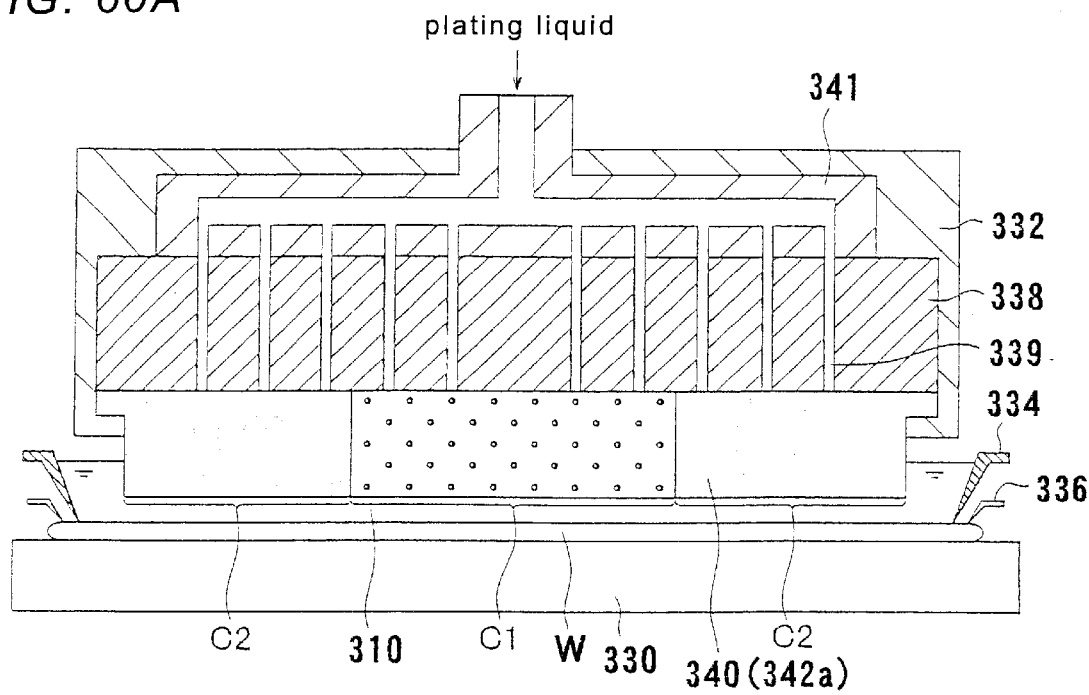
FIGS. 60A and 60B are views showing still another embodiments of the present invention.
Figure 60B:
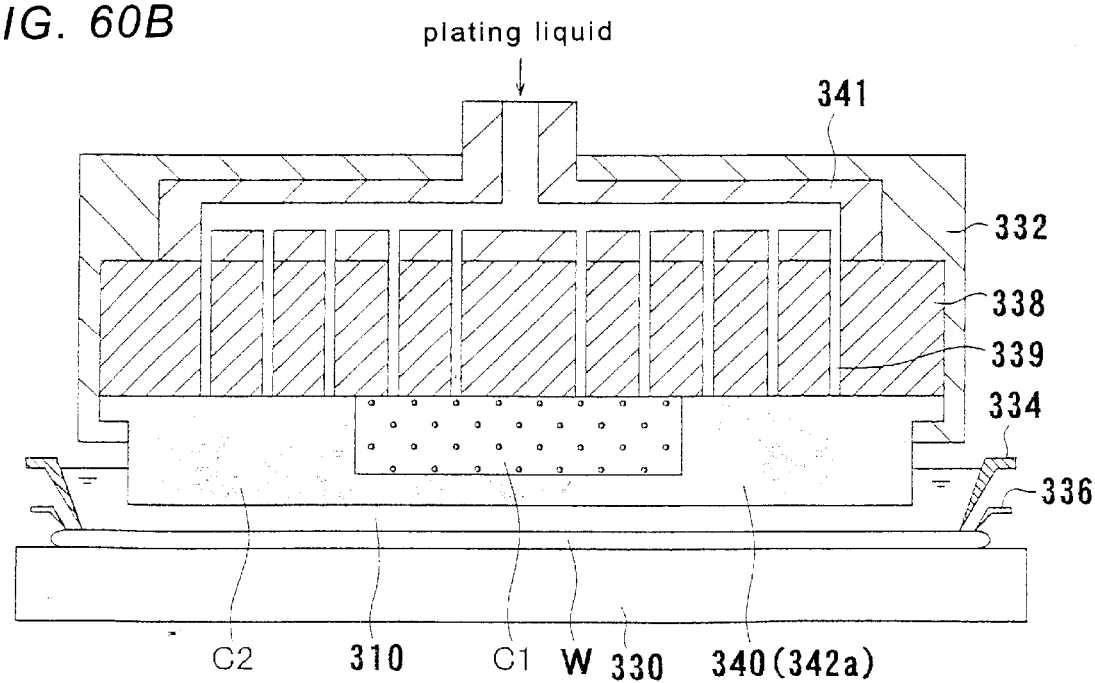

Methods of imparting distribution to the pore structure include a method of imparting the distribution during integral molding of the porous substance 342a as shown in FIG. 59, and a method of separately forming portions C1, C2 with different pore structures in the porous substance 342a, and then integrating them by assemblage, as shown in FIGS. 60A and 60B.

The elements of the pore structure are pore diameter (e.g., the diameter varying in the range of 50 to 400 $\Omega$m), continuous porosity (degree of air bubbles joined together . . . more joining decreases the resistance value), and flexing rate (degree of bending of the joined pores in the thickness direction . . . less bending decreases the resistance value).

To make the pore structure different, the material per se, for example, may be rendered different (e.g., resin-based material versus ceramic-based material). As means for controlling the distribution of the porosity of the porous substance 342a, sealing treatment of at least part of the surface or interior of the porous substance 342a (herein, porous ceramic) is available (a resin-based or silanol-based coating type insulating film is used, or SiC of a base material is partially oxidized, etc.). There is also a method in which after uniform sealing treatment of the entire surface, some sealed portions are opened to change the pore distribution in the surface.

Figure 61A:
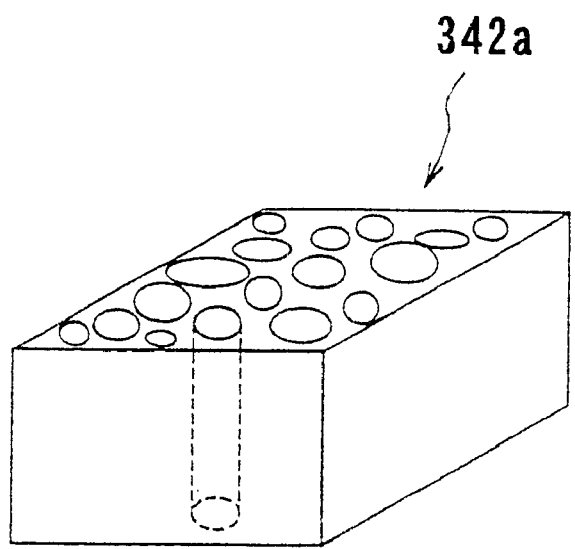
FIGS. 61A and 61B are views each showing an example of an anisotropic structural material.
Figure 61B:
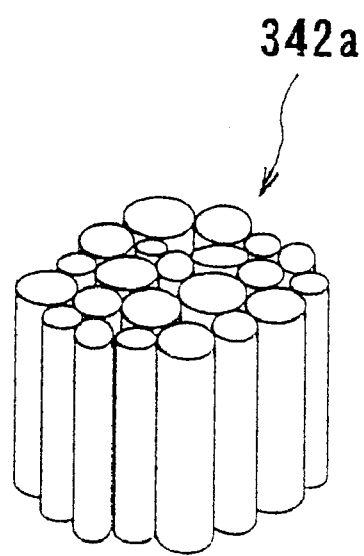

As materials for the porous substance 342a, anisotropic structural materials as shown in FIGS. 61A and 61B are also present. That is, they include a directional porous structural material as shown in FIG. 61A, and a fibrous porous structural material as shown in FIG. 61B. The materials constituting these anisotropic structural materials include resins and ceramics. In these anisotropic structural materials, the pores are joined together in a specific direction, and an electric current easily flows in the specific direction (electric current difficultly flows in other directions), so that controllability of the current density can be improved. By providing a difference between the pore structure C1 in the vicinity of the center and the pore structure C2 in the vicinity of the outer peripheral portion of the porous substance 342a with the use of the anisotropic structural material, the current density distribution applied to the surface of the substrate W can be formed into a desired one.

The embodiments of the present invention have been described above, but the present invention is not limited to these embodiments, but various modifications are possible within the scope of the claims and within the scope of the technical ideas described in the specification and drawings. Furthermore, any shapes or materials, which are not directly described in the specification and drawings, fall within the scope of the technical ideas of the present invention, if they exhibit the actions and effects of the present invention.

Figure 62:
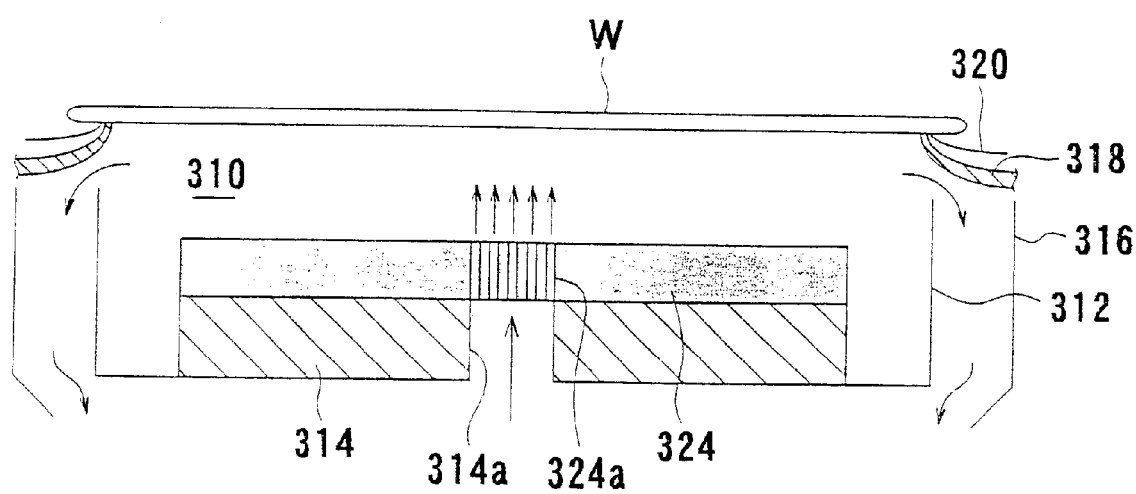
FIG. 62 is a view showing a face-down type electroplating apparatus according to still another embodiment of the present invention.

For example, the above embodiments have shown examples in which the present invention has been applied to so-called face-up type electroplating apparatuses, but the present invention is also applicable to a so-called face-down type electroplating apparatus as shown in FIG. 62. That is, this electroplating apparatus is constituted by including a cupshaped plating tank 312 for holding a plating liquid 310, installing a disk-shaped anode plate 314 at the bottom of the plating tank 312, installing a disk-shaped high resistance structure 324 on the plating tank 312, arranging a plating liquid receiver 316 around the plating tank 312 for recovering the plating liquid 310 that has overflowed from the top of the plating tank 312, further placing a substrate W on a lip seal 318 provided above the plating tank 312, and bringing contacts 320 into contact with the outer periphery of the lower surface of the substrate W.

A voltage is applied between the anode plate 314 and the substrate W to flow an electric current, while circulating the plating liquid through a through-hole 314a provided at the center of the anode plate 314 and small holes 324a provided at the center of the high resistance structure 24. As a result, a plated film is formed on the lower surface of the substrate W.

In the respective embodiments, moreover, an insulating member is mounted on the outer periphery of the high resistance structure 324, or the thickness of the high resistance structure is varied, or the pore structure thereof is changed, whereby the distribution of the plated film thickness formed on the substrate W can be made a desired distribution.

Figure 63:
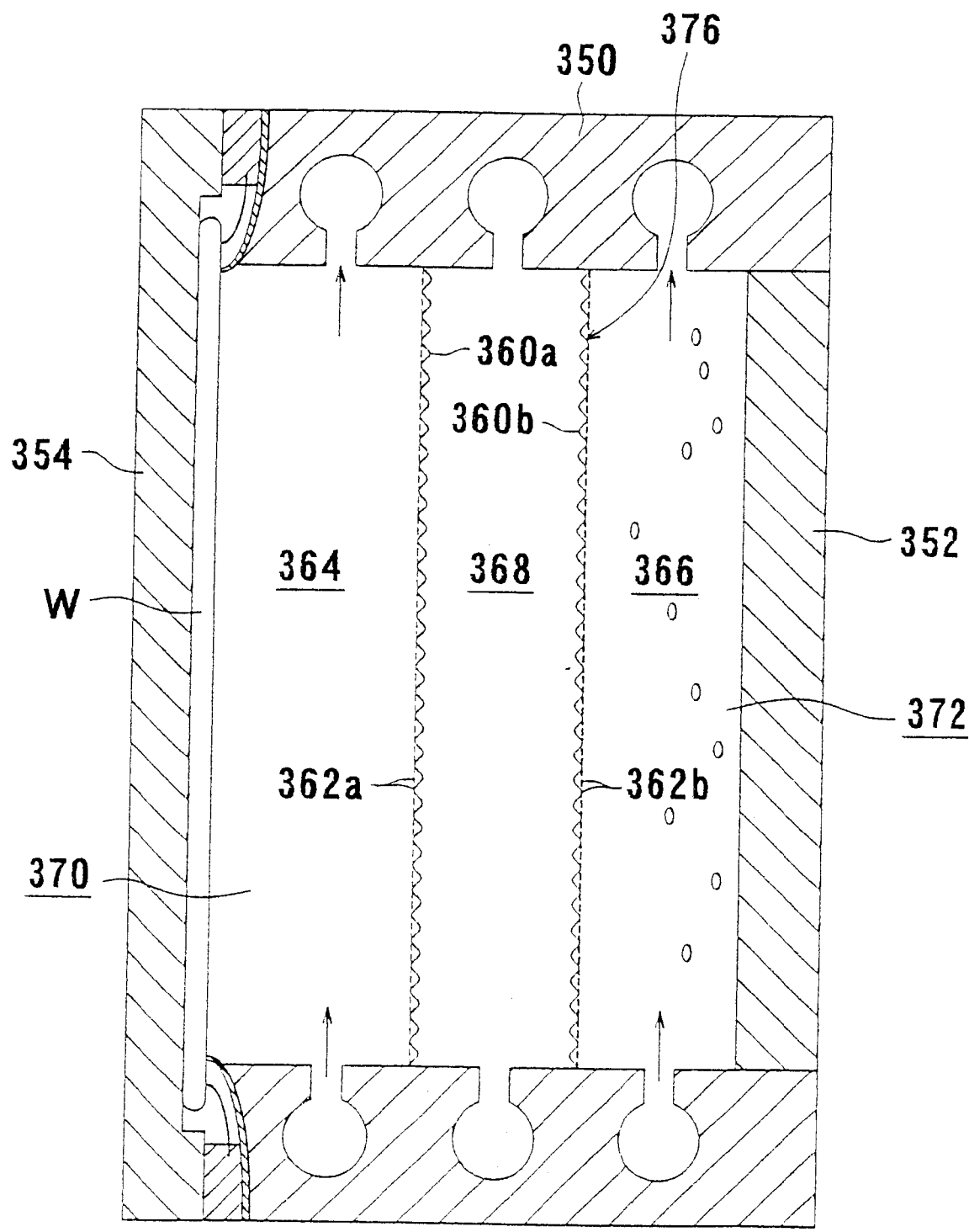
FIG. 63 is a view showing a closed type electroplating apparatus according to still another embodiment of the present invention.

Also, the present invention can be applied to a closed type electroplating apparatus as shown in FIG. 63. That is, this plating apparatus has a box-shaped plating tank 350. One opening end of this plating tank 350 is closed with a anode plate 352, while the other opening end thereof is openably and closably closed with a cover body 354 holding a substrate W on the plating tank 350 side. Between the substrate W and the anode plate 352, a high resistance electrolytic solution chamber 368 partitioned and formed by being sandwiched between two diaphragms 360a and 360b held by two meshes 362a and 362b is installed as a high resistance structure 376.

A plating liquid 370 is introduced into a plating chamber 364, and an electrolytic solution (plating liquid) 372 is introduced into an electrolytic solution chamber 366, respectively, and with these liquids being circulated, a voltage is applied between the anode plate 352 and the substrate W to flow an electric current. As a result, a plated film is formed on the substrate W.

As in the respective embodiments, moreover, an insulating member is mounted on the surface of the high resistance structure 376, or the surfaces of the meshes 362a, 362b are processed to change the shape, such as thickness, of the high resistance electrolytic solution chamber 368, whereby the distribution of the plated film thickness formed on the substrate W can be made a desired distribution.

As this sort of the diaphragms 360a, 360b, a strongly acidic cation exchange membrane, e.g., Tokuyama's CMS or Du Pont's N-350, is generally used. However, the selectivity of cations may be changed, or the exchange membrane may be an anion exchange membrane or a nonionic exchange membrane. The electrolyte used in the high resistance electrolytic solution chamber 368 is generally (50 to 200 g/l) $H_2SO_4$ is used, but it is a matter of course that an arbitrary concentration can be selected, and the electrolyte is not restricted to sulfuric acid.

Furthermore, it goes without saying that the present invention is applicable to electroplating apparatuses of other various structures (including both the face-up type and the face-down type). Besides, the above respective embodiments have shown examples of the present invention applied to electroplating apparatuses, but instead, the invention may be applied to an electrolytic etching apparatus using the substrate as anode.

In the above embodiments, a circular substrate to be treated has been used, and all the electric field distributions are shown in a concentric shape. However, the substrate to be treated may be of various shapes other than the circular one, and the electric field distribution may be a non-concentric shape, if necessary. For example, a plate-like one (including a shape other than a circle) such as LCD may be used as the substrate to be treated. The cathode contacts 336 may be ones, which contact the substrate to be treated, from one direction, in place of ring-shaped ones. Also, the cathode contacts 336 may be contacted with a position other than the outer periphery of the substrate to be treated.

By so actively controlling the state of the electric field of the surface of the member to be treated to be a desired state, the treated state by electrolytic treatment of the member to be treated can be brought to a treated state of the desired distribution over the surface.

[Embodiment in Which Pipe 445 is Inserted in the Electrolytic Solution Introduction Hole (Plating Liquid Introduction Hole) 439 of Anode Plate (Electrode) 438]

Figure 64:
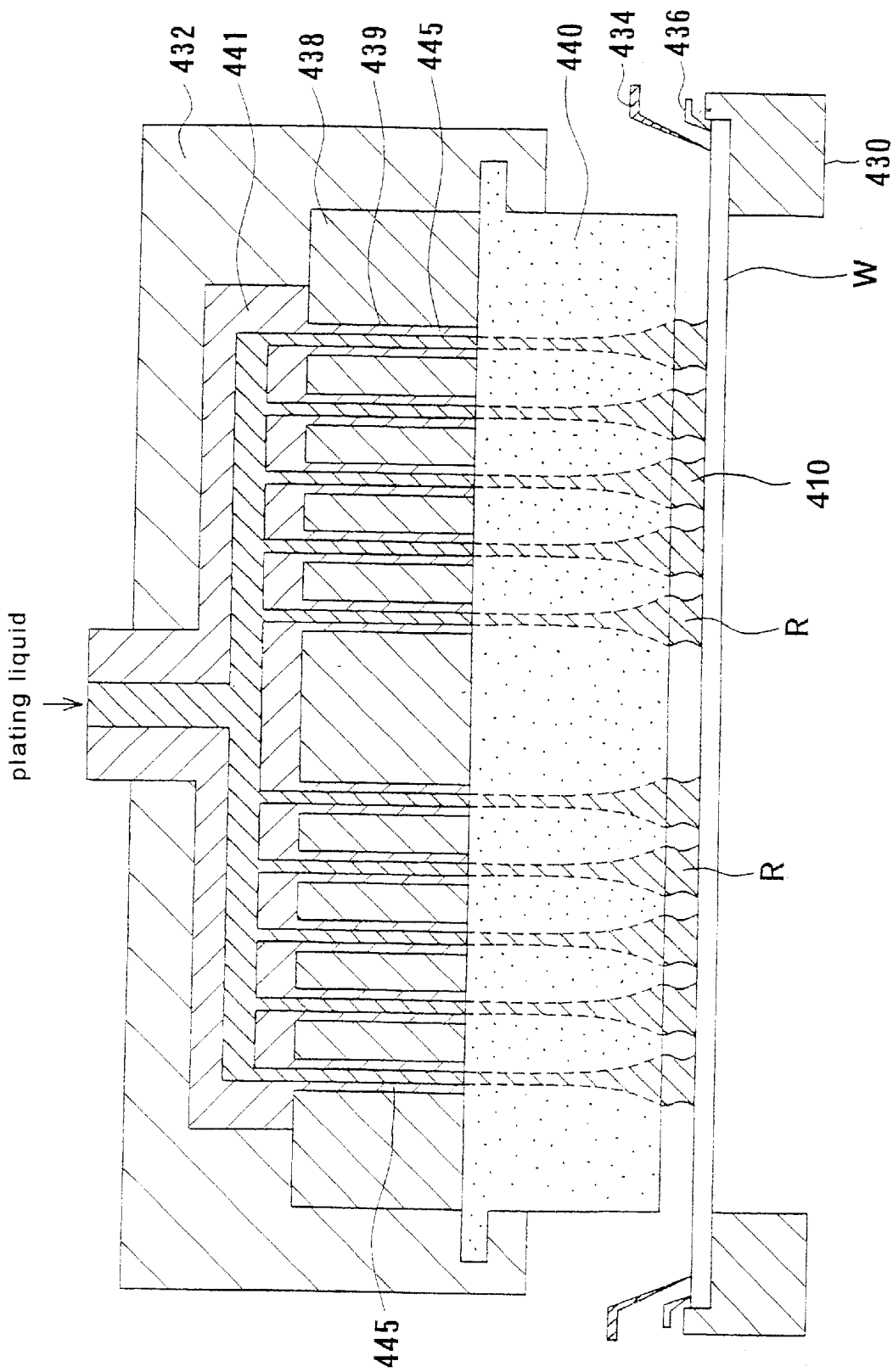
FIG. 64 is a schematic drawing of an electroplating apparatus according to still another embodiment of the present invention.

FIG. 64 is a schematic constitution drawing of an electroplating apparatus according to still another embodiment of the present invention. That is, this electroplating apparatus is an electroplating apparatus applying to so-called face-up type, in which a substrate W is placed on a substrate placing stand 430 so as to face upward. A front end of a ring-shaped lip seal 434 contacts the periphery of the surface of the substrate W to seal it. Outwardly of the lip seal 434 on the surface of the substrate W, contacts 436 are disposed for contacting a conductive layer on the surface of the substrate W to apply a cathode potential onto the substrate W. A disk-shaped porous body 440 and a disk-shaped anode plate 438 are disposed above the substrate W with a predetermined spacing therebetween, and held by a holding member 432. The anode plate 438 is provided with many plating liquid passing holes 439 passing therethrough in the thickness direction. A plating liquid introduction pipe 441 for supplying the plating liquid in a distributed manner is provided on the anode plate 438.

On the other hand, the porous body 440 is constituted of a porous ceramic material or a porous resin material. In this embodiment, the porous body 440 is an SiC plate, for example, having a porosity of 20%, an average pore diameter of 50 Ωm (of course, may be constituted of any other material, but desirably has a pore diameter of 20 to 300 Ωm and a porosity of 10 to 95%), and holding a plating liquid 410 therein, and self-holding it. Thus, the porous body 440 is adapted to pass electricity, but have a lower electrical conductivity than that of the plating liquid 410. The anode plate 438 is of a structure completely covered with the holding member 432 and the porous body 440.

In this embodiment, a plating liquid introduction pipe 441 is provided with pipes 445 communicating with a plating liquid introduction pipe 441 per se, the pipes 445 are inserted into plating liquid introduction holes 439 of anode plate 438, and the front ends of the pipes 445 are brought into contact with the surface of the porous body 440. That is, in this embodiment, the plating liquid can be supplied to the surface of the porous body 440 without causing the plating liquid to contact the anode 438 at all. The plating liquid introduction pipe 441 and the pipes 445 are integrally formed by a synthetic resin of a material which is not affected at all by the plating liquid.

The plating liquid, which has been directly supplied to the surface of the porous body 440 from the plating liquid introduction pipe 441 through the pipes 445, reaches the surface of the substrate W while the plating liquid is slightly diffusing in the porous body 440, and the plating liquid forms a plurality of circular plating liquid columns R between the substrate W and the surface of the porous body 440, and the plural plating liquid columns R bind to each other on the substrate W, thus filling the surface of the substrate W with the plating liquid.

Even when this plating step is repeated, the inner diameter of the front end of the pipe 445 does not increase with the passage of time, and hence the ideal plating liquid columns R do not collapse with the passage of time. Consequently, engulfment of air due to disturbance of binding of the plating liquid columns R does not take place. Air bubbles are not accumulated between the porous body 440 and the substrate W, and the plated film thickness does not become non-uniform.

Figure 65:
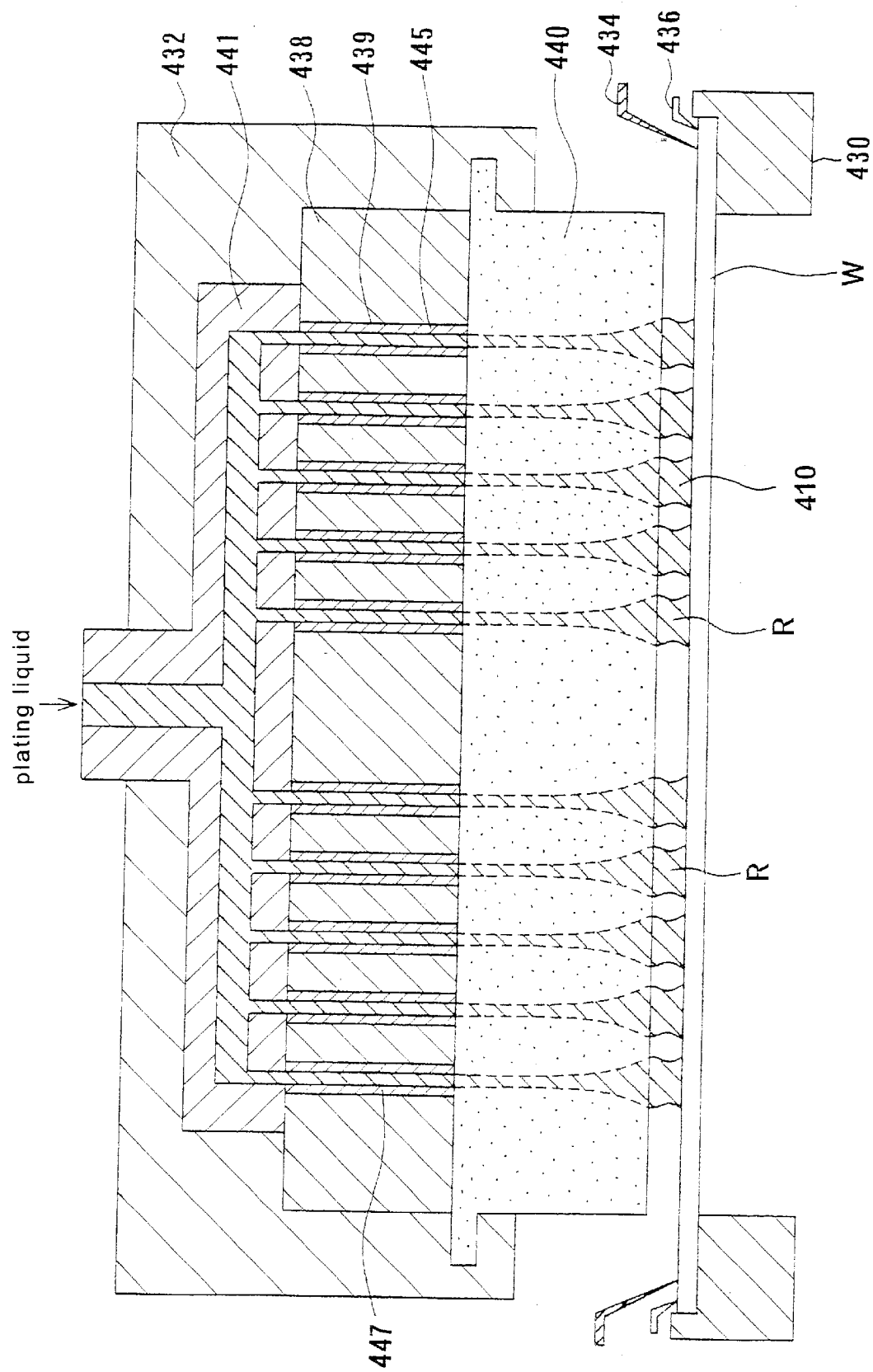
FIG. 65 is a schematic drawing of an electroplating apparatus according to still another embodiment of the present invention.

FIG. 65 is a schematic constitution drawing of an electroplating apparatus according to still another embodiment of the present invention. This electroplating apparatus differs from that in the embodiment shown in FIG. 64 in that instead of forming pipes 445 integrally with a plating liquid introduction pipe 441, separately prepared pipes 447 are inserted into plating liquid introduction holes 439 of the anode plate 438. In this case also, the pipes 447 are composed of a material that is not affected at all by the plating liquid, and the front ends (lower ends) of the pipes 447 are brought into contact with the upper surface of the porous body 440.

Even with this constitution, the plating liquid does not directly contact the anode plate 438 in the same manner as the embodiment shown in FIG. 64. Even when the plating step is performed repeatedly, the inner diameter of the front end of the pipe 447 does not increase with the passage of time. Thus, the plating liquid columns R supplied from the porous body 440 do not collapse with the passage of time, but can be always kept in the ideal state, and engulfment of air does not occur.

[Embodiment in Which Electrolytic Solution Passage Portions are Provided in Porous Body 440]

Figure 66:
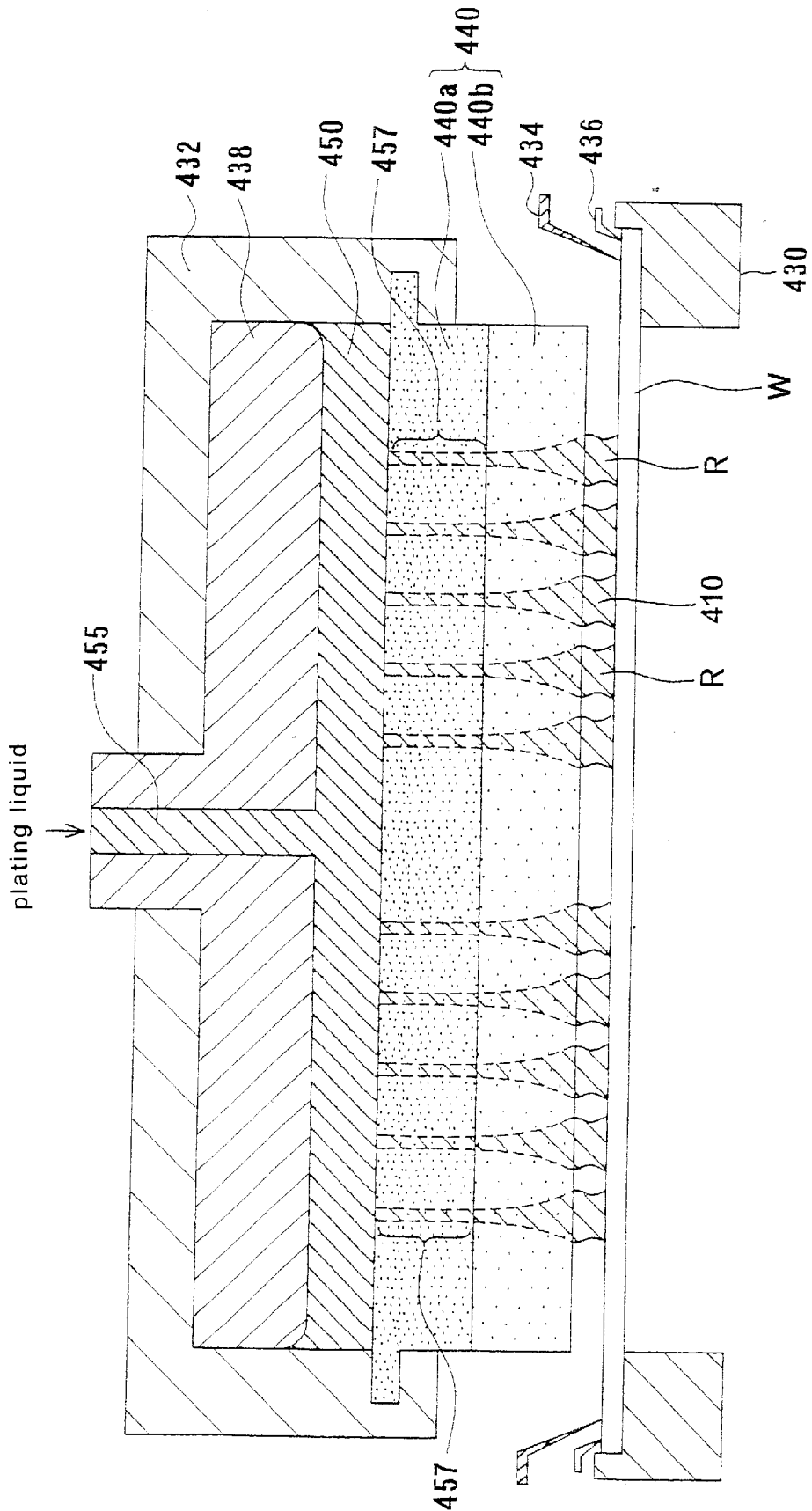
FIG. 66 is a schematic drawing of an electroplating apparatus according to still another embodiment of the present invention.

FIG. 66 is a schematic constitution drawing of an electroplating apparatus according to still another embodiment of the present invention. In this electroplating apparatus, the plating liquid introduction pipe 441 shown in FIG. 64 is not provided, but an anode plate 438 and a porous body 440 (440*a*, 440*b*) are held by a holding member 432. A liquid reservoir 450 is provided between the anode plate 438 and the porous body 440. That is, a plurality of thin plating liquid passing holes 439 as shown in FIG. 64 are not provided, but one thick plating liquid supply portion 455 is provided at the center.

On the other hand, the porous body 440 is composed of two members (upper porous body 440*a* and lower porous body 440*b*) laying the top and bottom. The upper porous body 440*a* is provided with a plurality of thin electrolytic solution passage portions 457 leading to upper and lower surfaces. The electrolytic solution passage portion 457 is formed by constituting portions, which serve as the electrolytic solution passage portions 457, made of a material having a low density (high porosity) porous structure, and constituting all of other portions made of a material having a high density porous structure. The lower porous body 440*b* is constituted entirely of a material having a low density porous structure.

According to this constitution, when the plating liquid is supplied from the plating liquid supply portion 455 of the anode plate 438, the plating liquid 410 is first filled into the liquid reservoir 450. Then, the plating liquid 410 passes mainly through the electrolytic solution passage portions 457 with low resistance, arriving at the surface of the lower porous body 440*b*. Further, the plating liquid 410 reaches the surface of the substrate W while diffusing inside the lower porous body 440*b*. This plating liquid forms a plurality of circular plating liquid columns R between the substrate W and the surface of the lower porous body 440*b*. The plural plating liquid columns R bind to each other on the substrate W, thus filling the surface of the substrate W with the plating liquid while expelling air.

Even when this plating step is repeated, the inner diameter of the front end of the electrolytic solution passage portion 457 does not increase with the passage of time, and hence the ideal plating liquid columns R do not collapse with the passage of time. Consequently, engulfment of air due to disturbance of binding of the plating liquid columns R does not take place. Air bubbles are not accumulated between the lower porous body 440*b* and the substrate W, and the plated film thickness does not become non-uniform.

Figure 67:
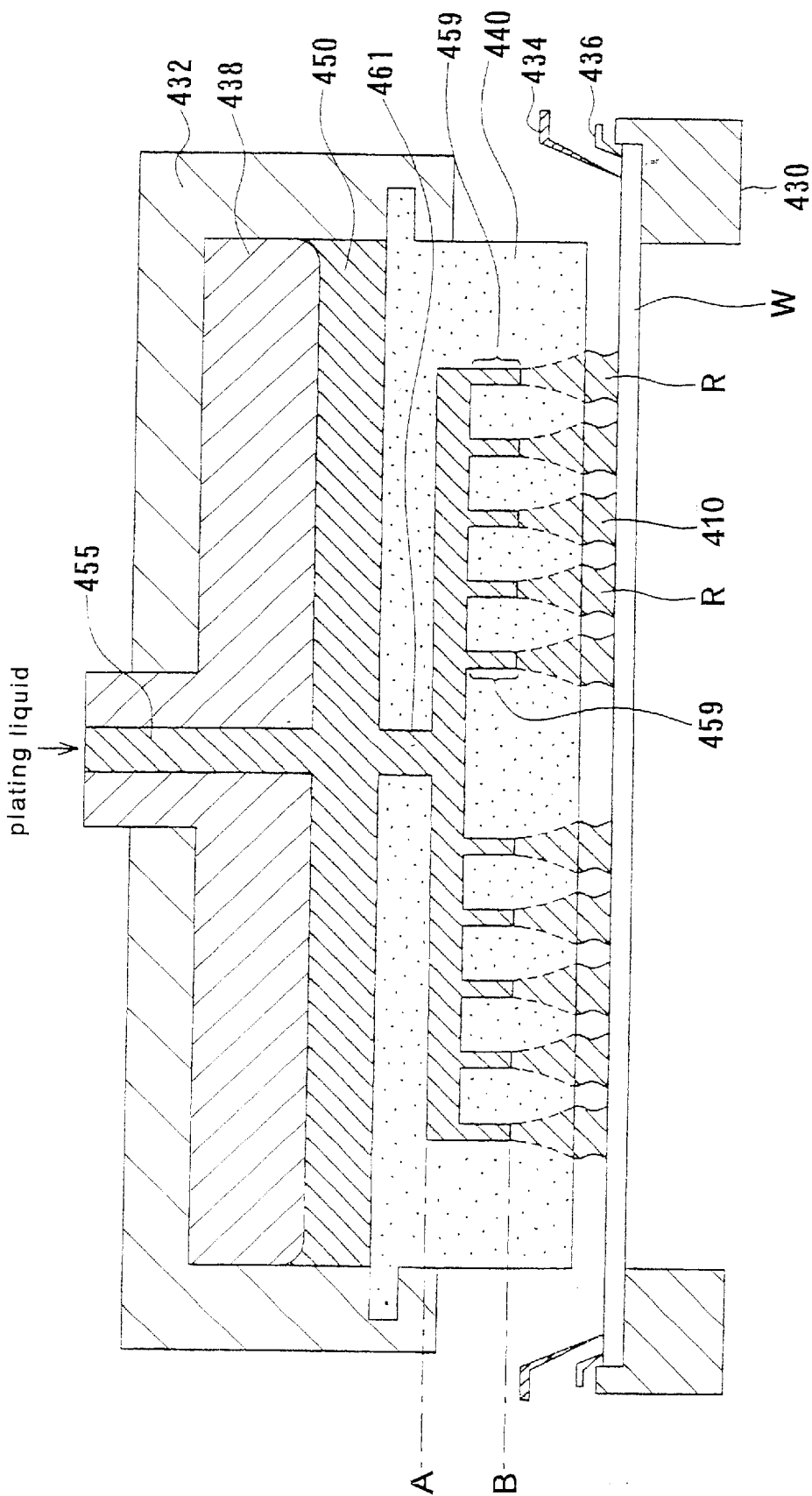
FIG. 67 is a schematic drawing of an electroplating apparatus according to still another embodiment of the present invention.

FIG. 67 is a schematic constitution drawing of an electroplating apparatus according to still another embodiment of the present invention. The difference of this electroplating apparatus from the embodiment shown in FIG. 66 is only in the structure of the porous body 440. That is, in this porous body 440, electrolytic solution passage portions 459 comprising holes are provided in its interior. The electrolytic solution passage portions 459 are formed as branches from a main passage 461 provided in the center of the upper surface of the porous body 440. The front end of each electrolytic solution passage portion 459 ends inside the porous body 440.

When the plating liquid is supplied from the plating liquid supply portion 455 of the anode plate 438, the plating liquid 410 is first filled into the liquid reservoir 450. Then, the plating liquid 410 is introduced into the respective electrolytic solution passage portions 459 from the main passage 461 of the porous body 440. From the lower ends of the electrolytic solution passage portions 459, the plating liquid 410 reaches the surface of the substrate W while diffusing in the porous body 440. This plating liquid forms a plurality of circular plating liquid columns R between the substrate W and the surface of the porous body 440. The plural plating liquid columns R bind to each other on the substrate W, thus filling the surface of the substrate W with the plating liquid.

Even when this plating step is repeated, the inner diameter of the front end of the electrolytic solution passage portion 459 does not increase with the passage of time, and hence the ideal plating liquid columns R do not collapse with the passage of time. Consequently, engulfment of air due to disturbance of binding of the plating liquid columns R does not take place. Air bubbles are not accumulated between the porous body 440 and the substrate W, and the plated film thickness does not become non-uniform.

By adjusting the position of the front end (bottom surface) of the electrolytic solution passage portion 459, the distance from the front end of the electrolytic solution passage portion 459 to the lower surface of the porous body 440 can be shortened. As a result, the resistance can be reduced while the plating liquid passes through the porous body 440. Thus, even when the porous body 440 having a large thickness or a high density (low porosity) is used, the resistance during passage of the plating liquid through the porous body 40 for liquid filling can be made low. Thus, an appropriate amount of the plating liquid can be fed from a predetermined position of the porous body 440. Because of this feature as well, engulfment of air due to disturbance of binding of the plating liquid columns R does not take place. Air bubbles are not accumulated between the porous body 440 and the substrate W, and the plated film thickness does not become non-uniform.

It is difficult to form the electrolytic solution passage portions 459 comprising holes in the porous body 440. Thus, the porous body 440 divided into three parts at lines A and B shown in FIG. 67 may be prepared, and the three parts may be integrated by bonding and fixing to constitute the electrolytic solution passage portions 459.

[Embodiment in Which Pipes are Inserted into Plating Liquid Introduction Holes (Electrolytic Solution Introduction Holes) 439 of Anode Plate 438 and Electrolytic Solution Passage Portions 459 are Provided in Porous Body 440]

Figure 68:
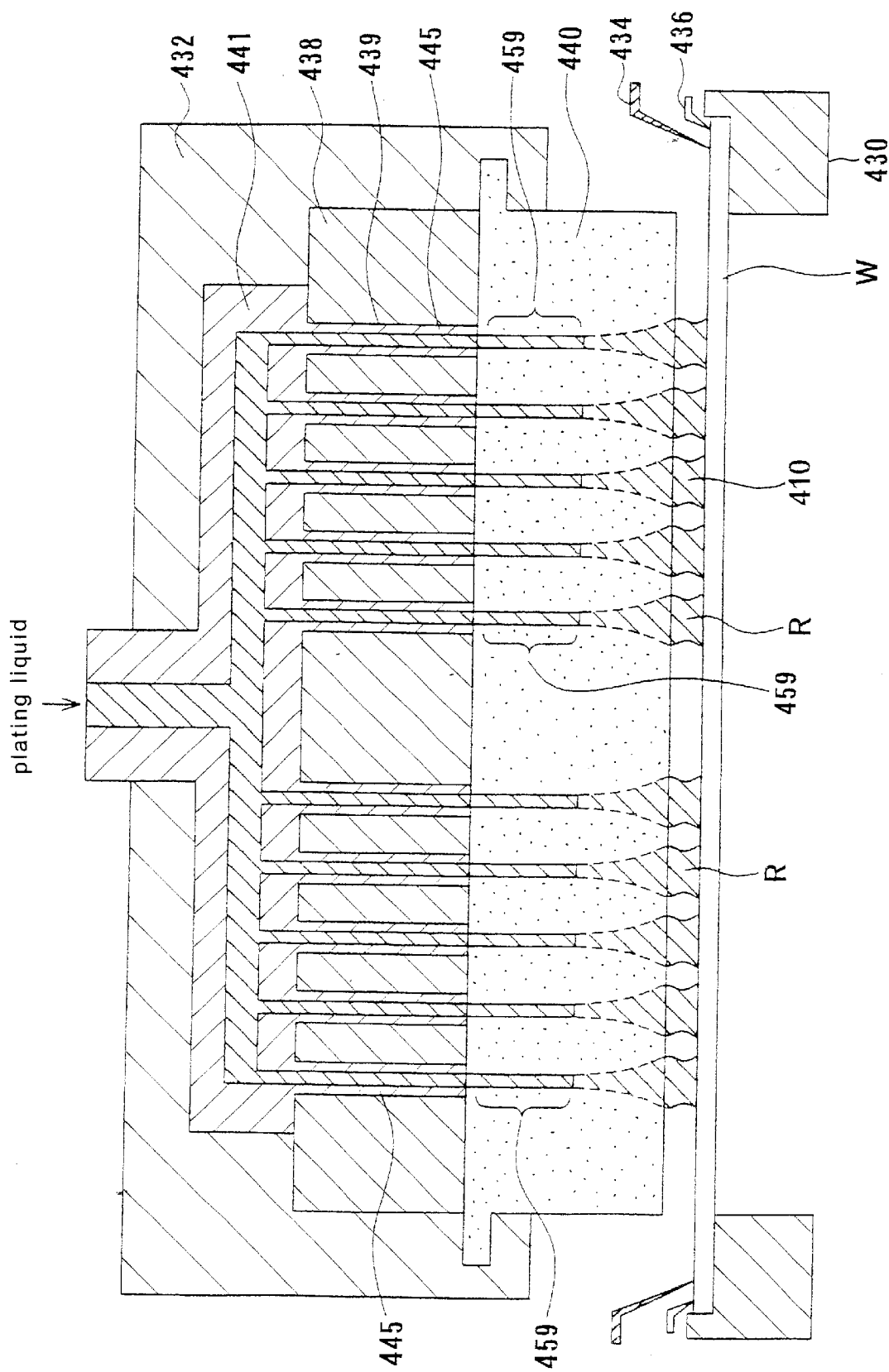
FIG. 68 is a schematic drawing of an electroplating apparatus according to still another embodiment of the present invention.

FIG. 68 is a schematic constitution drawing of an electroplating apparatus according to still another embodiment of the present invention. In this electroplating apparatus, like the embodiment shown in FIG. 64, pipes 445 communicating with a plating liquid introduction pipe 441 of synthetic resin (a material unaffected by the plating liquid) are provided in the plating liquid introduction pipe 441 per se, the pipes 445 are inserted into plating liquid passing holes 439 of anode plate 438, and the front end of each pipe 445 is contacted with the surface of a porous body 440. Moreover, electrolytic solution passage portions 459 comprising narrow holes not being through-holes are provided in a portion of the porous body 440 which is contacted with the pipes 445.

The plating liquid, which has been directly supplied into the electrolytic solution passage portions 459 of the porous body 440 from the plating liquid introduction pipe 441 through the pipes 445, permeates through the porous body 440 from the bottom surface of the electrolytic solution passage portions 459 while slightly diffusing in the porous body 440, and reaches the surface of the substrate W. This plating liquid forms a plurality of circular plating liquid columns R between the substrate W and the surface of the porous body 440. The plural plating liquid columns R bind to each other on the substrate W, thus filling the surface of the substrate W with the plating liquid while forcing air outward.

Even when this plating step is performed repeatedly, neither the inner diameter of the front end of the pipe 445 nor the inner diameter of the bottom surface of the electrolytic solution passage portion 459 does not increase with the passage of time, and hence the ideal plating liquid columns R do not collapse with the passage of time. Consequently, engulfment of air due to disturbance of binding of the plating liquid columns R does not take place. Air bubbles are not accumulated between the porous body 440 and the substrate W, and the plated film thickness does not become non-uniform.

At the same time, the resistance during passage of the plating liquid through the porous body 440 can be decreased in an amount corresponding to the length of the electrolytic solution passage portion 459. Thus, even when the porous body 440 having a large thickness or a high density (low porosity) is used, an appropriate amount of the plating liquid can be fed from a predetermined position of the porous body 440 while the plating liquid is introduced. Because of this feature as well, engulfment of air due to disturbance of binding of the plating liquid columns R does not take place. Air bubbles are not accumulated between the porous body 440 and the substrate W, and the plated film thickness does not become non-uniform.

Figure 69:
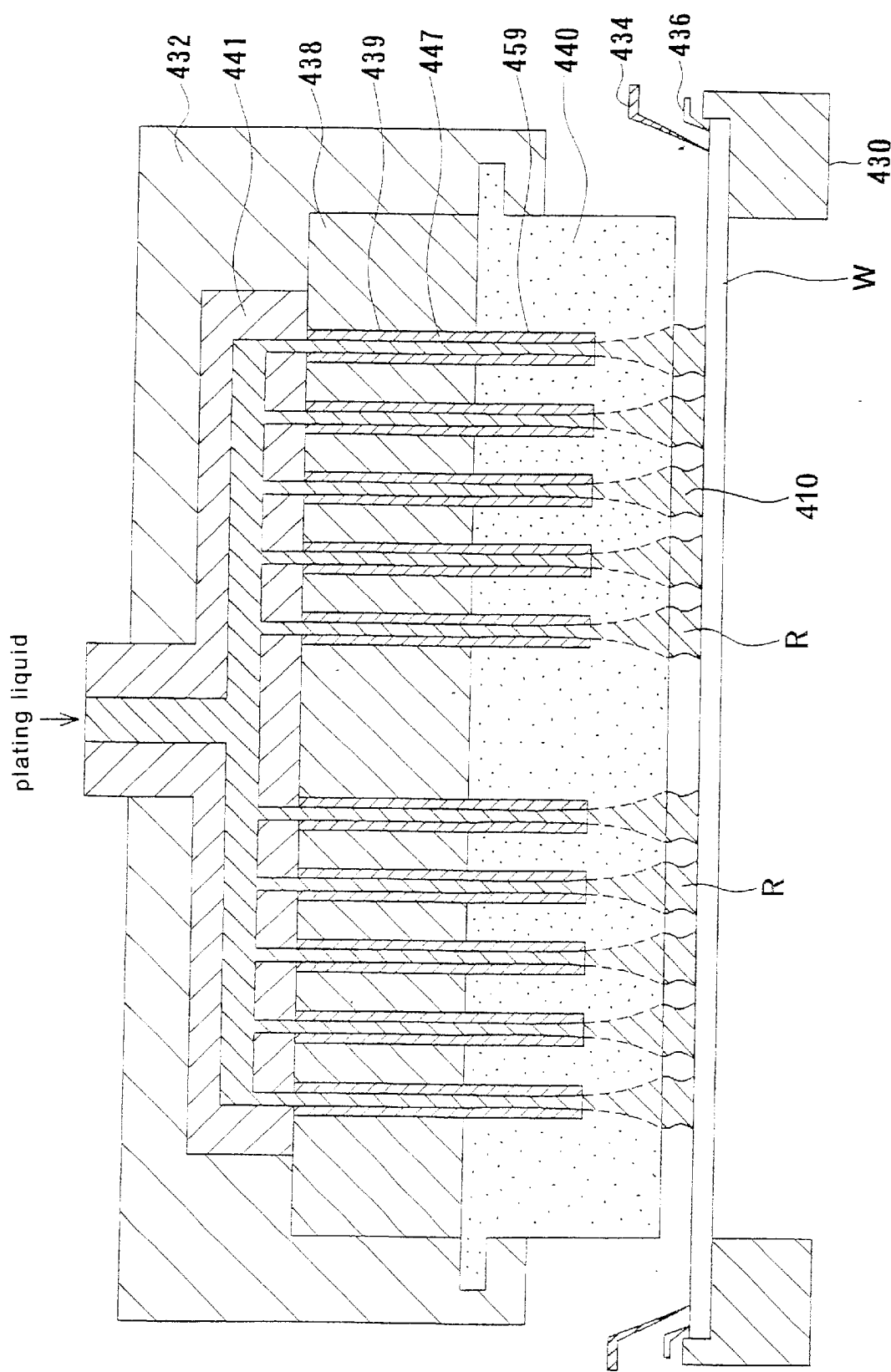
FIG. 69 is a schematic drawing of an electroplating apparatus according to still another embodiment of the present invention.

FIG. 69 is a schematic constitution drawing of an electroplating apparatus according to still another embodiment of the present invention. The difference of this electroplating apparatus from the embodiment shown in FIG. 68 is that instead of forming the pipes 445 and the plating liquid introduction pipe 441 integrally therewith, separately prepared pipes 447 are inserted into the plating liquid passing holes 439 of the anode plate 438 and the electrolytic solution passage portions 459 provided in the porous body 440. In this case as well, the pipes 447 are composed of a material unaffected by the plating liquid.

According to this constitution, like the embodiment shown in FIG. 68, even when the plating step is performed repeatedly, the inner diameter of the front end of the pipe 447 does not increase with the passage of time, and the ideal plating liquid columns R do not collapse with the passage of time. Consequently, engulfment of air due to disturbance of binding of the plating liquid columns R does not take place. Air bubbles are not accumulated between the porous body 440 and the substrate W, and the plated film thickness does not become non-uniform. At the same time, the pipes 447 protrude into the porous body 440. Thus, the resistance during passage of the plating liquid through the porous body 440 can be decreased. Even when the porous body 440 having a large thickness or a high density (low porosity) is used, an appropriate amount of the plating liquid can be fed from a predetermined position of the porous body 440. Hence, engulfment of air due to disturbance of binding of the plating liquid columns R does not take place. Air bubbles are not accumulated between the porous body 440 and the substrate W and the plated film thickness does not become non-uniform.

[Embodiment in Which Passage Resistance During Passage of Plating Liquid Through Porous Body 440 is Made Different According to the Location of Porous Body 440]

Figure 70:
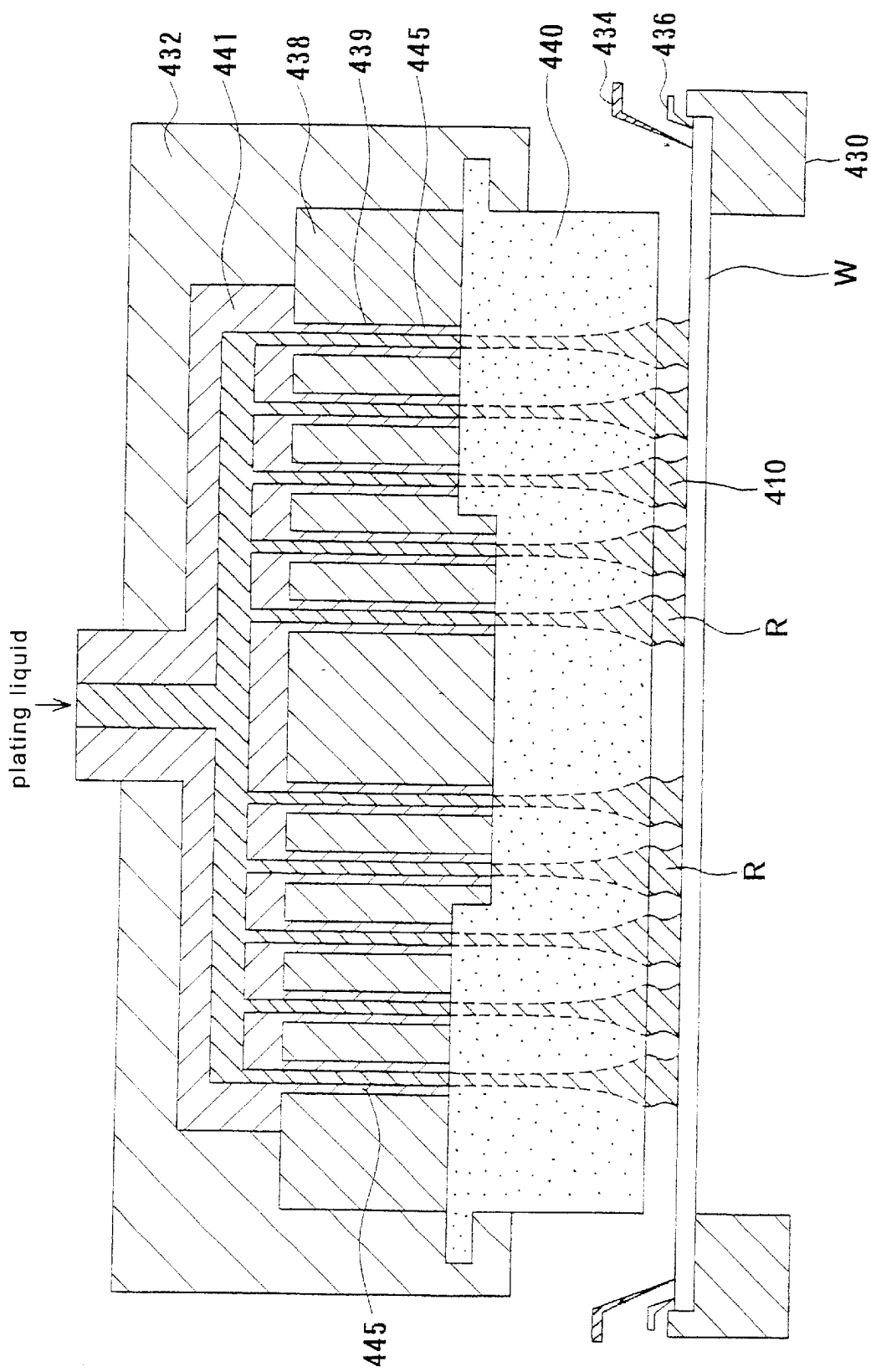
FIG. 70 is a schematic drawing of an electroplating apparatus according to still another embodiment of the present invention.
Figure 71:
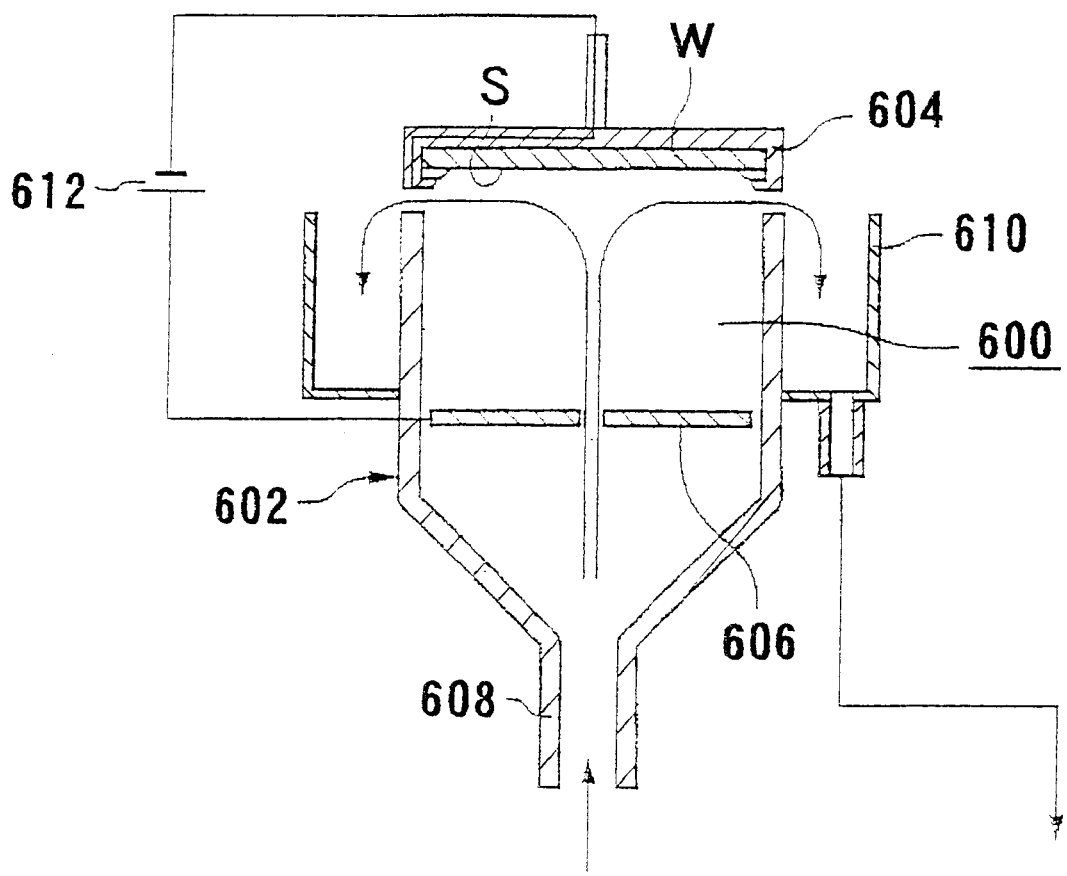
FIG. 71 is a schematic view of a conventional plating apparatus.
Figure 72:
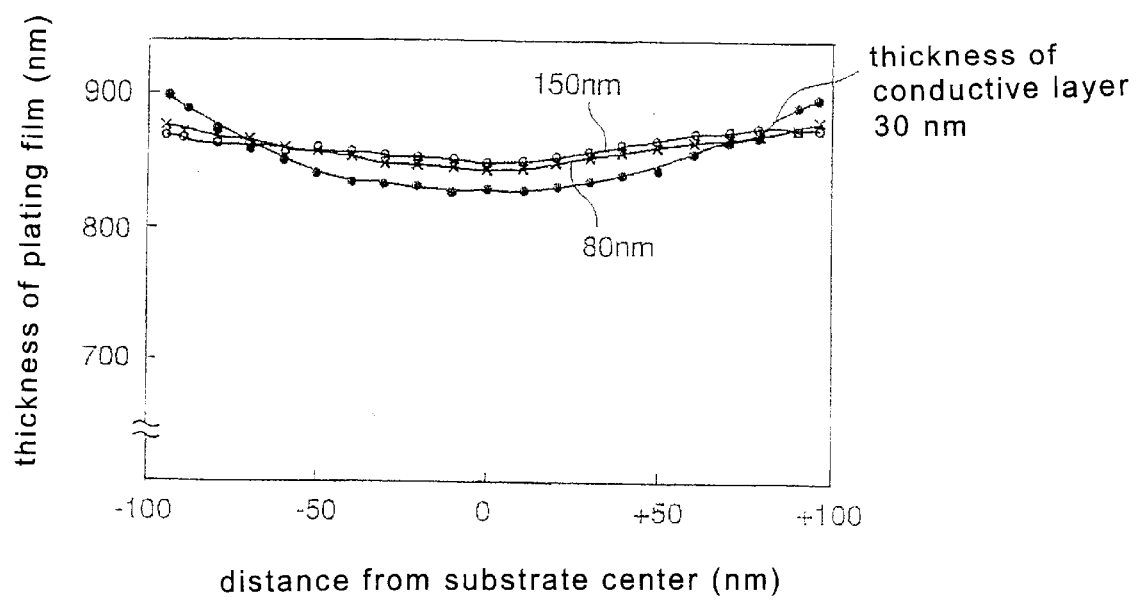
FIG. 72 is a view showing the film thickness distribution of a plated film over a surface of a substrate when copper electroplating was performed on a substrate, which had a conductive layer of each of different film thicknesses, by use of the conventional plating apparatus.
Figure 73:
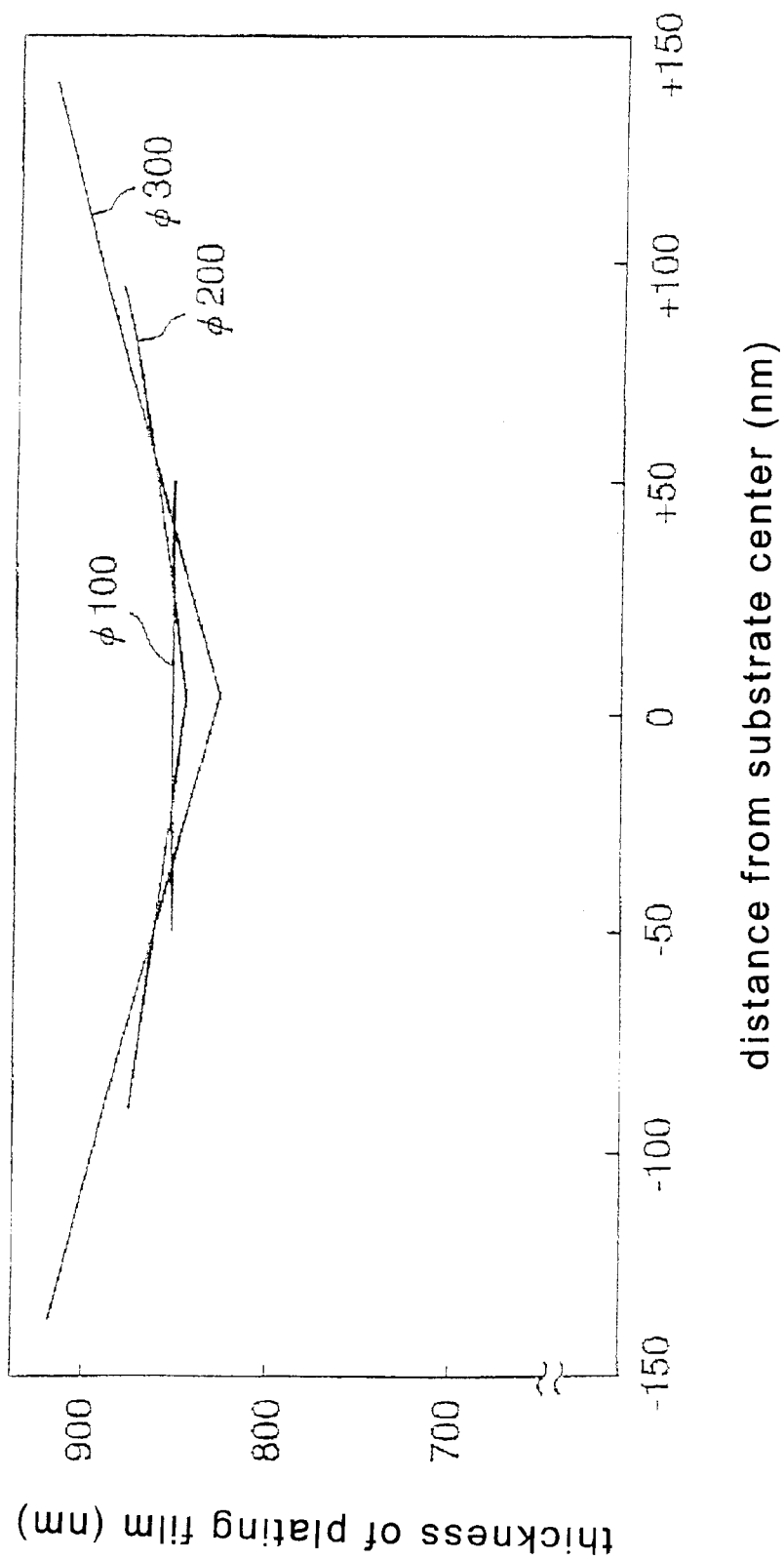
FIG. 73 is a view showing the film thickness distribution of a plated film over a surface of a substrate when copper electroplating was performed on a substrate of each of different sizes by use of the conventional plating apparatus.

FIG. 70 is a schematic constitution drawing of an electroplating apparatus according to still another embodiment of the present invention. In this electroplating apparatus, like the embodiment shown in FIG. 64, a plating liquid introduction pipe 441 of synthetic resin are provided with pipes 445 communicating with a plating liquid introduction pipe 441 per se. However, unlike FIG. 64, anode plate 438 is convex, while a porous body 440 is concave, at the center of the surface of bonding between the anode plate 438 and the porous body 440. By so constituting, the plating liquid supplied from the pipes 445 in the vicinity of the center is fed from the lower surface of the porous body 440 with a decreased passage resistance, so that its amount supplied is larger than that fed at other portions. In other words, in case a desired plating liquid does not exit depending on the location, the passage resistance of the plating liquid through the porous body 440 at that site is decreased so that the desired plating liquid can exit at that site as well (an appropriate amount of the plating liquid may be different according to the location of the porous body 440). By so doing, disturbance of binding of the plating liquid columns R is prevented to prevent engulfment of air, thereby preventing air bubbles from accumulating between the porous body 440 and the substrate W to make the plated film thickness non-uniform.

Such adjustment can be achieved, for example, by making the positions of the bottoms of the electrolytic solution passage portions 459 shown in FIGS. 68 and 69 different in the respective electrolytic solution passage portions 459. That is, the passage resistance of the plating liquid passing through the porous body 440 is made different according to the location. By this measure, the amounts of the plating liquid supplied from the respective portions of the porous body 440 can be varied, and the optimal state of filling with the plating liquid can be selected.

The respective embodiments show examples of application to electroplating apparatuses. Instead, the present invention may be applied to an electrolytic etching apparatus using a substrate as an anode.

A detailed description has been offered above of electrolytic treatment apparatuses of a structure, in which an electrolytic solution is supplied into an electrolytic solution impregnated material and fed from the opposite side of the electrolytic solution impregnated material to fill the electrolytic solution between the electrolytic solution impregnated material and a substrate to be treated. Even such electrolytic treatment apparatuses do not face the situation that air bubbles are engulfed between the electrolytic solution impregnated material and the substrate to be treated, and are accumulated between them. The apparatuses exhibit the excellent effect that ideal liquid filling is performed to achieve desired electrolytic treatment.

What is claimed is:

1. An apparatus for performing electrolytic treatment on a conductive layer surface on a substrate by supplying an electrolytic solution on the conductive layer surface, comprising:
    a substrate holding portion for holding the substrate having the conductive layer;
    a first electrode disposed apart from said substrate holding portion;
    a high resistance structure disposed between said first electrode and said substrate holding portion so as to be positioned between said first electrode and the conductive layer surface of the substrate held by said substrate holding portion; and
    a member positioned so as to shield an area of said high resistance structure so that an electrical field of the conductive layer surface on the substrate to be treated is controlled.

2. The apparatus according to claim 1, wherein said member comprises an insulating member.

3. The apparatus according to claim 1, wherein said member is wound around an outer peripheral surface of said high resistance structure.

4. The apparatus according to claim 1, wherein said electric field of the conductive layer surface is controlled by moving said member vertically to change its relative position with respect to said high resistance structure.

5. An electrolytic treatment apparatus for performing electrolytic treatment of a substrate, to be treated, by filling an electrolytic solution between the substrate, to be treated, having a contact with one of electrodes consisting of an anode and a cathode, and the other electrode facing the substrate to be treated, characterized in that:
    a high resistance structure, having an electrical conductivity lower than that of the electrolytic solution, is provided in at least part of the electrolytic solution;
    an outer periphery of said high resistance structure is held by a holding member; and
    a seal member is provided between said high resistance structure and said holding member for preventing the electrolytic solution from leaking therethrough and preventing an electric current from flowing.

6. An apparatus for performing electrolytic treatment on a conductive layer surface on a substrate by supplying an electrolytic solution on the surface, comprising:
    a substrate holding portion for holding the substrate with the conductive layer facing upward, wherein said substrate holding portion is vertically moveable between an upper position for performing electrolytic treatment and a lower position for loading and unloading the substrate to and from the substrate holding portion;
    a first electrode disposed above said substrate holding portion so as to be positioned above the conductive layer surface of the substrate on said substrate holding portion at said upper position;
    a high resistance structure disposed between said first electrode and said substrate holding portion so as to be positioned between said first electrode and the conductive layer surface of the substrate on said substrate holding portion at said upper position, wherein said high resistance structure has a lower electrical conductivity than that of the electrolytic solution;
    a second electrode for electrically contacting the conductive layer surface;
    an electrolytic solution inlet for supplying the electrolytic solution to fluidly connect said first electrode, said high resistance structure and the conductive layer surface; and
    an annular sealing member, wherein said annular sealing member is operable to contact the conductive layer surface of the substrate at a peripheral portion of the substrate to hold the electrolytic solution on the conductive layer surface.

7. The apparatus according to claim 6, wherein said high resistance structure is structured so as to be operable to reduce differences in current density over the conductive layer surface on the substrate during electrolytic treatment.

8. The apparatus according to claim 6, wherein said first electrode, said high resistance structure and said second electrode are structured and arranged to be operable to electroplate a metal on the conductive layer surface of the substrate.

9. The apparatus according to claim 8, wherein said first electrode, said high resistance structure and said second electrode are structured and arranged to be operable to electroplate a copper or copper alloy on the conductive layer surface of the substrate.

10. The apparatus according to claim 8, wherein said first electrode is a soluble anode.

11. The apparatus according to claim 6, wherein said high resistance structure has an electrical resistance in a range of 0.01 to 2 Ω.

12. The apparatus according to claim 11, wherein said high resistance structure has an electrical resistance in a range of 0.03 to 1 Ω.

13. The apparatus according to claim 6, wherein said high resistance structure is porous.

14. The apparatus according to claim 13, wherein said high resistance structure has a pore diameter in a range of 30 to 200 μm.

15. The apparatus according to claim 13, wherein said high resistance structure has a porosity in a range of 20 to 95%.

16. The apparatus according to claim 6, wherein said resistance structure comprises a porous ceramic.

17. The apparatus according to claim 16, wherein said porous ceramic is selected from the group consisting of alumina, SiC, mullite, zirconia, titania and cordierite.

18. The apparatus according to claim 6, wherein said high resistance structure comprises a plate having a thickness in a range of 5 to 20 mm.

19. The apparatus according to claim 18, wherein said high resistance structure comprises a plate having a thickness in a range of 8 to 15 mm.

20. The apparatus according to claim 6, wherein said high resistance structure is structured so as to be capable of retaining electrolytic solution therein and passing electrolytic solution therethrough.

21. The apparatus according to claim 20, wherein said high resistance structure is connected with an electrolyte solution outlet for discharging electrolyte solution retained in said high resistance structure after performing electrolytic treatment.

22. The apparatus according to claim 21, wherein said electrolyte solution outlet has a decreased pressure so as to discharge the retained electrolyte solution from said high resistance structure.

23. The apparatus according to claim 6, wherein said substrate holding portion has a positioning device for horizontal positioning of the substrate held by said substrate holding portion.

24. The apparatus according to claim 6, further comprising a power source capable of applying a first potential difference with a polarity between said first electrode and said second electrode, and capable of supplying a second potential difference with a reversed polarity.

25. The apparatus according to claim 6, wherein said high resistance structure comprises woven fabric, a nonwoven fabric, or a composite of woven and nonwoven fabric.

26. The apparatus according to claim 6, wherein said high resistance structure is disposed between said first electrode and said upper position so as to be positioned above the conductive layer surface of the substrate with a gap when the substrate is at said upper position on said substrate holding portion.

27. The apparatus according to claim 26, wherein said gap is 0.5 to 3 mm.

28. The apparatus according to claim 6, wherein said first electrode has at least one through hole therein for supplying electrolytic solution to said high resistance structure.

29. The apparatus according to claim 6, wherein said first electrode and said high resistance structure define a liquid reservoir for storing electrolytic solution.

30. The apparatus according to claim 6, wherein said substrate holding portion has a middle position between said upper position and said lower position for cleaning the substrate.

31. The apparatus according to claim 6, further comprising at least one nozzle disposed around said substrate holding portion and arranged so as to be capable of ejecting at least one of a pretreatment liquid, a cleaning liquid and a gas toward the substrate held by said substrate holding portion.

32. The apparatus according to claim 6, wherein said substrate holding portion has a middle position between said upper position and said lower position for cleaning and drying the substrate.

33. The apparatus according to claim 6, wherein said second electrode is arranged to integrally rotate with said substrate holding portion.

34. The apparatus according to claim 33, further comprising a pure water supply nozzle disposed around said second electrode for supplying pure water to clean the substrate and said second electrode together when the substrate and said second electrode integrally rotate together.

35. The apparatus according to claim 6, further comprising a nozzle to recover electrolyte solution on the conductive layer surface of the substrate after electrolytic treatment.

36. The apparatus according to claim 6, wherein said substrate holding portion is rotatable.

37. The apparatus according to claim 6, wherein said first electrode, said high resistance structure and said substrate holding portion are arranged so as to be capable of simultaneously treating the entire surface of the conductive layer of the substrate by supply of the electrolytic solution on the surface of the substrate.

38. The apparatus according to claim 6, wherein said first electrode has a circular shape.

39. The apparatus according to claim 6, wherein said first electrode comprises an electrode plate.

40. An apparatus for performing electrolytic treatment on a conductive layer surface on a substrate by supplying an electrolytic solution on the surface, comprising:
   a substrate holding portion for holding the substrate with the conductive layer facing upward;
   a first electrode disposed above said substrate holding portion so as to be positioned above the conductive layer surface of the substrate on said substrate holding portion;
   a high resistance structure having a lower electrical conductivity than that of the electrolytic solution;
   a second electrode for electrically contacting the conductive layer surface;
   an electrolytic solution inlet for supplying the electrolytic solution to fluidly connect said first electrode, said high resistance structure and the conductive layer surface;
   an electrode head positionable at a first location for supporting said high resistance structure between said first electrode and said substrate holding portion so as to position said high resistance structure between said first electrode and the conductive layer surface of the substrate on said substrate holding portion;
   a tray at a second location for holding electrolytic solution and receiving said electrode head such that a lower surface of said high resistance structure can contact the electrolytic solution in said tray; and
   an electrode arm connected to said electrode head and a rotating shaft to move said electrode head in a horizontal plane between said first location and said second location.

41. The apparatus of claim 40, and further comprising:
   a loading/unloading unit for housing a plurality of substrates; and
   a transfer robot for transferring the substrate between said loading/unloading unit and said substrate holding portion.

42. The apparatus according to claim 40, wherein:
said substrate holding portion is vertically moveable between an upper position for performing electrolytic treatment and a lower position for loading and unloading the substrate to and from said substrate holding portion;
said first electrode is disposed above said substrate holding portion so as to be positioned above the conductive layer surface of the substrate on said substrate holding portion at said upper position; and
said electrode head is positionable at the first location for supporting said high resistance structure between said first electrode and said substrate holding portion so as to position said high resistance structure between said first electrode and the conductive layer surface of the substrate on said substrate holding portion at said upper position.

43. An apparatus for performing electroplating treatment on a conductive layer surface on a substrate by supplying a plating liquid on the surface, comprising:
a substrate holding portion for holding the substrate with the conductive layer facing upward, wherein said substrate holding portion is vertically moveable between an upper position for performing electroplating treatment and a lower position for loading and unloading the substrate to and from said substrate holding portion;
an anode disposed above said substrate holding portion so as to be positioned above the conductive layer surface of the substrate on said substrate holding portion at said upper position;
a material capable of being impregnated with the plating liquid disposed between said anode and said substrate holding portion so as to be positioned between said anode and the conductive layer surface of the substrate on said substrate holding portion at said upper position;
a cathode for electrically contacting the conductive layer surface;
a plating liquid inlet for supplying the plating liquid to fluidly connect said anode, said material and the conductive layer surface; and
an annular sealing member, wherein said annular sealing member is operable to contact the conductive layer surface of the substrate at a peripheral portion of the substrate to hold the plating liquid on the conductive layer surface.

44. An apparatus for performing electrolytic treatment on a conductive layer surface on a substrate by supplying an electrolytic solution on the surface, comprising:
a substrate holding portion for holding the substrate with the conductive layer facing upward;
a first electrode disposed above said substrate holding portion so as to be positioned above the conductive layer surface of the substrate on said substrate holding portion;
a high resistance structure disposed between said first electrode and said substrate holding portion so as to be positioned between said first electrode and the conductive layer surface of the substrate on said substrate holding portion, wherein said high resistance structure has a lower electrical conductivity than that of the electrolytic solution;
a second electrode for electrically contacting the conductive layer surface;
an electrolytic solution inlet for supplying the electrolytic solution to fluidly connect said first electrode, said high resistance structure and the conductive layer surface; and
a member positioned so as to shield an area of said high resistance structure so that an electrical field of the conductive layer surface on the substrate to be treated is controlled.

45. The apparatus according to claim 44, said high resistance structure is structured so as to be operable to reduce differences in current density over the conductive layer surface on the substrate during electrolytic treatment.

46. The apparatus according to claim 44, wherein said first electrode, said high resistance structure and said second electrode are structured and arranged to be operable to electroplate a metal on the conductive layer surface of the substrate.

47. The apparatus according to claim 46, wherein said first electrode, said high resistance structure and said second electrode are structured and arranged to be operable to electroplate a copper or copper alloy on the conductive layer surface of the substrate.

48. The apparatus according to claim 46, wherein said first electrode is a soluble anode.

49. The apparatus according to claim 44, wherein said high resistance structure has an electrical resistance in a range of 0.01 to 2 Ω.

50. The apparatus according to claim 49, said high resistance structure has an electrical resistance in a range of 0.03 to 1 Ω.

51. The apparatus according to claim 44, wherein said high resistance structure is porous.

52. The apparatus according to claim 51, wherein said high resistance structure has a pore diameter in a range of 30 to 200 μm.

53. The apparatus according to claim 51, wherein said high resistance structure has a porosity in a range of 20 to 95%.

54. The apparatus according to claim 44, wherein said high resistance structure comprises a porous ceramic.

55. The apparatus according to claim 54, wherein said porous ceramic is selected from the group consisting of alumina, SiC, mullite, zirconia, titania and cordierite.

56. The apparatus according to claim 44, wherein said high resistance structure comprises a plate having a thickness in a range of 5 to 20 mm.

57. The apparatus according to claim 56, wherein said high resistance structure comprises a plate having a thickness in a range of 8 to 15 mm.

58. The apparatus according to claim 44, wherein said high resistance structure is structured so as to be capable of retaining electrolytic solution therein and passing electrolytic solution therethrough.

59. The apparatus according to claim 58, wherein said high resistance structure is connected with an electrolyte solution outlet for discharging electrolyte solution retained in said high resistance structure after performing electrolytic treatment.

60. The apparatus according to claim 59, wherein said electrolyte solution outlet has a decreased pressure so as to discharge the retained electrolyte solution from said high resistance structure.

61. The apparatus according to claim 44, wherein said substrate holding portion has a positioning device for horizontal positioning of the substrate held by said substrate holding portion.

62. The apparatus according to claim 44, further comprising a power source capable of applying a first potential difference with a polarity between said first electrode and said second electrode, and capable of supplying a second potential difference with a reversed polarity.

63. The apparatus according to claim 44, wherein said high resistance structure comprises woven fabric, a nonwoven fabric, or a composite of woven and nonwoven fabric.

64. The apparatus according to claim 44, wherein said high resistance structure is disposed between said first electrode and said upper position so as to be positioned above the conductive layer surface of the substrate with a gap when the substrate is at said upper position on said substrate holding portion.

65. The apparatus according to claim 64, wherein said gap is 0.5 to 3 mm.

66. The apparatus according to claim 44, wherein said first electrode has at least one through hole therein for supplying electrolytic solution to said high resistance structure.

67. The apparatus according to claim 44, wherein said first electrode and said high resistance structure define a liquid reservoir for storing electrolytic solution.

68. The apparatus according to claim 44, wherein said substrate holding portion has a middle position between said upper position and said lower position for cleaning the substrate.

69. The apparatus according to claim 44, further comprising at least one nozzle disposed around said substrate holding portion and arranged so as to be capable of ejecting at least one of a pretreatment liquid, a cleaning liquid and a gas toward the substrate held by said substrate holding portion.

70. The apparatus according to claim 44, wherein said substrate holding portion has a middle position between said upper position and said lower position for cleaning and drying the substrate.

71. The apparatus according to claim 44, wherein said second electrode is arranged to integrally rotate with said substrate holding portion.

72. The apparatus according to claim 71, further comprising a pure water supply nozzle disposed around said second electrode for supplying pure water to clean the substrate and said second electrode together when the substrate and said second electrode integrally rotate together.

73. The apparatus according to claim 44, further comprising a nozzle to recover electrolyte solution on the conductive layer surface of the substrate after electrolytic treatment.

74. The apparatus according to claim 44, wherein said substrate holding portion is rotatable.

75. The apparatus according to claim 44, wherein said first electrode, said high resistance structure and said substrate holding portion are arranged so as to be capable of simultaneously treating the entire surface of the conductive layer of the substrate by supply of the electrolytic solution on the surface of the substrate.

76. The apparatus according to claim 44, wherein said first electrode has a circular shape.

77. The apparatus according to claim 44, wherein said first electrode comprises an electrode plate.

* * * * *